US012787576B2

(12) United States Patent
Chen et al.

(10) Patent No.: US 12,787,576 B2
(45) Date of Patent: Nov. 3, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Jiaxing Chen, Beijing (CN); Yao Huang, Beijing (CN); Tianyi Cheng, Beijing (CN); Meng Li, Beijing (CN); Binyan Wang, Beijing (CN); Yu Wang, Beijing (CN); Peng Xu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 335 days.

(21) Appl. No.: 18/558,076

(22) PCT Filed: May 31, 2022

(86) PCT No.: PCT/CN2022/096468

§ 371 (c)(1),
(2) Date: Oct. 30, 2023

(87) PCT Pub. No.: WO2023/230915

PCT Pub. Date: Dec. 7, 2023

(65) Prior Publication Data

US 2025/0081767 A1 Mar. 6, 2025

(51) Int. Cl.

| | |
|---|---|
| ***H10K 59/131*** | (2023.01) |
| ***H10K 59/121*** | (2023.01) |
| ***H10K 102/00*** | (2023.01) |

(52) U.S. Cl.
CPC ....... *H10K 59/131* (2023.02); *H10K 59/1213* (2023.02); *H10K 2102/361* (2023.02)

(58) Field of Classification Search
CPC ............................ H10K 50/10; H10K 59/131
See application file for complete search history.

(56) References Cited

U.S. PATENT DOCUMENTS

| | | | |
|---|---|---|---|
| 7,724,218 | B2 | 5/2010 | Kim et al. |
| 9,564,244 | B2 | 2/2017 | Yang et al. |

(Continued)

FOREIGN PATENT DOCUMENTS

| | | | |
|---|---|---|---|
| CN | 104077992 | A | 10/2014 |
| CN | 104217681 | A | 12/2014 |

(Continued)

OTHER PUBLICATIONS

Luo, H., et al. (2020), 24-3: Complementary LTPO Technology, Pixel Circuits and Integrated Gate Drivers for AMOLED Displays Supporting Variable Refresh Rates. SID Symposium Digest of Technical Papers, 51: 351-354. (Year: 2020).*

(Continued)

*Primary Examiner* — Jeff W Natalini
*Assistant Examiner* — Katrina Waljeski-Moses
(74) *Attorney, Agent, or Firm* — Frank Gao, Esq.

(57) ABSTRACT

A display substrate and a display device are provided, which includes: a pixel circuit, on a base substrate and including a driving transistor and a storage capacitor; the display substrate includes a first conductive layer, a second conductive layer and a first semiconductor layer, the first conductive layer includes a first connection structure, the first connection structure includes a first end and a second end, the first end is connected with the first semiconductor layer, the second end is electrically connected with a gate electrode of the driving transistor and a first electrode plate of the storage (Continued)

capacitor; the first conductive layer is at a side of the first semiconductor layer away from the base substrate, the second conductive layer is at a side of the first conductive layer away from the base substrate.

19 Claims, 20 Drawing Sheets

(56) References Cited

U.S. PATENT DOCUMENTS

| | | | |
|---|---|---|---|
| 9,589,508 B2 | 3/2017 | Yang et al. | |
| 10,050,097 B2 | 8/2018 | Oh et al. | |
| 11,315,957 B2 | 4/2022 | Lee et al. | |
| 11,373,599 B1 * | 6/2022 | Chen | H10K 59/131 |
| 11,637,268 B2 | 4/2023 | Jung et al. | |
| 11,653,530 B2 | 5/2023 | Mou et al. | |
| 11,751,460 B2 | 9/2023 | Chen et al. | |
| 11,930,676 B2 | 3/2024 | Liu et al. | |
| 12,048,216 B2 | 7/2024 | Li et al. | |
| 2011/0216056 A1 | 9/2011 | Yoo et al. | |
| 2016/0210896 A1 | 7/2016 | Gil | |
| 2019/0131370 A1 * | 5/2019 | Heo | G09G 3/3225 |
| 2020/0193909 A1 | 6/2020 | Choi et al. | |
| 2020/0194730 A1 | 6/2020 | Park et al. | |
| 2020/0286972 A1 * | 9/2020 | Seo | G09G 3/3266 |
| 2021/0151540 A1 * | 5/2021 | Wang | H10K 59/1213 |
| 2021/0183983 A1 | 6/2021 | Bang et al. | |
| 2021/0294382 A1 * | 9/2021 | Ma | G06F 1/189 |
| 2021/0376046 A1 | 12/2021 | Dong | |
| 2022/0052140 A1 * | 2/2022 | Choi | H10K 59/1213 |
| 2023/0337499 A1 | 10/2023 | Fang et al. | |

FOREIGN PATENT DOCUMENTS

| | | |
|---|---|---|
| CN | 106611775 A | 5/2017 |
| CN | 110796961 A | 2/2020 |
| CN | 111128874 A | 5/2020 |
| CN | 111463255 A | 7/2020 |
| CN | 111951729 A | 11/2020 |
| CN | 112562586 A | 3/2021 |
| CN | 112687193 A | 4/2021 |
| CN | 112987420 A | 6/2021 |
| CN | 112992981 A | 6/2021 |
| CN | 113130592 A | 7/2021 |
| CN | 113327947 A | 8/2021 |
| CN | 113471268 A | 10/2021 |
| CN | 113571013 A | 10/2021 |
| CN | 113644106 A | 11/2021 |
| CN | 113707704 A | 11/2021 |
| CN | 114078932 A | 2/2022 |
| CN | 114093898 A | 2/2022 |
| CN | 114122101 A | 3/2022 |
| CN | 114495835 A | 5/2022 |
| JP | 2007323040 A | 12/2007 |
| KR | 1020180099976 A | 9/2018 |
| WO | 2021/083298 A1 | 5/2021 |
| WO | 2021203422 A1 | 10/2021 |
| WO | 2021/226807 A1 | 11/2021 |
| WO | 2022/082596 A1 | 4/2022 |

OTHER PUBLICATIONS

Extended European Search Report dated Dec. 13, 2024; Appln. No. 22944255.3.

The First Chinese Office Action dated May 9, 2023; Appln. No. 202211652336.7.

USPTO NFOA mailed Mar. 30, 2026 in connection with U.S. Appl. No. 18/558,091.

Korean office action dated Feb. 4, 2026; Appln. No. 10-2024-7023116.

First Japanese Office Action dated Jun. 16, 2026; Appln. No. 2024-532524.

* cited by examiner

DISPLAY SUBSTRATE AND DISPLAY DEVICE

TECHNICAL FIELD

At least one embodiment of the present disclosure provides a display substrate and a display device.

BACKGROUND

Organic Light Emitting Diode (OLED) and Quantum-dot Light Emitting Diodes (QLED) are active light emitting display devices, which have the advantages of self-luminescence, wide viewing angle, high contrast, low power consumption, extremely high response speed, lightness, flexibility and low cost, so they have a high development prospect. With the continuous development of display technology, the flexible display with OLED or QLED as light emitting device and signal controlled by thin film transistors (TFT) has become the mainstream product in the display field. With the continuous development of display technology, optimizing the display effect has become an inevitable trend.

SUMMARY

At least one embodiment of the present disclosure provides a display substrate and a display device, in the display substrate, an anode transfer line located in the second conductive layer (SD2) can be used to shield the N1 node. Because the second conductive layer (SD2) is applied with a stable signal and a capacitor is formed between the second conductive layer (SD2) and the first conductive layer (SD1), the influence of nearby data signals on the N1 node can be reduced, that is, the influence of data signals on the N1 node can be shielded, and the abnormal display problem of the display panel caused by data signal jump affecting the voltage of the N1 node can be alleviated.

At least one embodiment of the present disclosure provides a display substrate, and the display substrate comprises a base substrate; and a pixel circuit, arranged on the base substrate and comprising a driving transistor and a storage capacitor; the display substrate further comprises a first conductive layer, a second conductive layer and a first semiconductor layer, the first conductive layer comprises a first connection structure, the first connection structure comprises a first end and a second end which are opposite to each other, the first end is connected with the first semiconductor layer, and the second end is electrically connected with a gate electrode of the driving transistor and a first electrode plate of the storage capacitor; the first conductive layer is at a side of the first semiconductor layer away from the base substrate, and the second conductive layer is at a side of the first conductive layer away from the base substrate, and an orthographic projection of the second conductive layer on the base substrate overlaps with an orthographic projection of at least part of the first connection structure on the base substrate.

For example, the display substrate provided by at least one embodiment of the present disclosure, further comprising a plurality of sub-pixels, each of the plurality of sub-pixels comprises the pixel circuit and a light emitting element, the first conductive layer is located between a first electrode of the light emitting element and the first semiconductor layer, and the second conductive layer is located between the first conductive layer and the first electrode of the light emitting element.

For example, in the display substrate provided by at least one embodiment of the present disclosure, the second conductive layer comprises a data line, a first electrode transfer line and a first power signal line which are spaced apart from each other, the first electrode transfer line is connected with the first electrode of the light emitting element, and an orthographic projection of the first electrode transfer line on the base substrate overlaps with an orthographic projection of a part of the first connection structure on the base substrate.

For example, in the display substrate provided by at least one embodiment of the present disclosure, the first connection structure comprises an overlapping part overlapping with the first electrode transfer line and a non-overlapping part not overlapping with the first electrode transfer line, and the non-overlapping part is further away from the data line which is closest to the first connection structure than the overlapping part.

For example, in the display substrate provided by at least one embodiment of the present disclosure, an extending direction of the data line is a first direction, and a direction perpendicular or substantially perpendicular to the extending direction of the data line is a second direction; the first conductive layer further comprises a power signal connection line, the power signal connection line comprises a main part and a branch part, an extending direction of an entirety of the main part of the power signal connection line is parallel to the second direction, and an extending direction of the branch part is parallel to the first direction; the first power signal line comprises a block-shaped part and a strip-shaped part extending along the first direction as a whole, the strip-shaped part connects adjacent block-shaped parts, and the main part of the power signal connection line is connected with the first power signal line to form a grid shape.

For example, in the display substrate provided by at least one embodiment of the present disclosure, the strip-shaped part comprises a first strip-shaped part and a second strip-shaped part which are oppositely arranged, and a third strip-shaped part connecting the first strip-shaped part and the second strip-shaped part, an extending direction of the first strip-shaped part and an extending direction of the second strip-shaped part are parallel to the first direction, and the third strip-shaped part connects middle regions of the first strip-shaped part and the second strip-shaped part.

For example, in the display substrate provided by at least one embodiment of the present disclosure, the strip-shaped part comprises a hollow structure.

For example, in the display substrate provided by at least one embodiment of the present disclosure, a width of the block-shaped part in the second direction is greater than a width of an entirety of the strip-shaped part in the second direction.

For example, in the display substrate provided by at least one embodiment of the present disclosure, the first electrode transfer line extends along the first direction, and the first electrode transfer line shields a part of the first connection structure at a position of an end position of the first electrode transfer line close to the first connection structure.

For example, in the display substrate provided by at least one embodiment of the present disclosure, the pixel circuit further comprises a first transistor, a second transistor, a sixth transistor and a seventh transistor; a first electrode of the first transistor is connected with a gate electrode of the driving transistor, a second electrode of the first transistor is connected with a first initial signal line, a first electrode of the second transistor is connected with a gate electrode of the driving transistor, a second electrode of the second transistor is connected with a second electrode of the driving transistor, a first electrode of the sixth transistor is connected with the second electrode of the driving transistor, and a first electrode of the seventh transistor is connected with a second electrode of the sixth transistor; the display substrate further comprises: a first active layer, between the base substrate and the second conductive layer, the first active layer comprises a third active part, a sixth active part, a seventh active part, a tenth active part and an eleventh active part, the third active part forms a channel region of the driving transistor, the sixth active part forms a channel region of the sixth transistor, the seventh active part forms a channel region of the seventh transistor, and the tenth active part is connected between the seventh active part and the sixth active part, and the eleventh active part is connected between the sixth active part and the third active part; and a second active layer, between the first active layer and the second conductive layer, the second active layer comprises a first active part, a second active part and a twelfth active part, the first active part forms a channel region of the first transistor, the second active part is connected with the first active part to form a channel region of the second transistor, and the twelfth active part is connected with an end of the second active part away from the first active part.

For example, in the display substrate provided by at least one embodiment of the present disclosure, the display substrate comprises a plurality of repeating units distributed along the first direction and the second direction, each of the repeating units comprises two pixel circuits, and the two pixel circuits comprise a first pixel circuit and a second pixel circuit distributed along the second direction, and the first pixel circuit and the second pixel circuit are arranged in mirror symmetry; each of the two pixel circuit further comprises a fourth transistor and a fifth transistor, a first electrode of the fourth transistor is connected with the data line, a second electrode of the fourth transistor is connected with a first electrode of the driving transistor, a first electrode of the fifth transistor is connected with the first power signal line, and a second electrode of the fifth transistor is connected with the first electrode of the driving transistor; the first active layer further comprises: a fourth active part, connected with a side of the third active part and forming a channel region of the fourth transistor; a fifth active part, forming a channel region of the fifth transistor; an eighth active part, connected with a side of the fifth active part away from the third active part; and a ninth active part, connected between two eighth active parts in the same repeating unit.

For example, in the display substrate provided by at least one embodiment of the present disclosure, the first conductive layer comprises a plurality of third connection structures, the third connection structures are arranged in one-to-one correspondence with the repeating units, and each of the third connection structures is connected with the ninth active part through a first via hole connection part.

For example, the display substrate provided by at least one embodiment of the present disclosure, further comprising a third conductive layer, the third conductive layer comprises: a second gate line, an orthographic projection of the second gate line on the base substrate extends along the second direction and overlaps with an orthographic projection of the fourth active part on the base substrate, and a partial structure of the second gate line is used to form a gate electrode of the fourth transistor; a light emission control signal line, an orthographic projection of the light emission control signal line on the base substrate extends along the second direction and overlaps with an orthographic projection of the sixth active part on the base substrate, and a partial structure of the light emission control signal line is used to form a gate electrode of the sixth transistor; a second reset signal line, an orthographic projection of the second reset signal line on the base substrate extends along the second direction and overlaps with an orthographic projection of the seventh active part on the base substrate, a partial structure of the second reset signal line is used to form a gate electrode of the seventh transistor, and the second gate line in the pixel circuit of a preset row is reused as the second reset signal line in the pixel circuit of an adjacent row; and a second conductive part, an orthographic projection of the second conductive part on the base substrate overlaps with an orthographic projection of the third active part on the base substrate, and the second conductive part forms a gate electrode of the driving transistor and the first electrode plate of the storage capacitor; in the same pixel circuit, the orthographic projection of the second conductive part on the base substrate is located between the orthographic projection of the second gate line on the base substrate and the orthographic projection of the light emission control signal line on the base substrate; the orthographic projection of the second reset signal line on the base substrate is located at a side of the orthographic projection of the light emission control line away from the orthographic projection of the second conductive part on the base substrate.

For example, the display substrate provided by at least one embodiment of the present disclosure, further comprising a fourth conductive layer, the fourth conductive layer is located between the second active layer and the second conductive layer, and the fourth conductive layer comprises: a first reset signal line, an orthographic projection of the first reset signal line on the base substrate overlaps with an orthographic projection of the first active part on the base substrate, and a partial structure of the first reset signal line forms a top gate electrode of the first transistor; a first gate line, an orthographic projection of the first gate line on the base substrate overlaps with an orthographic projection of the second active part on the base substrate, and a partial structure of the first gate line forms a top gate electrode of the second transistor; in the same pixel circuit, the orthographic projection of the first gate line on the base substrate is located between the orthographic projection of the second conductive part on the base substrate and the orthographic projection of the second gate line on the base substrate, and the orthographic projection of the first reset signal line on the base substrate is at a side of the orthographic projection of the second gate line away from the orthographic projection of the second conductive part on the base substrate.

For example, the display substrate provided by at least one embodiment of the present disclosure, further comprising a conductive film layer between the third conductive layer and the fourth conductive layer, the conductive film layer comprises: the first initial signal line, an orthographic projection of the first initial signal line on the base substrate is at a side of the orthographic projection of the first reset signal line on the base substrate away from the orthographic projection of the second conductive part on the base substrate; a third reset signal line, connected with the first reset signal line through a via hole, an orthographic projection of the third reset signal line on the base substrate overlaps with the orthographic projection of the first active part on the base substrate, and a partial structure of the third reset signal line is used to form a bottom gate electrode of the first transistor; a third gate line, an orthographic projection of the third gate line on the base substrate overlaps with the orthographic projection of the second active part on the base substrate, and a partial structure of the third gate line is used to form a bottom gate electrode of the second transistor; and the first conductive part, comprising a main part, the storage capacitor comprises a second electrode plate opposite to the first electrode plate, and the main part corresponds to two second electrode plates.

For example, in the display substrate provided by at least one embodiment of the present disclosure, the first conductive part further comprises a bridge part connecting the two second electrode plates, and the first conductive part comprises a gap between the two second electrode plates.

For example, in the display substrate provided by at least one embodiment of the present disclosure, the second conductive layer comprises a data line and a first power signal line, and an orthographic projection of the first power signal line on the base substrate covers more than 50% of an orthographic projection of the first connection structure on the base substrate.

For example, in the display substrate provided by at least one embodiment of the present disclosure, the pixel circuit further comprises a first transistor, a second transistor, a fourth transistor, a fifth transistor, a sixth transistor, a seventh transistor and an eighth transistor; a gate electrode of the first transistor is connected with a reset control signal line, a first electrode of the first transistor is connected with a first initial signal line, and a second electrode of the first transistor is connected with a first electrode of the eighth transistor and a first electrode of the second transistor; a gate electrode of the second transistor is connected with a first scanning signal line, and a second electrode of the second transistor is connected with a second electrode of the driving transistor and a first electrode of the sixth transistor; a gate electrode of the driving transistor is connected with a second electrode of the eighth transistor and a first electrode plate of the storage capacitor, a first electrode of the driving transistor is connected with a second electrode of the fourth transistor and a second electrode of the fifth transistor, and the second electrode of the driving transistor is connected with the second electrode of the second transistor and the first electrode of the sixth transistor; a gate electrode of the fourth transistor is connected with the first scanning signal line, a first electrode of the fourth transistor is connected with the data line, and a second electrode of the fourth transistor is connected with the first electrode of the driving transistor and the second electrode of the fifth transistor; a gate electrode of the fifth transistor is connected with a first light emission control signal line, a first electrode of the fifth transistor is connected with a first power signal line and a second electrode plate of the storage capacitor, and a second electrode of the fifth transistor is connected with the second electrode of the fourth transistor and the first electrode of the driving transistor; a gate electrode of the sixth transistor is connected with the first light emission control signal line, a first electrode of the sixth transistor is connected with the second electrode of the driving transistor and the second electrode of the second transistor, and a second electrode of the sixth transistor is connected with the first electrode of the light emitting element and a second electrode of the seventh transistor; a gate electrode of the seventh transistor is connected with the first scanning signal line or the reset control signal line, a first electrode of the seventh transistor is connected with a second initial signal line, and the second electrode of the seventh transistor and the second electrode of the sixth transistor are connected with the first electrode of the light emitting element; a gate electrode of the eighth transistor is connected with a second scanning signal line, a first electrode of the eighth transistor is connected with the second electrode of the first transistor and the first electrode of the second transistor, and a second electrode of the eighth transistor is connected with the gate electrode of the driving transistor and the first electrode plate of the storage capacitor; the first electrode plate of the storage capacitor is connected with the gate electrode of the driving transistor and the second electrode of the eighth transistor, and the second electrode plate of the storage capacitor is connected with the first power signal line.

For example, the display substrate provided by at least one embodiment of the present disclosure, further comprising: a first active layer, between the base substrate and the second conductive layer, the first active layer comprises a first active part, a second active part, a third active part, a fourth active part, a fifth active part, a sixth active part and a seventh active part, the first active part forms a channel region of the first transistor, the second active part forms a channel region of the second transistor and the third active part forms a channel region of the driving transistor, the fourth active part forms a channel region of the fourth transistor, the fifth active part forms a channel region of the fifth transistor, the sixth active part forms a channel region of the sixth transistor, and the seventh active part forms a channel region of the seventh transistor; a second active layer, between the first active layer and the second conductive layer, the second active layer comprises an eighth active part, the eighth active part forms a channel region of the eighth transistor.

For example, the display substrate provided by at least one embodiment of the present disclosure, further comprising a third conductive layer, the third conductive layer comprises: the first scanning signal line, an orthographic projection of the first scanning signal line on the base substrate extends along the second direction, and a partial structure of the first scanning signal line is used to form gate electrodes of the second transistor and the fourth transistor; the reset control signal line, an orthographic projection of the reset control signal line on the base substrate extends along the first direction, and a partial structure of the reset control signal line is used to form gate electrodes of the seventh transistor and the first transistor; the first light emission control signal line, an orthographic projection of the first light emission control signal line on the base substrate extends along the first direction, and a partial structure of the first light emission control signal line is used to form gate electrodes of the sixth transistor and the fifth transistor; and a third conductive part, forming the gate electrode of the driving transistor and the first electrode plate of the storage capacitor; in the same pixel circuit, an orthographic projection of the third conductive part on the base substrate is located between the orthographic projection of the first scanning signal line on the base substrate and the orthographic projection of the first light emission control signal line on the base substrate; the orthographic projection of the reset control signal line on the base substrate is at a side of the orthographic projection of the first light emission control signal line on the base substrate away from the orthographic projection of the third conductive part on the base substrate.

For example, the display substrate provided by at least one embodiment of the present disclosure, further comprising a conductive film layer between the third conductive layer and the second conductive layer, the conductive film layer comprises: the second scanning signal line, a partial structure of the second scanning signal line is used to form a bottom gate electrode of the eighth transistor; a first conductive part, comprising two second electrode plates of two storage capacitors adjacent in the second direction; and a fifth conductive part, electrically connected with the first conductive layer.

For example, in the display substrate provided by at least one embodiment of the present disclosure, the first conductive part further comprises a bridge part connecting the two second electrode plates, and the first conductive part comprises a notch between the two second electrode plates.

For example, the display substrate provided by at least one embodiment of the present disclosure, further comprising a fourth conductive layer, the fourth conductive layer is located between the conductive film layer and the second conductive layer, and the fourth conductive layer comprises the first initial signal line and a fourth scanning signal line, and a partial structure of the fourth scanning signal line forms a top gate electrode of the eighth transistor.

For example, in the display substrate provided by at least one embodiment of the present disclosure, an extending direction of the data line is a first direction, and a direction perpendicular or substantially perpendicular to the extending direction of the data line is a second direction, and the first connection structure has an inverted “L” shape, and an end of a part of the inverted “L” shape extending along the second direction, which is away from a closest data line, is connected with the second electrode of the eighth transistor.

For example, in the display substrate provided by at least one embodiment of the present disclosure, the part of the inverted “L” shape extending along the second direction is electrically connected with the fifth conductive part of the conductive film layer; the first scanning signal line comprises a protruding part extending along the first direction and a part extending along the second direction, and the fifth conductive part overlaps with the protruding part of the first scanning signal line extending along the first direction.

For example, in the display substrate provided by at least one embodiment of the present disclosure, the plurality of sub-pixels comprise a plurality of first sub-pixels, a plurality of second sub-pixels and a plurality of third sub-pixels; two second sub-pixels form a second sub-pixel pair, the two second sub-pixels in one second sub-pixel pair are a first pixel block and a second pixel block respectively, and the first pixel block and the second pixel block are alternately arranged along the first direction or the second direction; the plurality of sub-pixels comprise a plurality of minimum repeating units, and one minimum repeating unit comprises one first sub-pixel, one first pixel block, one second pixel block and one third sub-pixel.

For example, the display substrate provided by at least one embodiment of the present disclosure, further comprising a first electrode layer, the first electrode layer is at a side of the second conductive layer away from the base substrate, and the first electrode layer comprises a plurality of electrode parts, and each of the plurality of electrode parts comprises a main part and a supplement part which are connected with each other, and an orthographic projection of the supplement part on the base substrate at least partially overlaps with the orthographic projection of the first electrode transfer line on the base substrate, and each of the plurality of electrode parts corresponds one of the first sub-pixel, the first pixel block, the second pixel block and the third sub-pixel.

For example, in the display substrate provided by at least one embodiment of the present disclosure, the plurality of the electrode parts comprise a first electrode part, a second electrode part and a third electrode part with three different colors, the first electrode part corresponds to the first sub-pixel, the second electrode part corresponds to any one of the first pixel block and the second pixel block, and the third electrode part corresponds to the third sub-pixel; an overlapping area of an orthographic projection of the first electrode part on the base substrate and an orthographic projection of the first power signal line on the base substrate is larger than an overlapping area of an orthographic projection of the second electrode part on the base substrate and the orthographic projection of the first power signal line on the base substrate, and larger than an overlapping area of an orthographic projection of the third electrode part on the base substrate and the orthographic projection of the first power signal line on the base substrate; the overlapping area of the orthographic projection of the third electrode part on the base substrate and the orthographic projection of the first power signal line on the base substrate is larger than the overlapping area of the orthographic projection of the second electrode part on the base substrate and the orthographic projection of the first power signal line on the base substrate.

For example, in the display substrate provided by at least one embodiment of the present disclosure, the first electrode part corresponds to a blue sub-pixel emitting blue light, the second electrode part corresponds to a green sub-pixel emitting green light, and the third electrode part corresponds to a red sub-pixel emitting red light.

For example, in the display substrate provided by at least one embodiment of the present disclosure, the second conductive layer further comprises a plurality of first electrode transfer lines, and the plurality of first electrode transfer lines are arranged in one-to-one correspondence with the plurality of electrode parts, and each of the electrode parts is connected with a corresponding first electrode transfer line through a via hole.

For example, in the display substrate provided by at least one embodiment of the present disclosure, the sub-pixel further comprises a light shielding layer, the light shielding layer is at a side of an active semiconductor pattern of the driving transistor close to the base substrate, an orthographic projection of the light shielding layer on the base substrate at least partially overlaps with an orthographic projection of the active semiconductor pattern of the driving transistor on the base substrate.

For example, at least one embodiment of the present disclosure further provides a display device, and the display device comprises any one of the display substrates mentioned above.

BRIEF DESCRIPTION OF DRAWINGS

In order to more clearly explain the technical solutions of the embodiments of the present disclosure, the following will briefly introduce the drawings of the embodiments. Obviously, the drawings in the following description only relate to some embodiments of the present disclosure, but not limit the present disclosure.

DETAILED DESCRIPTION

Figure 1:
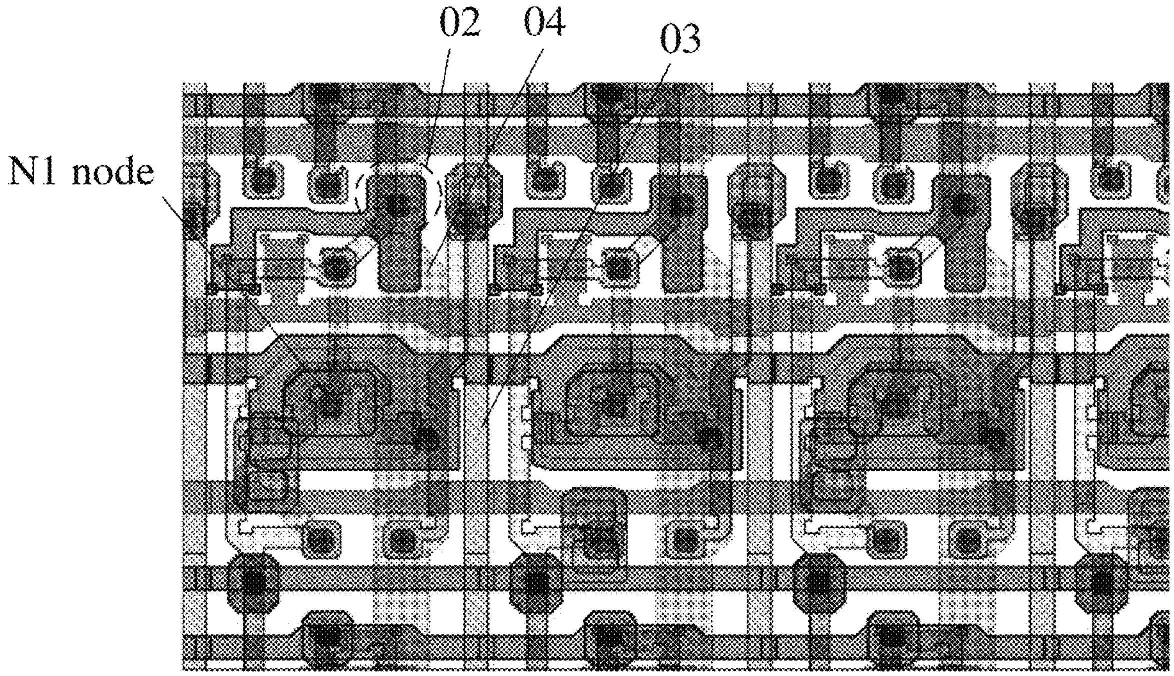
FIG. 1 is a layout diagram for reducing the influence of data signal jump on N1 node by forming a 3D capacitor in a LTPS pixel circuit.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms “first,” “second,” etc., which are used in the description and claims of the present disclosure, are not intended to indicate any sequence, amount or importance, but distinguish various components. The terms “comprises,” “comprising,” “includes,” “including,” etc., are intended to specify that the elements or the objects stated before these terms encompass the elements or the objects listed after these terms as well as equivalents thereof, but do not exclude other elements or objects.

The features such as “vertical” and “identical” used in the embodiment of the present disclosure all include the features such as “vertical” and “identical” in a strict sense, and the cases such as “substantially vertical” and “substantially identical” containing certain errors, which are within the acceptable deviation range for a specific value determined by ordinary skilled in the field in consideration of the measurement and the errors related to the measurement of a specific quantity (that is, the limitation of the measurement system). The “center” in the embodiments of the present disclosure may include a strictly geometric center position and a roughly central position in a small area around the geometric center. For example, “substantially” can refer to the cases within one or more standard deviations, or within 10% or 5% of the stated value.

Low temperature polysilicon oxide (LTPO) technology can be applied to the light emitting diode display panel, which can reduce the power consumption of the display panel. The power consumption of the display panel includes a driving power and a luminous power. The display panel based on LTPO technology has lower driving power than the display panel based on LTPS technology. The display panel based on LTPS technology needs a refresh frequency of 60

Hz to display a still image, but the refresh frequency of the display panel based on LTPO technology for displaying a still image can be reduced to 1 Hz, thus greatly reducing the driving power.

Based on the LTPO technology, some transistors in the display panel are oxide transistors (for example, N-type oxide transistors), and the leakage current of the oxide transistor is less, so that the voltage (charge) of the capacitor can be kept for one second to achieve a refresh frequency of 1 Hz. The leakage current of LTPS transistor is larger, so that if the LTPS transistor drives a still pixel, it needs a refresh frequency of 60 Hz; otherwise, the brightness will be greatly reduced. Therefore, LTPO technology has been widely used in display substrates.

For example, FIG. 1 is a layout diagram for reducing the influence of data signal jump on N1 node in a LTPS pixel circuit. For example, the position of N1 node is a connection position between a lower electrode plate of storage capacitor and the gate electrode of driving transistor. As illustrated by FIG. 1, in the design of an LTPS pixel circuit, in order to avoid the influence of data signal on N1 node, a second gate layer 02, which is applied with a power signal, is added to the right side of the N1 node, and the power signal is generated by a power signal line 04, that is, the second gate layer 02 is connected with the power signal line 04. A capacitor can be formed between the second gate layer 02 and the N1 node, so that the influence of data signal jump generated by the data line 03 on the N1 node can be blocked. However, this structural design does not directly arrange the second gate layer 02 and the N1 node to overlap with each other, so that the formed capacitor does not overlap on the plane, and a spatial 3D capacitor is formed. The spatial 3D capacitor is too small to shield the N1 node, so that the influence of the data signal on the N1 node cannot be effectively avoided.

Figure 2:
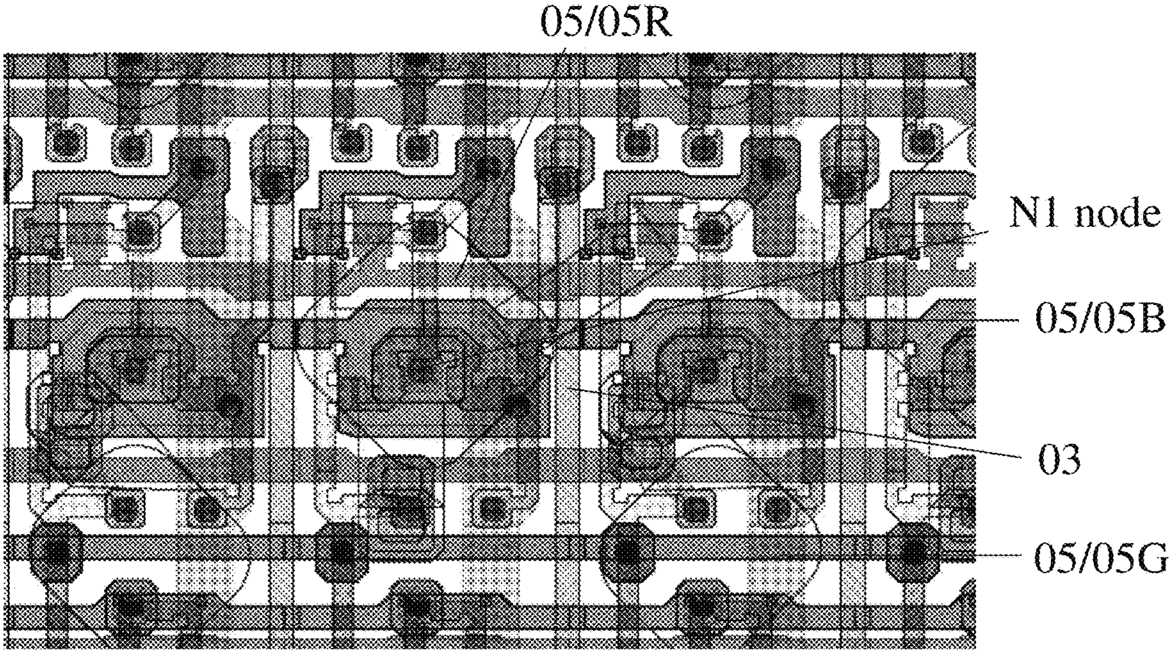
FIG. 2 is a layout diagram in which an anode shields an N1 node.

For example, FIG. 2 is a layout diagram in which an anode shields an N1 node. As illustrated by FIG. 2, an anode 05 covers an N1 node. Specifically, as illustrated by FIG. 2, an anode 05R of a red sub-pixel covers the N1 node, and a supplement part of the anode 05R of the red sub-pixel spans the data line 03 at a right side of the anode 05R, and an anode 05B of a blue sub-pixel covers the N1 node. In order to avoid the difference of pixel brightness and ensure the uniformity of display brightness, only the anode 05R of the red sub-pixel and the anode 05B of the blue sub-pixel cover the N1 node, and an anode 05G of a green sub-pixel does not cover the N1 node.

Due to the advantages of LTPO technology, such as high charge mobility, high pixel response speed and low power consumption, LTPO display products have many performance specification requirements. The inventor(s) of the present disclosure has noticed that these performance specifications of LTPO display products are closely related to the circuit design of the product back plate. For example, an anode transfer line located in the second conductive layer (SD2) can be used to shield the N1 node. Because the second conductive layer (SD2) is applied with a stable signal and a capacitor is formed between the second conductive layer (SD2) and the first conductive layer (SD1), the influence of nearby data signals on the N1 node can be reduced, that is, the influence of data signals on the N1 node can be shielded, and the abnormal display problem of the display panel caused by data signal jump affecting the voltage of the N1 node can be alleviated. Moreover, the red sub-pixel, the green sub-pixel and the blue sub-pixel all can adopt this design to block the N1 node, so as to solve the problem of poor luminous uniformity of display panel caused by process fluctuation of transistors.

The inventor(s) of the present disclosure also noticed that a horizontal power signal line (horizontal VDD) can be designed in the first conductive layer (SD1), and a vertical power signal line (vertical VDD) can be designed in the second conductive layer (SD2), and the horizontal power signal line and the vertical power signal line intersect to form a mesh power signal line, thus making the signal on the power signal line more stable and saving design space.

For example, at least one embodiment of that present disclosure provides a display substrate, which includes a base substrate, and a pixel circuit arranged on the base substrate, the pixel circuit includes a driving transistor and a storage capacitor. The display substrate further includes a first conductive layer, a second conductive layer and a first semiconductor layer, the first conductive layer includes a first connection structure, and the first connection structure includes a first end and a second end which are opposite to each other, the first end is connected with the first semiconductor layer, and the second end is electrically connected with a gate electrode of the driving transistor and a first electrode plate of the storage capacitor. The first conductive layer is at a side of the first semiconductor layer away from the base substrate, and the second conductive layer is at a side of the first conductive layer away from the base substrate, and an orthographic projection of the second conductive layer on the base substrate overlaps with an orthographic projection of at least part of the first connection structure on the base substrate. The display substrate arranges the orthographic projection of the second conductive layer on the base substrate to overlap with the orthographic projection of at least part of the first connection structure on the base substrate, so that a first electrode transfer line in the second conductive layer (SD2) can block at least part of the N1 node, because the second conductive layer (SD2) is applied with a stable signal, and a capacitor is formed between the second conductive layer (SD2) and the first conductive layer (SD1), and a capacitor is formed between the N1 node and a closest data line, the data signal has little influence on the capacitor, so that the influence of nearby data signals on the N1 node can be reduced, that is, the influence of data signals on the N1 node can be shielded, and the abnormal display problem of the display panel caused by data signal jump affecting the voltage of the N1 node can be alleviated.

Figure 3:
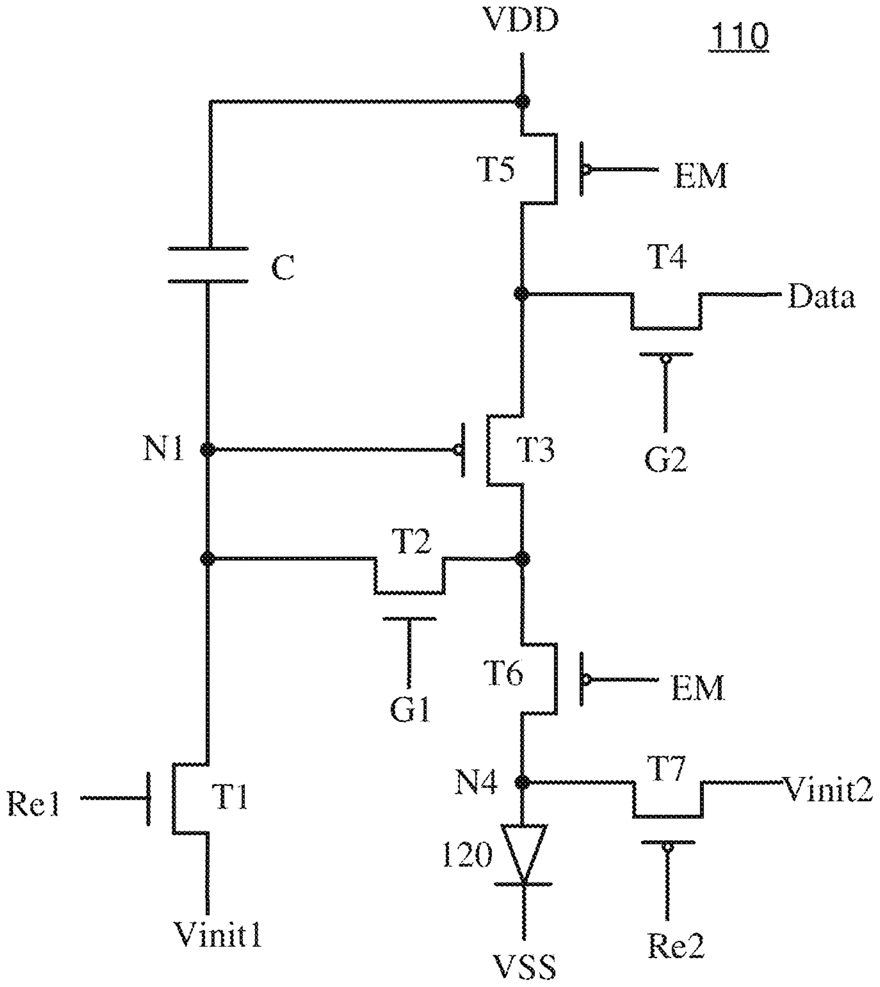
FIG. 3 is a schematic circuit structure diagram of a pixel circuit provided by an embodiment of the present disclosure.

For example, FIG. 3 is a schematic circuit structure diagram of a pixel circuit provided by an embodiment of the present disclosure. As illustrated by FIG. 3, the pixel circuit 110 includes a first transistor T1, a second transistor T2, a driving transistor T3, a fourth transistor T4, a fifth transistor T5, a sixth transistor T6, a seventh transistor T7 and a storage capacitor C.

For example, as illustrated by FIG. 3, the first transistor T1 is a first reset transistor T1, the second transistor T2 is a threshold compensation transistor T2, the fourth transistor T4 is a data writing transistor T4, the fifth transistor T5 is a second light emission control transistor T5, the sixth transistor T6 is a first light emission control transistor T6, and the seventh transistor T7 is a second reset control transistor T7.

For example, a first electrode of the first transistor T1 is connected with the N1 node, that is, the first electrode of the first transistor T1 is electrically connected with a gate electrode of the driving transistor T3; a second electrode of the first transistor T1 is connected with a first initial signal terminal Vinit1, that is, the second electrode of the first transistor T1 is electrically connected with the first reset signal terminal, to receive a reset control signal, a gate electrode of the first transistor T1 is connected with a first reset signal terminal Re1, that is, the gate electrode of the first transistor T1 is electrically connected with a reset control signal line to receive a reset control signal. A first electrode of the second transistor T2, namely, the threshold compensation transistor, is connected with the N1 node, that is, the first electrode of the second transistor T2 is electrically connected with the gate electrode of the driving transistor T3, and a second electrode of the second transistor T2 is connected with the second electrode of the driving transistor T3, a gate electrode of the second transistor T2 is connected with a first gate driving signal terminal G1 to receive a compensation control signal. The gate electrode of the driving transistor T3 is connected with the N1 node to be connected with the first electrode plate of the storage capacitor C, the first electrode of the first transistor T1 and the first electrode of the second transistor T2. A first electrode of the fourth transistor T4, namely, a data writing transistor, is connected with a data signal terminal Data to receive a data signal, a second electrode of the fourth transistor T4 is connected with the first electrode of the driving transistor T3, and a gate electrode of the fourth transistor T4 is connected with a second gate driving signal terminal G2 to receive a scanning signal. A first electrode of the fifth transistor T5, namely, a second light emission control transistor, is connected with a first power supply terminal VDD to receive a first power supply signal, a second electrode of the fifth transistor T5 is connected with the first electrode of the driving transistor T3, and a gate electrode of the fifth transistor T5 is connected with a light emission control signal terminal EM to receive a light emission control signal. A first electrode of the sixth transistor T6, namely, a first light emitting control transistor, is connected with the second electrode of the driving transistor T3, a second electrode of the sixth transistor T6 is connected with the first electrode of the seventh transistor T7, and a gate electrode of the sixth transistor T6 is connected with a light emitting control signal terminal EM to receive a light emitting control signal. A second electrode of the seventh transistor T7 is connected with a second initial signal terminal Vinit2, that is, the second electrode of the seventh transistor T7 is electrically connected with a second reset power signal line to receive a reset signal Vinit, and a gate electrode of the seventh transistor T7 is connected with a second reset signal terminal Re2, that is, the gate electrode of the seventh transistor T7 is electrically connected with a reset control signal line to receive a reset control signal. The first electrode plate of the storage capacitor C is connected with the N1 node and electrically connected with the gate electrode of the driving transistor T3, and the second electrode plate of the storage capacitor C is connected with the first power supply terminal VDD, that is, the first power supply signal line. The pixel circuit can be connected with a light emitting element 120, which can be an organic light emitting diode (OLED), and the pixel circuit is used for driving the light emitting element 120 to emit light, and the light emitting element 120 can be connected between the second electrode of the sixth transistor T6 and the second power supply terminal VSS, that is, the second power supply signal line.

For example, the first power signal line refers to a signal line that outputs a voltage signal VDD, and can be connected with a voltage source to output a constant voltage signal, such as a positive voltage signal. The second power signal line refers to a signal line that outputs a voltage signal VSS, and can be connected with a voltage source to output a constant voltage signal, such as a negative voltage signal.

For example, the scanning signal and the compensation control signal may be the same, that is, the gate electrode of the data writing transistor T4 and the gate electrode of the threshold compensation transistor T2 may be electrically connected with the same signal line to receive the same signal, so as to reduce the number of signal lines. For example, the gate electrode of the data writing transistor T4 and the gate electrode of the threshold compensation transistor T2 can also be electrically connected with different signal lines respectively, that is, the gate electrode of the data writing transistor T4 is electrically connected with the second scanning signal line (second gate line), and the gate electrode of the threshold compensation transistor T2 is electrically connected with the first scanning signal line (first gate line), and the signals transmitted by the first scanning signal line and the second scanning signal line can be the same or different, so that the gate electrode of the data writing transistor T4 and the gate electrode of the threshold compensation transistor T2 can be separately and independently controlled.

For example, the first light emission control transistor T6 and the second light emission control transistor T5 may be input with the same light emission control signal, that is, a gate electrode of the first light emission control transistor T6 and a gate electrode of the second light emission control transistor T5 may be electrically connected with the same signal line to receive the same signal, thereby reducing the number of signal lines. For example, the gate electrodes of the first light emitting control transistor T6 and the second light emitting control transistor T5 may be electrically connected with different light emitting control signal lines, respectively. In this case, the signals transmitted by different light emitting control signal lines may be the same or different.

For example, the second reset transistor T7 and the first reset transistor T1 may be input with the same reset control signal, that is, a gate electrode of the second reset transistor T7 and a gate electrode of the first reset transistor T1 may be electrically connected with the same signal line to receive the same signal, thereby reducing the number of signal lines. For example, the gate electrode of the second reset transistor T7 and the gate electrode of the first reset transistor T1 may be electrically connected with different reset control signal lines, respectively, in this case, the signals on different reset control signal lines may be the same or different.

For example, the first transistor T1 and the second transistor T2 may be N-type transistors. For example, the first transistor T1 and the second transistor T2 can be N-type metal oxide transistors, and the N-type metal oxide transistors have smaller leakage current, so that the problem that the N1 node leaks electricity through the first transistor T1 and the second transistor T2 in the light emitting stage can be avoided. Meanwhile, the driving transistor T3, the fourth transistor T4, the fifth transistor T5, the sixth transistor T6, and the seventh transistor T7 can be P-type transistors, for example, the driving transistor T3, the fourth transistor T4, the fifth transistor T5, the sixth transistor T6, and the seventh transistor T7 can be P-type low-temperature polycrystalline silicon transistors, and the P-type low-temperature polycrystalline silicon transistors have higher carrier mobility, thus being beneficial to realizing high resolution, high response speed, high pixels per inch, and high aperture ratio. The first initial signal terminal Vinit1 and the second initial signal terminal Vinit2 can output the same or different voltage signals according to the actual situation.

Figure 4:
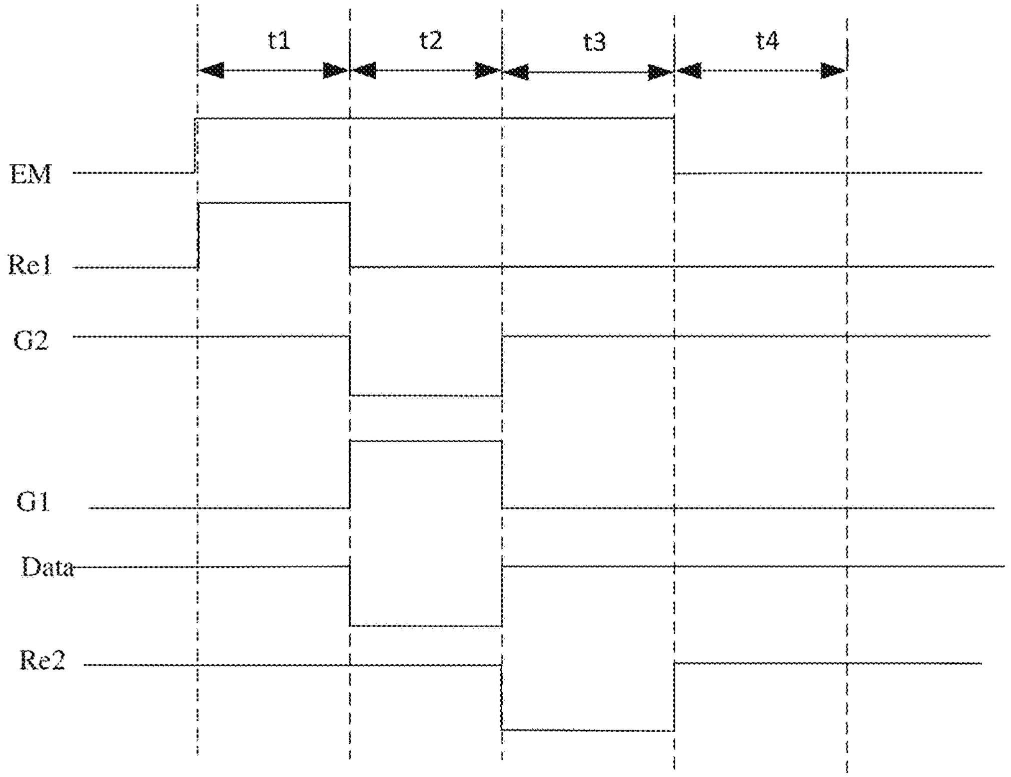
FIG. 4 is a timing chart of nodes in a driving method of the pixel circuit in FIG. 3.

For example, FIG. 4 is a timing diagram of nodes in a driving method of the pixel circuit in FIG. 3. G1 represents the timing of the first gate driving signal terminal G1, G2 represents the timing of the second gate driving signal terminal G2, Re1 represents the timing of the first reset signal terminal Re1, Re2 represents the timing of the second reset signal terminal Re2, EM represents the timing of the light emission control signal terminal EM, and Data represents the timing of the data signal terminal Data. The driving method of the pixel circuit may includes a first reset stage t1, a compensation stage t2, a second reset stage t3, and a light emitting stage t4. In the first reset stage t1, the first reset signal terminal Re1 outputs a high-level signal, the first transistor T1 is turned on, and the first initial signal terminal Vinit1 inputs an initial signal to the node N1. In the compensation stage t2, the first gate driving signal terminal G1 outputs a high-level signal, the second gate driving signal terminal G2 outputs a low-level signal, the fourth transistor T4 and the second transistor T2 are turned on, and at the same time, the data signal terminal Data outputs a drive signal to write the voltage Vdata+Vth (that is, a sum of the voltages Vdata and Vth) to the node N1, where Vdata is the voltage of a drive signal and Vth is a threshold voltage of the drive transistor T3. In the second reset stage t3, the second reset signal terminal Re2 outputs a low-level signal, the seventh transistor T7 is turned on, and the second initial signal terminal Vinit2 inputs an initial signal to the second electrode of the sixth transistor T6. In the light emitting stage t4, the light emitting control signal terminal EM outputs a low-level signal, the sixth transistor T6 and the fifth transistor T5 are turned on, and the driving transistor T3 emits light under the action of the voltage Vdata+Vth stored in the storage capacitor C.

It should be noted that, in the embodiment of the present disclosure, each pixel circuit can be a structure including other number of transistors besides the 7T1C (that is, seven transistors and one capacitor) structure shown in FIG. 3, such as 7T2C structure, 6T1C structure, 6T2C structure, 8T1C structure or 9T2C structure, which is not limited in the embodiment of the present disclosure.

For example, the display substrate includes a plurality of repeating units distributed along a first direction and a second direction which mutually intersect with each other, and each of the repeating units includes two pixel circuits, and the two pixel circuits include a first pixel circuit and a second pixel circuit distributed along the second direction, and the first pixel circuit and the second pixel circuit are roughly arranged in mirror symmetry, and the pixel circuit described below is described by one of the first pixel circuit and the second pixel circuit.

Figure 5A:
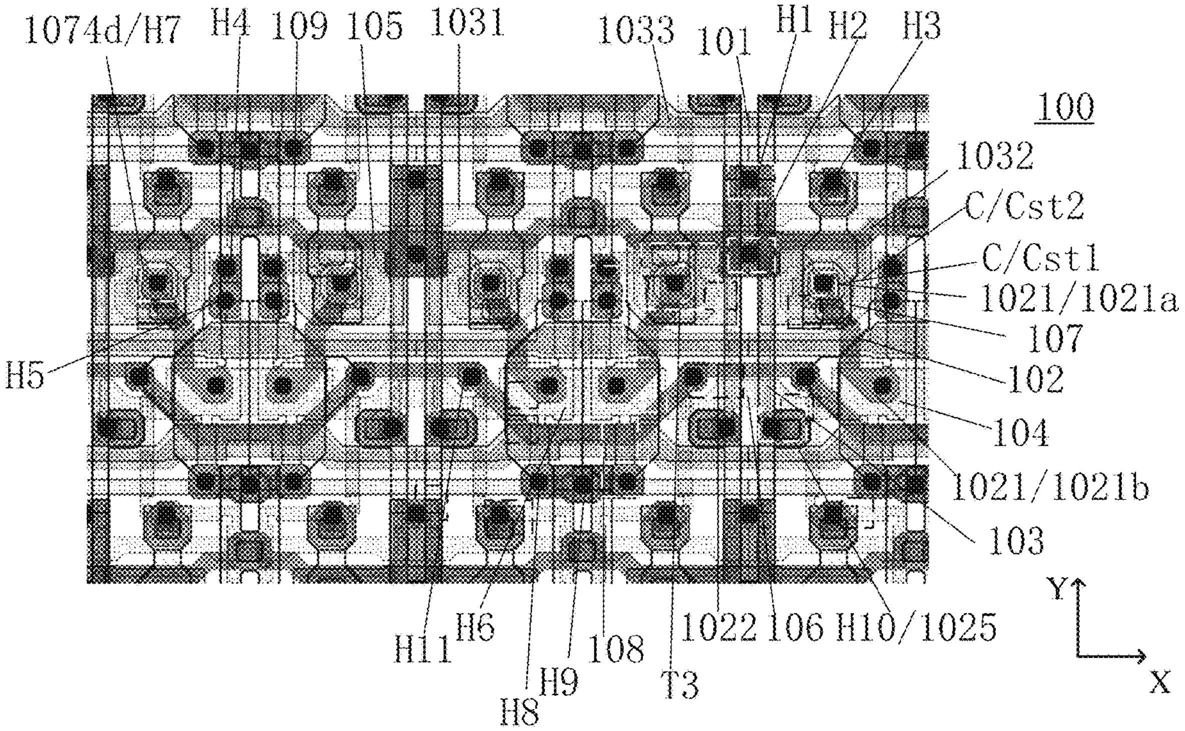
FIG. 5A is a structural layout diagram of a display substrate provided by at least one embodiment of the present disclosure.
Figure 5B:
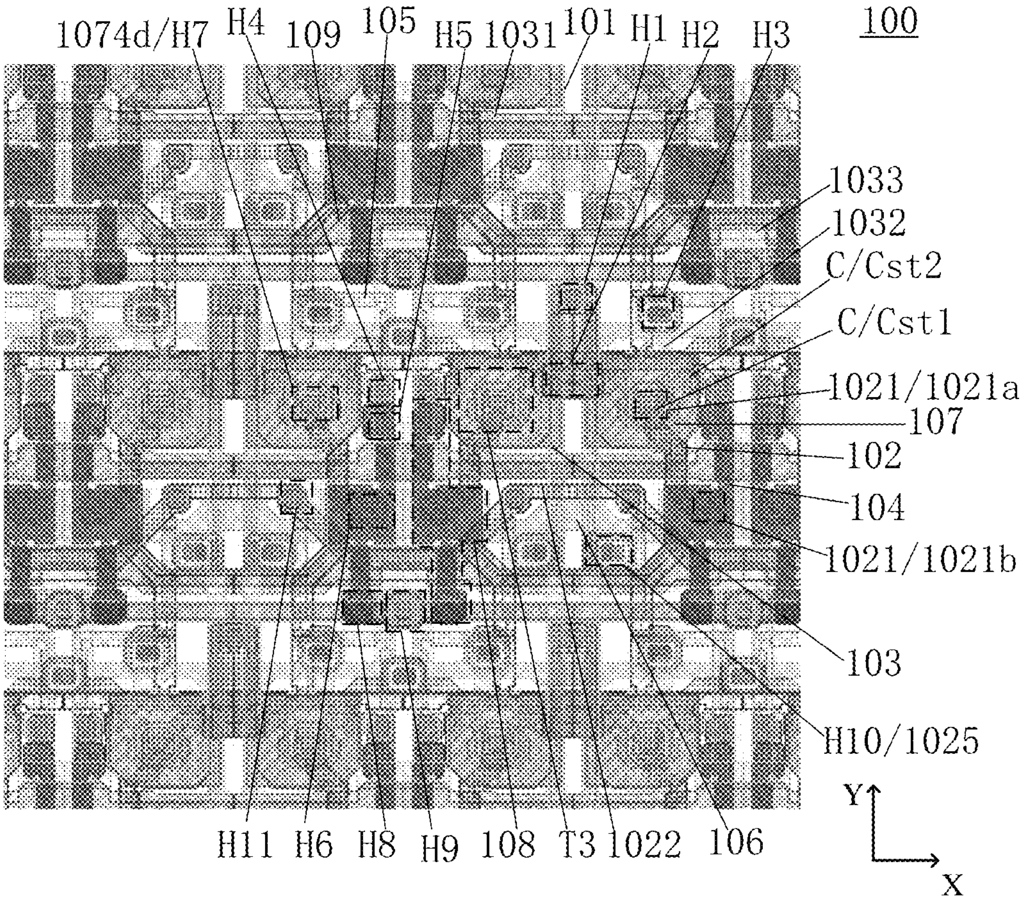
FIG. 5B is a structural layout diagram of another display substrate provided by at least one embodiment of the present disclosure.
Figure 6:
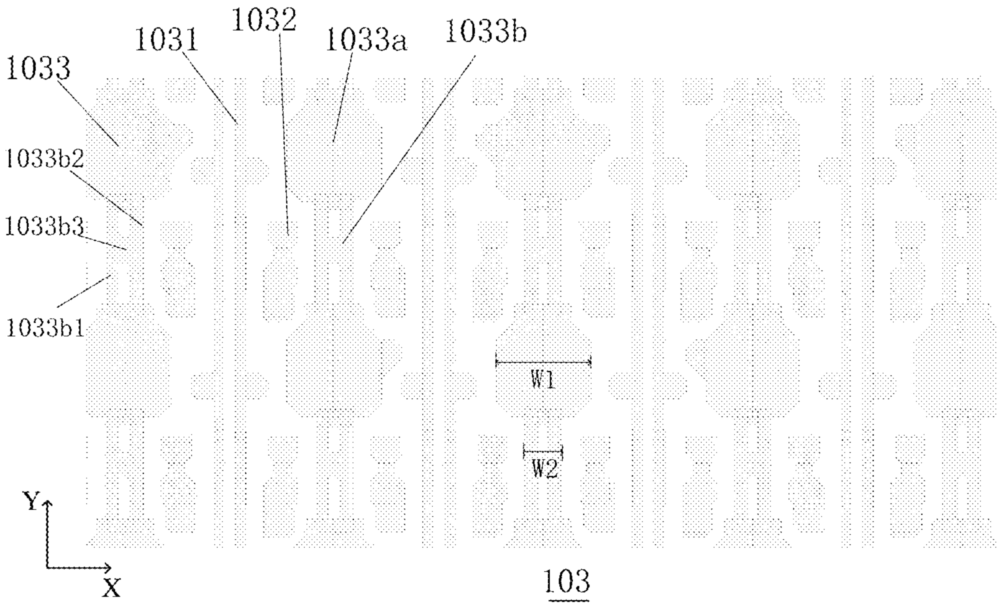
FIG. 6 is a structural layout diagram of the second conductive layer in FIG. 5B.
Figure 7:
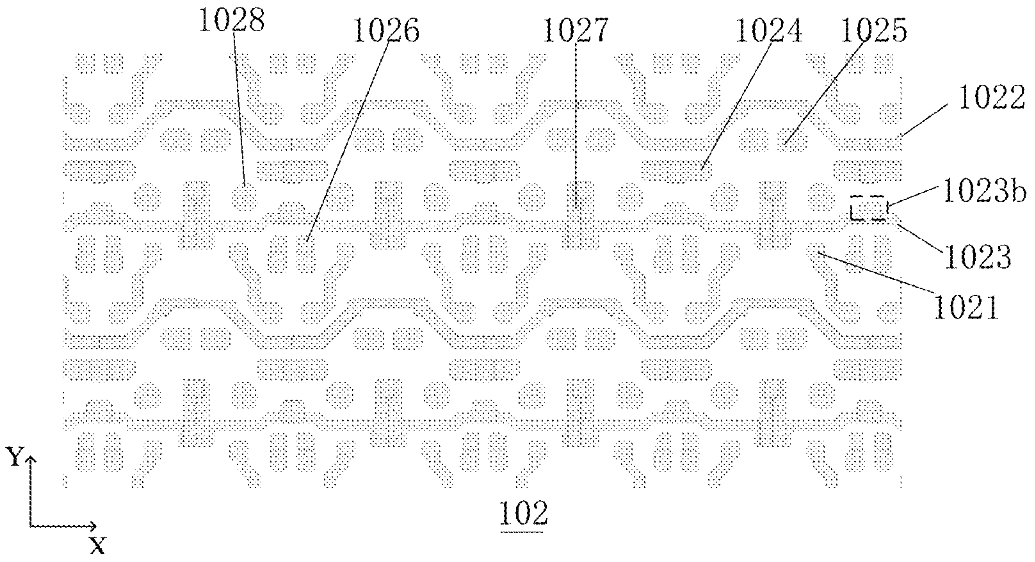
FIG. 7 is a structural layout diagram of the first conductive layer in FIG. 5B.
Figure 8:
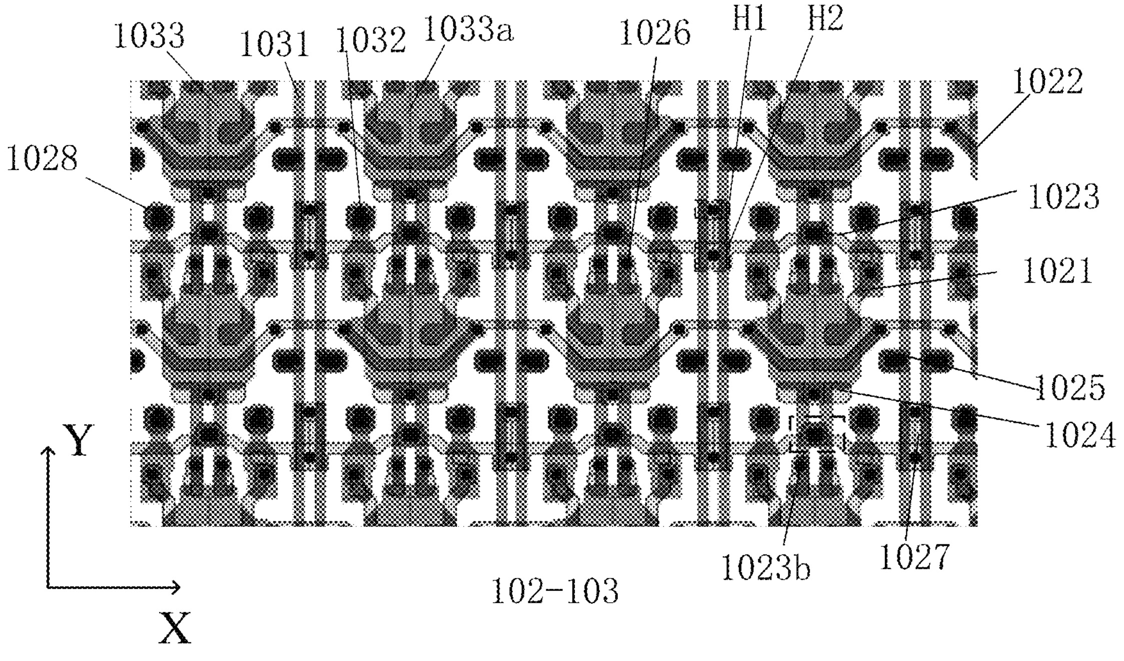
FIG. 8 is a structural layout diagram in which the first conductive layer and the second conductive layer in FIG. 5B are superimposed.

For example, an embodiment of the present disclosure provides a display substrate, FIG. 5A is a structural layout diagram of a display substrate provided by at least one embodiment of the present disclosure, FIG. 5B is a structural layout diagram of another display substrate provided by at least one embodiment of the present disclosure, FIG. 6 is a structural layout diagram of a second conductive layer in FIG. 5B, FIG. 7 is a structural layout diagram of a first conductive layer in FIG. 5B, and FIG. 8 is a structural layout in which a first conductive layer and a second conductive layer are superimposed in FIG. 5B. FIG. 5A to FIG. 7 only schematically show the laminated structure or single-layer structure of some film layers in the display substrate, and other film layers may also include film layers where the gate lines are located, film layers where the light shielding layer is located, and so on. Compared with FIG. 5A, FIG. 5B is additionally provided with a light shielding layer, and other structural settings are the same.

For example, as illustrated by FIG. 3 and FIG. 5B, the display substrate 100 includes a base substrate 101, a pixel circuit 110 arrange on the base substrate 101, the pixel circuit 110 includes a driving transistor T3 and a storage capacitor C, the display substrate 100 further includes a first conductive layer 102, a second conductive layer 103 and a first semiconductor lay 104, the first conductive layer 102 includes a first connection structure 1021, and the first connection structure 1021 includes a first end 1021*a* and a second end 1021*b* which are opposite to each other. The first end 1021*a* is connected with the first semiconductor layer 104, and the second end 1021*b* is electrically connected with the gate electrode of the driving transistor T3 and the first electrode plate Cst1 of the storage capacitor C; the first conductive layer 102 is located at a side of the first semiconductor layer 104 away from the base substrate 101, and the second conductive layer 103 is located at a side of the first conductive layer 102 away from the base substrate 101, and an orthographic projection of the second conductive layer 103 on the base substrate 101 overlaps with an orthographic projection of at least part of the first connection structure 1021 on the base substrate 101. In this display substrate 100, the orthographic projection of the second conductive layer 103 on the base substrate 101 and the orthographic projection of at least part of the first connection structure 1021 on the base substrate 101 are overlapped with each other, so that the second conductive layer 103 (also called SD2) can block at least part of the first connection structure 1021 (also called N1 node). Therefore, the second conductive layer 103 and the first connection structure 1021 located in the first conductive layer 102 directly form a capacitance, that is, a capacitance is directly formed between the second conductive layer 103 (SD2) and the first conductive layer 102 (also called SD1), so that a capacitance is formed between the N1 node and the closest data line Data. Because both the light emission control signal line EM and the second initial signal line Vinit2 transmit stable DC signals, the second conductive layer 103 (SD2) is connected with a stable signal, and the signal changes only once in a frame time. This design can make the second conductive layer 103 (SD2) directly form a capacitance with the first conductive layer 102 (also called SD1) at the N1 node when the N1 node is working normally, and the second conductive layer 103 (SD2, the upper electrode plate) is connected with a stable signal. Because of the characteristics of capacitor itself, the voltages on the two ends of the capacitor cannot change suddenly, upon the upper electrode plate is connected with a stable signal, the signal on the lower electrode plate, namely the first conductive layer 102 (SD1) at the N1 node can also keep stable, which can reduce the influence of data signal which frequently jump in one frame time on the N1 node. The data signal has little influence on the capacitance, so that the influence of nearby data signals on the N1 node can be reduced, that is, the influence of data signals on the N1 node can be shielded, and the problem that the display panel cannot display normally due to the voltage of the N1 node affected by the data signal jump can be solved.

For example, as illustrated by FIG. 5B, the first semiconductor layer 104 includes active semiconductor patterns of a first transistor T1 and a second transistor T2 mentioned later, and the material of the first semiconductor layer 104 is a metal oxide semiconductor, such as indium gallium zinc oxide (IGZO). The first electrode plate Cst1 of the storage capacitor C can be used as the gate electrode of the driving transistor T3.

For example, in combination with FIG. 3 and FIG. 5B, the first end 1021*a* of the first connection structure 1021 is also electrically connected with the first electrode of the first transistor T1 (first reset transistor) and the first electrode of the second transistor T2 (threshold compensation transistor).

For example, as illustrated by FIG. 5A, FIG. 5B, FIG. 6 and FIG. 8, the second conductive layer 103 includes a data line 1031, a first electrode transfer line 1032 and a first power signal line 1033 which are spaced apart from each other. The first electrode transfer line 1032 has an elongated shape, and the entirety of the first electrode transfer line 1032 extends along an extending direction of the data line 1031 which is closest to it. The extending direction of the data line 1031 is the first direction Y, and a direction perpendicular or substantially perpendicular to the extending direction of the data line 1031 is the second direction X. With reference to FIG. 3, FIG. 5B, FIG. 6 and FIG. 8, the first electrode transfer line 1032 is connected with a first electrode of the light emitting element 120 described later through a via hole. For example, as illustrated by FIG. 5B, FIG. 6 and FIG. 8, an orthographic projection of the entirety of the data line 1031 on the base substrate 101 extends linearly along the first direction Y. In the same repeating unit, orthographic projections of two data lines 1031 on the base substrate 101 are located between the orthographic projections of two first power signal lines 1033 on the base substrate 101.

For example, in the structural layout diagram of the first conductive layer 102 shown in FIG. 7, the first conductive layer 102 further includes a second initial signal line 1022, in combination to FIG. 3 and FIG. 7, the first conductive layer 102 is electrically connected with the first electrode of the seventh transistor T7 (first reset transistor) to provide a reset signal. For example, the second initial signal line 1022 may be a first reset signal line electrically connected with the first electrode of the seventh transistor T7, and the display substrate 110 further includes a second reset power signal line (not described in the figure), a first part of the second reset power signal line is located between the first conductive layer 102 and a film layer where the gate electrode of the seventh transistor T7 is located, and is configured to be electrically connected with the first electrode of the first transistor T1 to provide a reset signal.

For example, as illustrated by FIGS. 7 and 8, the first conductive layer 102 further includes power signal connection lines 1023 extending along the second direction X. The second conductive layer 103 includes data lines data and first power signal lines 1033 extending along the first direction Y. Each of the power signal connection lines 1023 is electrically connected with a plurality of first power signal lines 1033 arranged along the second direction X to form a grid shape. The first power signal line 1033 can be used to provide the first power terminal in FIG. 3, and the data line 1031 can be used to provide the data signal terminal in FIG. 3. For example, as illustrated by FIGS. 7 and 8, a main part 1023*a* of the power signal connection line 1023 has a broken line shape with a convex part, and a middle part of the convex part is provided with a connection block 1023*b*. The overall extending direction of the power signal connection line 1023 is parallel to the second direction X, and the extending direction of the connection block 1023*b* is parallel to the first direction Y. On the power signal connection line 1023, the number of the connection blocks 1023*b* is multiple, and the power signal connection line 1023 is connected with a plurality of first power signal lines 1033 in the second conductive layer 103 through the plurality of connection blocks 1023*b*.

For example, as illustrated by FIG. 3, FIG. 5 and FIG. 7, the first conductive layer 102 further includes a first connection part 1024 electrically connected with the first part of the second reset power signal line.

For example, as illustrated by FIG. 3, FIG. 5 and FIG. 7, the first conductive layer 102 further includes a second connection part 1025 through which the first electrode of the data writing transistor T4 is electrically connected with the data line 1031 to receive data signals.

For example, as illustrated by FIG. 3, FIG. 5, FIG. 7 and FIG. 8, the first conductive layer 102 further includes a third connection structure 1027, and the first electrode of the sixth transistor T6 (first light emission control transistor) is electrically connected with the second electrode of the second transistor T2 (threshold compensation transistor) through the third connection structure 1027. For example, the third connection structure 1027 is a branch part included in the power signal connection line 1023.

For example, as illustrated by FIG. 5B, FIG. 6, FIG. 7 and FIG. 8, an orthographic projection of the first electrode transfer line 1032 on the base substrate 101 overlaps with an orthographic projection of part of the first connection structure 1021 on the base substrate 101. The entirety of the first connection structure 1021 is in a shape of a broken line extending to a side away from the closest data line 1031. The first connection structure 1021 includes an overlapping part overlapping with the first electrode transfer line 1032 and a non-overlapping part not overlapping with the first electrode transfer line 1032, and the non-overlapping part is further away from the closest data line 1031 than the overlapping part.

For example, as illustrated by FIG. 5B, FIG. 6, FIG. 7 and FIG. 8, the first power signal line 1033 includes a block-shaped part 1033*a* and a strip-shaped part 1033*b* extending along the first direction Y as a whole, and the strip-shaped part 1033*b* connects the block-shaped parts 1033*a* adjacent to each other along the first direction Y. The main part 1023*a* of the power signal connection line 1023 is connected with the first power signal line 1033 to form a grid shape. For example, the main part 1023*a* of the power signal connection line 1023 is connected with the strip part 1033*b* of the first power signal line 1033 to form a grid shape. The arrangement of the grid shape can electrically connect the first power signal lines 1033 of the pixels, which is conducive to reducing the voltage drop of the first power signal lines 1033, thus improving the display uniformity of the display panel upon the display substrate being used in the display panel.

For example, as illustrated by FIG. 5B, FIG. 6 and FIG. 7, the block-shaped part 1033*a* overlaps with the light emitting region of at least one of the first sub-pixel and the third sub-pixel mentioned later.

For example, as illustrated by FIG. 5B, FIG. 6 and FIG. 7, the second conductive layer 103 further includes a part (e.g., a part of the data line 1031) that overlaps with a light emitting region of the second sub-pixel mentioned later.

For example, as illustrated by FIG. 6, a width W1 of the block-shaped part 1033*a* in the second direction X is greater than a width W2 of the entirety of the strip-shaped part 1033*b* in the second direction X, so that the area of the second conductive layer 103 can be further reduced to save space.

For example, as illustrated by FIG. 5B, FIG. 6, FIG. 7 and FIG. 8, the first electrode transfer line 1032 extends along the first direction Y, and the first electrode transfer line 1032 shields a part of the first connection structure 1021 at a position of an end of the first electrode transfer line 1032 close to the first connection structure 1021, that is, an orthographic projection of the end of the first electrode transfer line 1032 close to the first connection structure 1021 on the base substrate 101 overlaps with an orthographic projection of a part of the first connection structure 1021.

For example, as illustrated by FIG. 6 and FIG. 8, the strip-shaped part 1033*b* includes a first strip-shaped part 1033*b*1 and a second strip-shaped part 1033*b*2 which are oppositely arranged, and a third strip-shaped part 1033*b*3 which connects the first strip-shaped part 1033*b*1 and the second strip-shaped part 1033*b*2, the extending directions of the first strip-shaped part 1033*b*1 and the second strip-shaped part 1033*b*2 are parallel to the first direction Y, and the third strip-shaped part 1033*b*3 connects middle regions of the first strip-shaped part 1033*b*1 and the second strip-shaped part 1033*b*2. For example, the extending direction of the third strip-shaped part 1033*b*3 may be parallel to or not parallel to the second direction X, but intersect with the second direction X.

For example, in one example, a planar shape of the first strip-shaped part 1033*b*1 and the second strip-shaped part 1033*b*2 and the third strip-shaped part 1033*b*3 may be H-shaped.

For example, in one example, the strip-shaped part 1033*b* includes a hollow structure, and this structural design can reduce the area of the second conductive layer 103, thereby saving space.

For example, as illustrated by FIG. 3, FIG. 5B, FIG. 6, FIG. 7 and FIG. 8, the first conductive layer 102 further includes a third connection part 1026, and the second electrode of the sixth transistor T6 (first light emission control transistor) is electrically connected with the first electrode of the light emitting element through the third connection part 1026 and the first electrode transfer line 1032.

Figure 9:
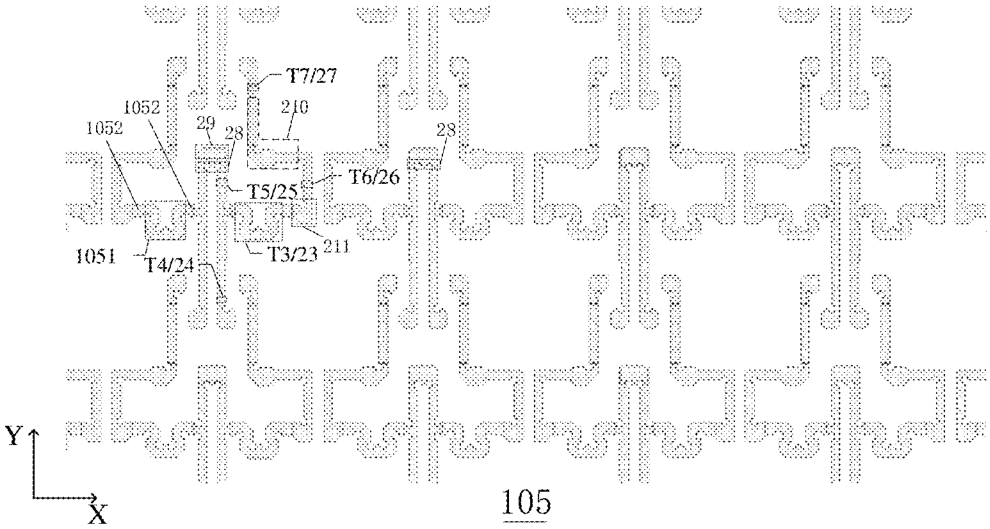
FIG. 9 is a partial structural diagram of the first active layer in the display substrate shown in FIG. 5B.

For example, FIG. 9 is a partial structural diagram of a first active layer in the display substrate shown in FIG. 5B. For example, as illustrated by FIGS. 5B to 9, the pixel circuit 110 includes a first active layer 105, which includes a channel region 1051 and a source-drain region 1052 of each transistor. For example, the source-drain region 1052 may include a source region 1052*a* and a drain region 1052*b*.

For example, FIG. 9 schematically shows that the first active layer 105 is formed by patterning a semiconductor material. The first active layer 105 can be used to form the active layers of the above-mentioned driving transistor T3, the fourth transistor T4 (data writing transistor), the fifth transistor T5 (second light emission control transistor), the sixth transistor T6 (first light emission control transistor) and the seventh transistor T7 (second reset control transistor), so as to form the channel regions of the above-mentioned transistors. The first active layer 105 includes an active layer pattern (channel region) and a doped region pattern (source-drain region) of the above-mentioned transistor of each sub-pixel, and the active layer pattern and the doped region pattern of the above-mentioned transistor in the same pixel circuit are integrally formed.

For example, in FIG. 9, each dashed rectangular frame shows parts of the metal layer overlapping with the first active layer 105 to serve as the channel regions of the driving transistor T3, the fourth transistor T4, the fifth transistor T5, the sixth transistor T6 and the seventh transistor T7, respectively, and the parts of the first active layer on both sides of each channel region 1051 are conducted as the first electrode and the second electrode of each transistor by a process such as ion doping, that is, the source-drain region 1052. The source electrode and the drain electrode of each transistor can be symmetrical in structure, so there can be no difference in physical structure between the source electrode and the drain electrode. In the embodiment of the present disclosure, in order to distinguish the transistors, except for the gate electrode as the control electrode, one of the source electrode and the drain electrode is directly described as the first electrode and the other one of the source electrode and the drain electrode s directly described as the second electrode, so the first electrode and the second electrode of all or part of the transistors in the embodiment of the present disclosure can be interchanged as required.

For example, as illustrated by FIG. 9, the first active layer 105 includes a third active part 23, a fourth active part 24, a fifth active part 25, a sixth active part 26, a seventh active part 27, an eighth active part 28, a ninth active part 29, a tenth active part 210 and an eleventh active part 211; the third active part 23 is used to form a channel region of the driving transistor T3; the fourth active part 24 is used to form a channel region of the fourth transistor T4; the fifth active part 25 is used to form a channel region of the fifth transistor T5; the sixth active part 26 is used to form the channel region of the sixth transistor T6; the seventh active part 27 is used to form a channel region of the seventh transistor T7; the eighth active part 28 is connected with a side of the fifth active part 25 away from the third active part 23, and the ninth active part 29 is connected between the eighth active part 28 in the first pixel circuit P1 and the eighth active part 28 in the second pixel circuit P2. The tenth active part 210 is connected between the sixth active part 26 and the seventh active part 27, and the eleventh active part 211 is connected between the sixth active part 26 and the third active part 23. The eighth active part 28 can be used to form the first electrode of the fifth transistor T5. For example, in the embodiment of the present disclosure, the eighth active parts 28 in two adjacent pixel circuits are connected through the ninth active part 29, so that the voltage difference between the first power supply terminals in the adjacent pixel circuits can be reduced.

For example, as illustrated by FIG. 9, the first active layer 105 can be made of amorphous silicon, polysilicon, etc. It should be noted that the source region and the drain region may be regions doped with N-type impurities or P-type impurities. For example, in one example, the first active layer may be formed of polysilicon material, and correspondingly, the driving transistor T3, the fourth transistor T4, the fifth transistor T5, the sixth transistor T6 and the seventh transistor T7 may be P-type low temperature polysilicon thin film transistors.

For example, a side of the first active layer 105 away from the base substrate 101 is provided with a metal layer, which includes the scanning signal line, the reset control signal line, the light emission control signal line and the gate electrodes of the driving transistor T3, the fourth transistor T4, the fifth transistor T5, the sixth transistor T6 and the seventh transistor T7.

Figure 10:
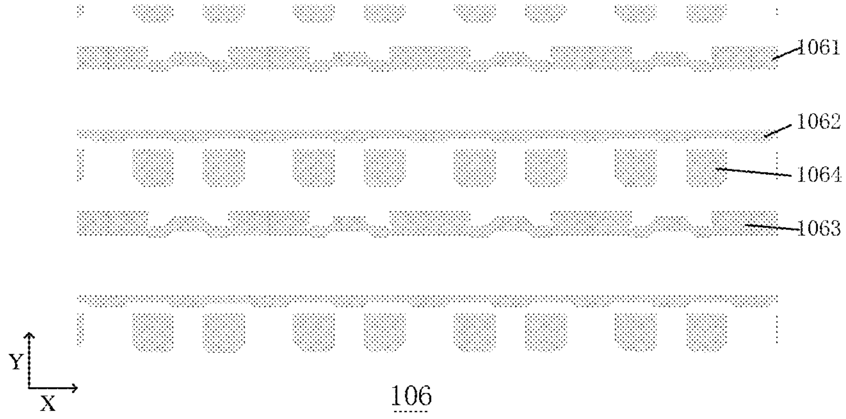
FIG. 10 is a partial structural diagram of the third conductive layer in the display substrate shown in FIG. 5B.

For example, the display substrate further includes a third conductive layer. For example, FIG. 10 is a partial structural schematic diagram of the third conductive layer in the display substrate shown in FIG. 5B. As illustrated by FIG. 5B and FIG. 10, the third conductive layer 106 includes a second gate line 1061, a light emission control signal line 1062, a second reset signal line 1063 and a second conductive part 1064.

For example, in combination with FIG. 5B, FIG. 9 and FIG. 10, an orthographic projection of the second gate line 1061 on the base substrate 101 extends along the second direction X and overlaps with an orthographic projection of the fourth active part 24 on the base substrate 101, and a partial structure of the second gate line 1061 is used to form the gate electrode of the fourth transistor T4. The second gate line 1061 can be used to provide the second gate driving signal terminal G2 in FIG. 3.

For example, in combination with FIG. 5B, FIG. 9 and FIG. 10, an orthographic projection of the light emission control signal line 1062 on the base substrate 101 extends along the second direction X and overlaps with the orthographic projection of the sixth active part 26 on the base substrate 101, and a partial structure of the light emission control signal line 1062 is used to form the gate electrode of the sixth transistor T6. The light emission control signal line 1062 can be used to provide the light emission control signal terminal EM in FIG. 3. For example, an orthographic projection of the light emission control signal line 1062 on the base substrate 101 may also overlap with an orthographic projection of the fifth active part 25 on the base substrate 101, and a partial structure of the light emission control signal line 1062 is used to form the gate electrode of the fifth transistor T5.

For example, in combination with FIG. 5B, FIG. 9 and FIG. 10, an orthographic projection of the second reset signal line 1063 on the base substrate 101 extends along the second direction X and overlaps with an orthographic projection of the seventh active part 27 on the base substrate 101. A partial structure of the second reset signal line 1063 is used to form the gate electrode of the seventh transistor T7, and the second gate line 1061 in the pixel circuit 110 of the present row is reused as the second reset signal line 1063 in the pixel circuit 110 of an adjacent row. The second reset signal line 1063 can be used to provide the second reset signal terminal Re2 in FIG. 3. For example, this arrangement can improve the integration of the pixel circuit and reduce the layout area of the pixel circuit.

For example, in combination with FIG. 5B and FIG. 10, an orthographic projection of the second gate line 1061 on the base substrate 101, an orthographic projection of the light emission control signal line 1062 on the base substrate 101, and an orthographic projection of the second reset signal line 1063 on the base substrate 101 all extend along the second direction X and are substantially parallel to each other. It should be noted that an orthographic projection of a certain structure on the base substrate extends along a certain direction, which can be understood as that an orthographic projection of the structure on the base substrate extends straightly or bends along the direction, and the embodiment of the present disclosure is not limited thereto.

For example, in combination with FIG. 5B, FIG. 9 and FIG. 10, an orthographic projection of the second conductive part 1064 on the base substrate 101 and an orthographic projection of the third active part 23 on the base substrate 101 overlap with each other, and the second conductive part 1064 forms the gate electrode of the driving transistor T3 and the first electrode plate Cst1 of the storage capacitor C. For example, in the same pixel circuit 110, the orthographic projection of the second conductive part 1064 on the base substrate 101 is located between the orthographic projection of the second gate line 1061 on the base substrate 101 and the orthographic projection of the light emission control signal line 1062 on the base substrate 101. An orthographic projection of the second reset signal line 1063 on the base substrate 101 is located at a side of the orthographic projection of the light emission control signal line 1062 on the base substrate 101 away from the orthographic projection of the second conductive part 1064 on the base substrate 101.

For example, the display substrate can use the third conductive layer 106 as a mask to perform a conductive treatment on the first active layer 105, that is, a region covered by the third conductive layer 106 in the first active layer 105 can form a channel region of each transistor, and a region not covered by the third conductive layer 106 in the first active layer 105 can form a conductor structure.

Figure 11:
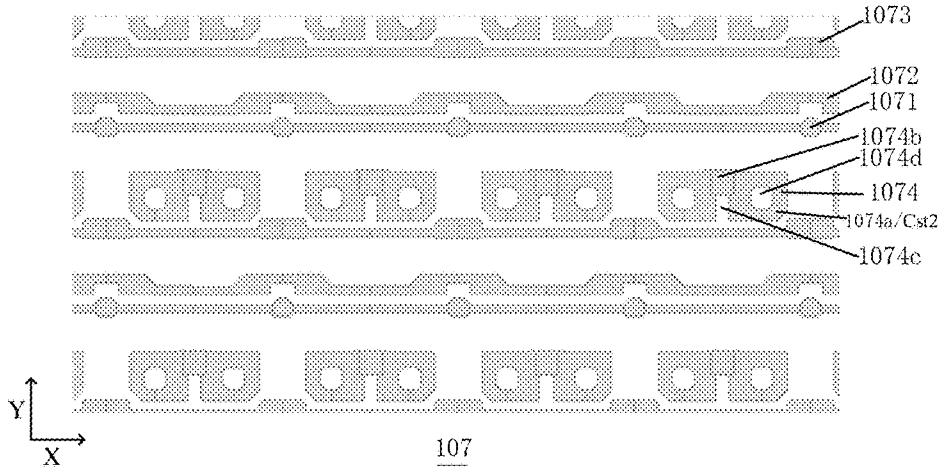
FIG. 11 is a partial structural diagram of the conductive film layer in the display substrate shown in FIG. 5B.

For example, the display substrate also includes a conductive film layer. For example, FIG. 11 is a partial structural diagram of a conductive film layer in the display substrate shown in FIG. 5B. As illustrated by FIG. 5B and FIG. 11, the conductive film layer 107 is located between the third conductive layer 106 and the second conductive layer 103, and the conductive film layer 107 includes a first initial signal line 1071, a third reset signal line 1072, a third gate line 1073 and a first conductive part 1074.

For example, as illustrated by FIG. 11, the first initial signal line 1071 is used to provide the first initial signal terminal in FIG. 3, the third reset signal line 1072 is used to provide the first reset signal terminal in FIG. 3, and the third gate line 1073 is used to provide the first gate driving signal terminal G1 in FIG. 3. An orthographic projection of the first initial signal line 1071 on the base substrate 101, an orthographic projection of the third reset signal line 1072 on the base substrate 101, and an orthographic projection of the third gate line 1073 on the base substrate 101 may all extend along the second direction X.

For example, in combination with FIG. 3 and FIG. 11, the orthographic projection of the first initial signal line 1071 on the base substrate 101 is located at a side of the orthographic projection of the first reset signal line (mentioned when describing FIG. 3) on the base substrate 101 away from the orthographic projection of the second conductive part 1064 on the base substrate 101.

For example, in combination with FIG. 3, FIG. 5B and FIG. 11, the third reset signal line 1072 is connected with the first reset signal line through a via hole, and the orthographic projection of the third reset signal line 1072 on the base substrate 101 overlaps with the orthographic projection of the first active part (included in the subsequent fourth conductive layer), and partial structure of the third reset signal line 1072 is used to form the bottom gate electrode of the first transistor T1. The orthographic projection of the third gate line 1073 on the base substrate 101 overlaps with the orthographic projection of the second active part (included in the subsequent fourth conductive layer) on the base substrate 101, and partial structure of the third gate line 1073 is used to form the bottom gate electrode of the second transistor T2.

For example, in combination with FIG. 3, FIG. 5B and FIG. 11, the first conductive part 1074 includes a main part 1074*a*, and the storage capacitor C also includes a second electrode plate Cst2 opposite to the first electrode plate Cst1, and the main part 1074*a* corresponds to two second electrode plates Cst2. For example, the first conductive part 1074 further includes a bridge part 1074*b* that connects two main parts 1074*a* adjacent in the second direction X, that is, connects two adjacent second electrode plates Cst2, and the first conductive part 1074 further includes a notch 1074*c* between the two second electrode plates Cst2.

For example, in combination with FIG. 3, FIG. 5B and FIG. 11, an orthographic projection of the first conductive layer 102 on the base substrate 101 does not overlap with an orthographic projection of the notch 1074*c* on the base substrate 101, and the orthographic projection of the second conductive layer 103 on the base substrate 101 and the orthographic projection of the notch 1074*c* on the base substrate 101 do not have an overlapping part, so that the notch 1074*c* is not overlapped by the first conductive layer 102 and the second conductive layer 103, so as to improve the pixel transmittance. It should also be noted that the notch 1074*c* is not blocked by any other film layer with light shielding function.

For example, in combination with FIG. 3, FIG. 5B and FIG. 11, the first conductive part 1074 is also formed with an opening 1074*d*, and an orthographic projection of a via hole connected between the gate electrode of the driving transistor T3 and the first connection structure 1021 on the base substrate 101 is within an orthographic projection of the opening 1074*d* on the base substrate 101, so that the conductive structure in the via hole and the first conductive part 1074 are insulated from each other.

Figure 12:
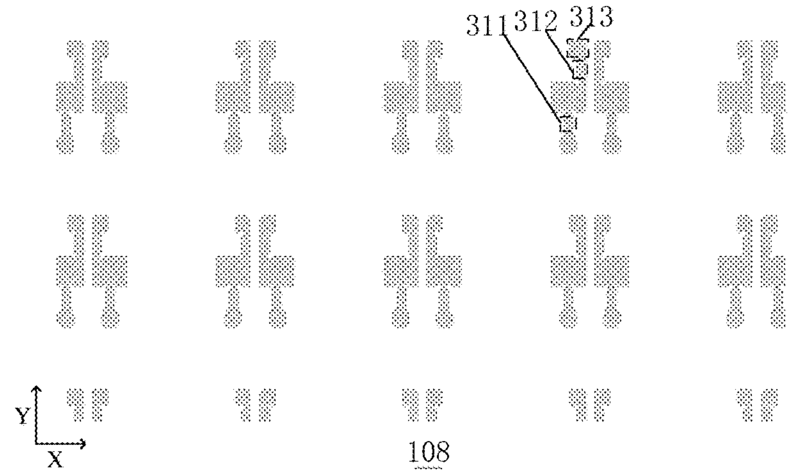
FIG. 12 is a partial structural diagram of the second active layer in the display substrate shown in FIG. 5B.

For example, the display substrate also includes a second active layer. For example, FIG. 12 is a partial structural diagram of the second active layer in the display substrate shown in FIG. 5B. As illustrated by FIG. 5B and FIG. 12, the second active layer 108 is located between the first active layer 105 and the second conductive layer 103. The second active layer 108 may include a first active part 311, a second active part 312 and a twelfth active part 313 which are connected. The first active part 311 forms a channel region of the first transistor T1; the second active part 312 forms a channel region of the second transistor T2; the twelfth active part 313 is connected with an end of the second active part 312 away from the first active part 311, and the first semiconductor layer includes the second active layer 108.

For example, in some examples, as illustrated by FIG. 12, the second active layer 108 may be formed of indium gallium zinc oxide, and correspondingly, the first transistor T1 and the second transistor T2 may be N-type metal oxide thin film transistors.

For example, the first semiconductor layer for forming the channel regions of the first transistor T1 and the second transistor T2 in the pixel circuit 110 may be located at a side of a layer where the active semiconductor pattern of the driving transistor T3 is located away from the base substrate 101, and the first semiconductor layer may include an oxide semiconductor material. For example, in the case where the active layers in the first transistor T1 and the second transistor T2 of the pixel circuit are made of oxide semiconductors, because the transistors made of oxide semiconductor have the characteristics of good hysteresis characteristics, low leakage current and low mobility, the transistors made of oxide semiconductor can be used instead of low temperature polysilicon materials in the transistors to form a low temperature polysilicon-oxide (LTPO) pixel circuit, so as to realize low leakage and improve the stability of the gate voltage of the transistors.

Of course, the embodiment of the present disclosure is not limited to the structure of the second active layer of the pixel circuit as illustrated by FIG. 12. In other examples, the first semiconductor layer of the channel regions of the first transistor T1 and the second transistor T2 may also be located on the same layer as the semiconductor layer of the channel regions of other transistors, that is, the first active layer may also include the channel regions of the first transistor T1, the second transistor T2, the driving transistor T3, the fourth transistor T4, the fifth transistor T5, the sixth transistor T6 and the seventh transistor T7.

For example, in combination with FIG. 5B, FIG. 11 and FIG. 12, an orthographic projection of the third gate line 1073 on the base substrate 101 can cover an orthographic projection of the second active part 312 on the base substrate 101, and a partial structure of the third gate line 1073 can be used to form a bottom gate electrode of the second transistor T2. An orthographic projection of the third reset signal line 1072 on the base substrate 101 can cover an orthographic projection of the first active part 311 on the base substrate 101, and a partial structure of the third reset signal line 1072 can be used to form a bottom gate electrode of the first transistor T1.

Figure 13:
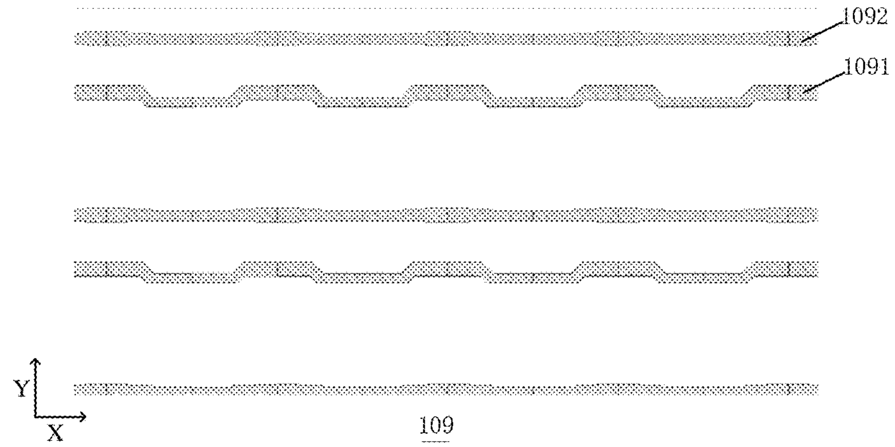
FIG. 13 is a partial structural diagram of the fourth conductive layer in the display substrate shown in FIG. 5B.

For example, the display substrate further includes a fourth conductive layer. For example, FIG. 13 is a partial structural schematic diagram of the fourth conductive layer in the display substrate shown in FIG. 5B. As illustrated by FIG. 5B and FIG. 13, the fourth conductive layer 109 is located between the second active layer 108 and the second conductive layer 103, and the fourth conductive layer 109 includes a first reset signal line 1091 and a first gate line 1092.

For example, in combination with FIG. 3, FIG. 5B, FIG. 12 and FIG. 13, an orthographic projection of the first reset signal line 1091 and an orthographic projection of the first gate line 1092 on the base substrate 101 may all extend along the second direction X. The first reset signal line 1091 can be used to provide the first reset signal terminal in FIG. 3. The orthographic projection of the first reset signal line 1091 on the base substrate 101 overlaps with the orthographic projection of the first active part 311 on the base substrate 101, and a partial structure of the first reset signal line 1091 is configured to form a top gate electrode of the first transistor T1. At the same time, the first reset signal line 1091 may be connected with the third reset signal 1072 through a via hole located in a wiring region at an edge of the display substrate.

For example, in combination with FIG. 3, FIG. 5B, FIG. 11, FIG. 12 and FIG. 13, the first gate line 1092 can be used to provide the first gate driving signal terminal in FIG. 3. An orthographic projection of the first gate line 1092 on the base substrate 101 can cover an orthographic projection of the second active part 312 on the base substrate 101, and a partial structure of the first gate line 1092 can be used to form a top gate electrode of the second transistor T2. At this time, the first gate line 1092 can be connected to the third gate line 1073 through a via hole located in the wiring region at the edge of the display substrate.

For example, in combination with FIG. 5B, FIG. 10 and FIG. 13, in the same pixel circuit, the orthographic projection of the first gate line 1092 on the base substrate 101 is located between the orthographic projection of the second conductive part 1064 on the base substrate 101 and the orthographic projection of the second gate line 1061 on the base substrate 101, and the orthographic projection of the first reset signal line 1091 on the base substrate 101 is located at a side of the orthographic projection of the second gate line 1061 on the base substrate 101 away from the orthographic projection of the second conductive part 1064 on the base substrate 101.

For example, in combination with FIG. 5B, FIG. 10 and FIG. 13, in the same pixel circuit, the orthographic projection of the second conductive part 1064 on the base substrate 101 may be located between the orthographic projection of the first gate line 1092 and the orthographic projection of the light emission control signal line 1062 on the base substrate 101. The orthographic projection of the first reset signal line 1091 on the base substrate 101 may be located at the side where the orthographic projection of the first gate line 1092 on the base substrate 101 is away from the orthographic projection of the second conductive part 1064 on the base substrate 101.

For example, in combination with FIG. 5B, FIG. 10 and FIG. 13, in the same pixel circuit, the orthographic projection of the second gate line 1061 on the base substrate 101 may be located between the orthographic projection of the first gate line 1092 on the base substrate 101 and the orthographic projection of the first reset signal line 1091 on the base substrate 101. The orthographic projection of the second reset signal line 1063 on the base substrate 101 may be located at a side of the orthographic projection of the light emission control signal line 1062 on the base substrate 101 away from the orthographic projection of the second conductive part 1064 on the base substrate 101.

For example, in combination with FIG. 3, FIG. 5B, FIG. 7 and FIG. 11, a plurality of third connection structures 1027 included in the first conductive layer 102 are arranged in one-to-one correspondence with a plurality of the repeating units, and the third connection structure 1027 is connected with the ninth active part 29 included in the first active layer 105 through the first via hole connection H1, and is connected with the bridge part 1074*b* (a part of the first conductive part 1074) included in the conductive film layer 107 through the second via hole connection H2, so as to connect the first electrode of the fifth transistor T5 and the second electrode plate Cst2 of the capacitor C. That is, the third connection structure 1027 includes a first via hole connection part H1 for connecting the ninth active part 29. It should be noted that the embodiment of the present disclosure only marks a part of the via holes.

For example, in combination with FIG. 5B, FIG. 7 and FIG. 8, the sixth connection structure 1028 included in the first conductive layer 102 and the first electrode transfer line 1032 included in the second conductive layer 103 are connected by a third via hole connection H3.

For example, in combination with FIG. 3, FIG. 5B, FIG. 7, FIG. 8, FIG. 9 and FIG. 12, the third connection part 1026 is connected with an eleventh active part 211 through a fourth via hole connection part H4, and the third connection part 1026 is connected with a twelfth active part 313 through a fifth via hole connection part H5, so as to connect the second electrode of the second transistor T2, the first electrode of the sixth transistor T6 and the second electrode of the driving transistor T3.

For example, in combination with FIGS. 3, FIG. 5B, FIG. 7, FIG. 8 and FIG. 12, the first connection structure 1021 connects a part of the second active layer 108 between the first active part 311 and the second active part 312 through a sixth via hole connection H6, and the first connection structure 1021 connects the second conductive part 1064 through a seventh via hole connection H7, so as to connect the first electrode of the second transistor T2 and the gate electrode of the driving transistor T3.

For example, in combination with FIG. 5B, FIG. 10 and FIG. 11, an opening 1074*d* is formed on the first conductive part 1074, and an orthographic projection of a seventh via hole connection part H7 connected between the second conductive part 1064 and the first connection structure 1021 on the base substrate 101 is within the orthographic projection of the opening 1074*d* on the base substrate 101, so that the conductive structure in the seventh via hole connection part H7 is insulated from the first conductive part 1074.

For example, in combination with FIG. 3, FIG. 5B, FIG. 7, FIG. 8, FIG. 11 and FIG. 12, the first connection part 1024 may connect a part of the second active layer at a side of the first active part 311 away from the second active part 312 through an eighth via hole connection part H8, and the first connection part 1024 may connect the first initial signal line 1071 through a ninth via hole connection part H9, so as to connect the second electrode of the first transistor T1 and the first initial signal terminal. For example, in two adjacent repeating units in the second direction X, two adjacent pixel circuits may share the same first connecting part 1024.

For example, in combination with FIG. 3, FIG. 5B, FIG. 7 and FIG. 9, the second connection part 1025 may connect a part of the first active layer 105 located at a side of the fourth active part 24 away from the third active part 23 through a tenth via hole connection part H10, so as to connect the first electrode of the fourth transistor T4.

For example, in combination with FIG. 3, FIG. 5B, FIG. 7, FIG. 8 and FIG. 9, the second initial signal line 1022 can be used to provide the second initial signal terminal in FIG. 3, and the second initial signal line 1022 can connect a part of the first active layer 105 at a side of the seventh active part 27 away from the sixth active part 26 through an eleventh via hole connection part H11 to connect the second electrode of the seventh transistor T7 and the second initial signal terminal Vinit2.

Figure 14:
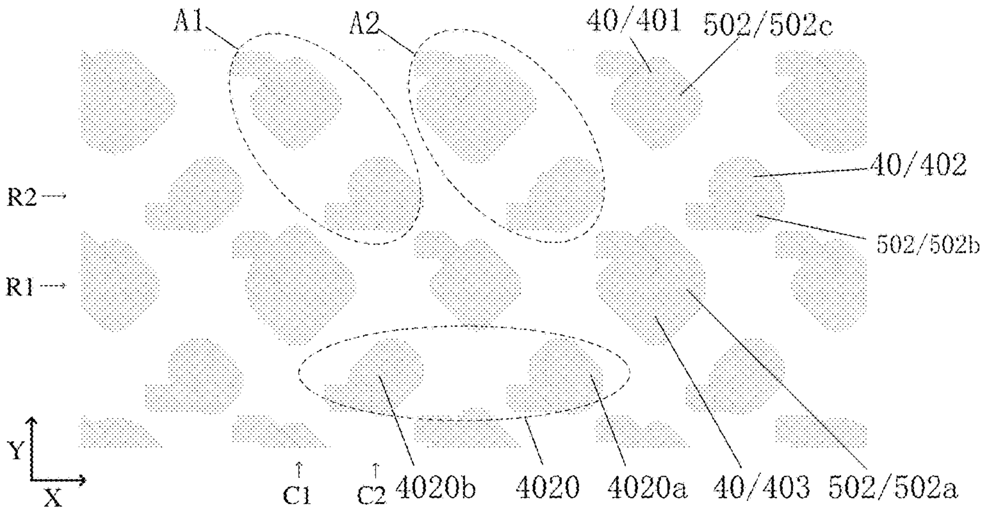
FIG. 14 is a schematic diagram of a partial pixel arrangement structure on a display substrate provided according to an embodiment of the present disclosure.
Figure 15A:
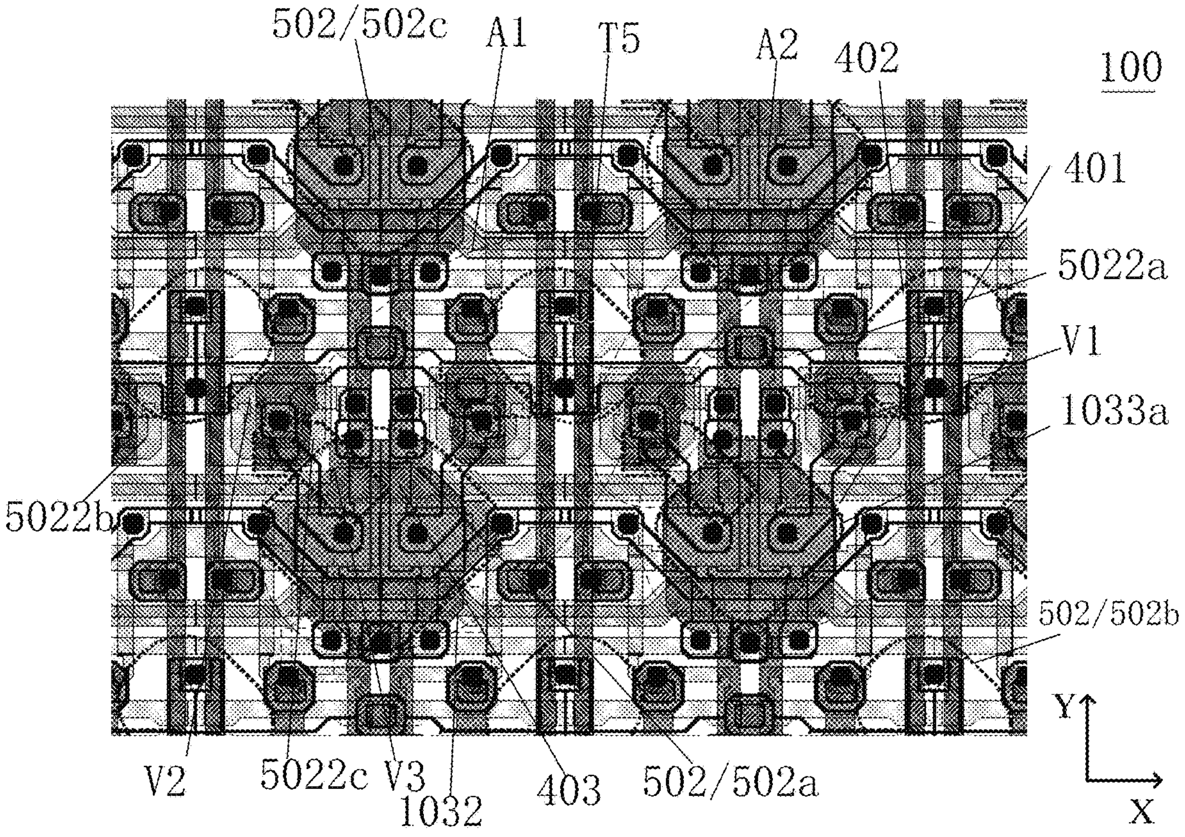
FIG. 15A is a layout diagram of a pixel circuit and a first electrode of the light emitting element in FIG. 5B.
Figure 15B:
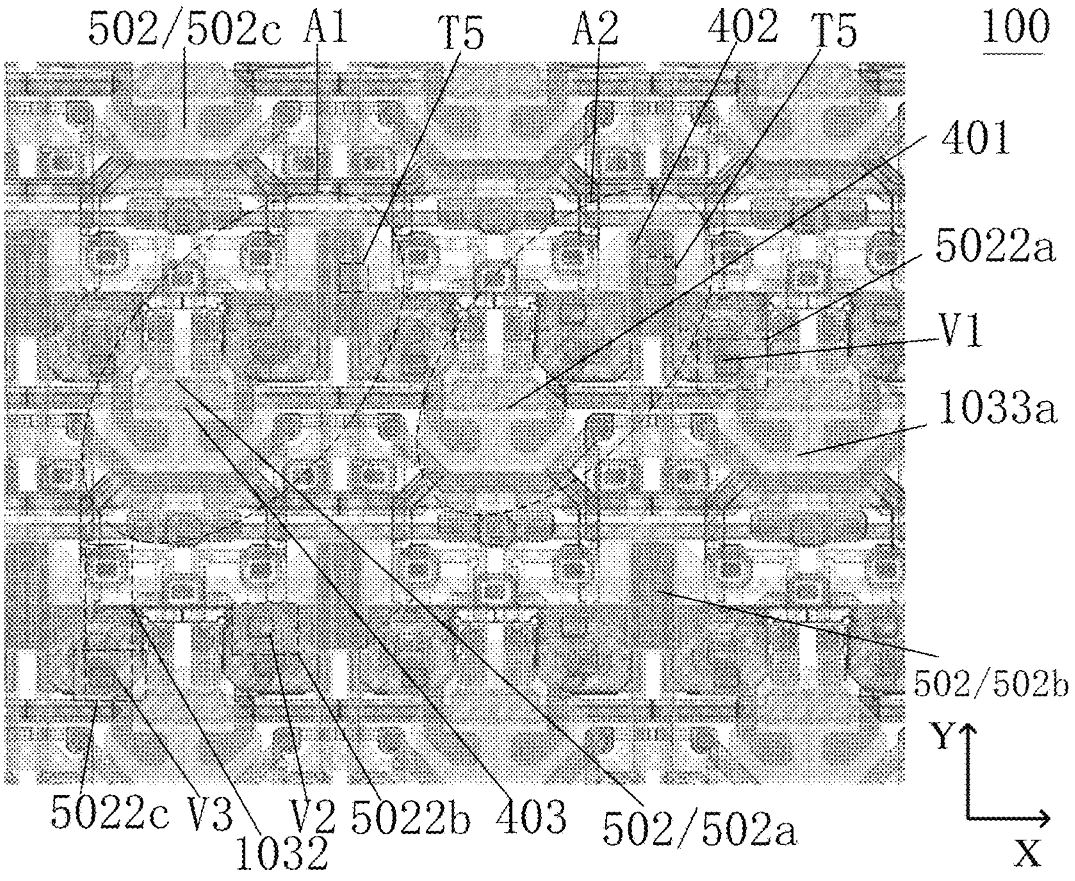
FIG. 15B is another layout diagram of a pixel circuit and a first electrode of the light emitting element in FIG. 5B.

For example, the display substrate further includes a plurality of sub-pixels, and each of the sub-pixels includes the pixel circuit 110 and the light emitting element in any one of the above examples. FIG. 14 is a schematic diagram of a partial pixel arrangement structure on a display substrate provided according to an embodiment of the present disclosure, FIG. 15A is a layout diagram of a pixel circuit and a first electrode of the light emitting element in FIG. 5B, and FIG. 15B is another layout diagram of a pixel circuit and a first electrode of the light emitting element in FIG. 5B. Compared with FIG. 15A, FIG. 15B is additionally provided with a light shielding layer, and other structural settings are the same. For example, as illustrated by FIGS. 14 and 15B, the plurality of sub-pixels 40 includes a plurality of first sub-pixels 401, a plurality of second sub-pixels 402 and a plurality of third sub-pixels 403. For example, one of the first sub-pixel 401 and the third sub-pixel 403 is a red sub-pixel emitting red light, the other of the first sub-pixel 401 and the third sub-pixel 403 is a blue sub-pixel emitting blue light and the second sub-pixel 402 is a green sub-pixel emitting green light.

For example, in one example, the first sub-pixel 401 is a red sub-pixel, the third sub-pixel 403 is a blue sub-pixel, and the second sub-pixel 402 is a green sub-pixel. The light emitting area of the blue sub-pixel is larger than that of the red sub-pixel, and the light emitting area of the red sub-pixel is larger than that of the green sub-pixel.

For example, the names of the first sub-pixel, the second sub-pixel and the third sub-pixel can be interchanged, for example, the first sub-pixel can be a green sub-pixel, the second sub-pixel can be a blue sub-pixel and the third sub-pixel can be a red sub-pixel; Alternatively, the first sub-pixel may be a blue sub-pixel, the second sub-pixel may be a red sub-pixel, and the third sub-pixel may be a green sub-pixel. The embodiments of the present disclosure are not limited thereto.

For example, as illustrated by FIG. 14, a plurality of first sub-pixels 401 and a plurality of third sub-pixels 403 are alternately arranged along the second direction X and the first direction Y to form a plurality of first pixel rows R1 and a plurality of first pixel columns C1, and a plurality of second sub-pixels 402 are arranged in an array along the second direction X and the first direction Y to form a plurality of second pixel rows R2 and a plurality of second pixel columns C2. The plurality of first pixel rows R1 and the plurality of second pixel rows R2 are alternately arranged along the first direction Y and staggered in the second direction X. The plurality of first pixel columns C1 and the plurality of second pixel columns C2 are alternately arranged along the second direction X and staggered in the first direction Y, and the second direction X intersects with the first direction Y. For example, the second direction X and the first direction Y may be perpendicular to each other. For example, the second direction X and the first direction Y may be interchanged.

For example, as illustrated by FIG. 14, one second pixel row R2 includes a plurality of second sub-pixel pairs 4020 arranged along the second direction X. Two second sub-pixels 402 in a second sub-pixel pair 4020 are respectively a first pixel block 4020*a* and a second pixel block 4020*b*, and the first pixel block 4020*a* and the second pixel block 4020*b* are alternately arranged along the second direction X. For example, the first pixel blocks 4020*a* and the second pixel blocks 4020*b* in a second pixel column C2 are alternately arranged along the first direction Y.

For example, as illustrated by FIG. 14, at least two second pixel rows R2 include a plurality of second sub-pixel pairs 4020 arranged along the second direction X. Two second sub-pixels 402 in the at least two second sub-pixel pairs 4020 are a first pixel block 4020*a* and a second pixel block 4020*b*, respectively, and the first pixel block 4020*a* and the second pixel block 4020*b* are alternately arranged along the second direction X. For example, first pixel blocks 4020*a* and second pixel blocks 4020*b* in at least two second pixel columns C2 are alternately arranged along the first direction Y.

For example, as illustrated by FIG. 14, each second pixel row R2 includes a plurality of second sub-pixel pairs 4020 arranged along the second direction X. Two second sub-pixels 402 in each second sub-pixel pair 4020 are a first pixel block 4020*a* and a second pixel block 4020*b*, respectively, and the first pixel block 4020*a* and the second pixel block 4020*b* are alternately arranged along the second direction X. For example, the first pixel blocks 4020*a* and the second pixel blocks 4020*b* in each second pixel column C2 are alternately arranged along the first direction Y.

For example, as illustrated by FIG. 14, a plurality of sub-pixels 40 include a plurality of minimum repeating units A, and one minimum repeating unit A includes one first sub-pixel 401, one first pixel block 4020*a*, one second pixel block 4020*b* and one third sub-pixel 403. For example, at least two minimum repeating units A include one first sub-pixel 401, one first pixel block 4020*a*, one second pixel block 4020*b* and one third sub-pixel 403. For example, each minimum repeating unit A includes one first sub-pixel 401, one first pixel block 4020*a*, one second pixel block 4020*b*, and one third sub-pixel 403. For example, each minimum repeating unit A includes two rows and four columns of sub-pixels 40.

For example, as illustrated by FIG. 14, in one minimum repeating unit A, the first pixel block 4020*a* and the first sub-pixel 401 constitute a first pixel unit A1, and the second pixel block 4020*b* and the third sub-pixel 403 constitute a second pixel unit A2. For example, in at least two minimum repeating units A, the first pixel block 4020*a* and the first sub-pixel 401 constitute a first pixel unit A1, and the second pixel block 4020*b* and the third sub-pixel 403 constitute a second pixel unit A2. For example, in each minimum repeating unit A, the first pixel block 4020*a* and the first sub-pixel 401 constitute a first pixel unit A1, and the second pixel block 4020*b* and the third sub-pixel 403 constitute a second pixel unit A2.

The first pixel unit A1 and the second pixel unit A2 as mentioned above are not pixels in the strict sense, that is, a pixel defined by a complete first sub-pixel, a second sub-pixel and a third sub-pixel. The minimum repeating unit here refers to that the pixel arrangement structure can include a plurality of repeating units.

Figure 16:
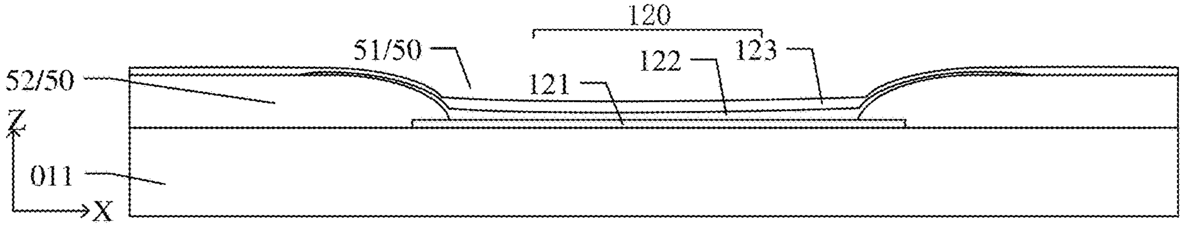
FIG. 16 is a schematic cross-sectional view of a display substrate provided by an embodiment of the present disclosure.

For example, FIG. 16 is a schematic cross-sectional structure diagram of a display substrate provided by an embodiment of the present disclosure. As illustrated by FIG. 14 to FIG. 16, the display substrate 100 includes a base substrate 101 and a plurality of sub-pixels 40 located on the base substrate 101. At least part of the sub-pixel 40 includes a light emitting element 120 and a pixel circuit 110. The light emitting element 120 includes a light emitting functional layer 122 and a first electrode 121 and a second electrode 123 located on both sides of the light emitting functional layer 122 along the direction perpendicular to the base substrate 101. The first electrode 121 is located between the light emitting functional layer 122 and the base substrate 101.

For example, as illustrated by FIG. 16, the display substrate 100 further includes a pixel defining pattern 50, the direction perpendicular to a main surface of the base substrate 101 is a third direction Z, which is perpendicular to the plane where the first direction Y and the second direction X are located, and the pixel defining pattern 50 is located at a side of the first electrode 121 of the light emitting element 120 away from the base substrate 101, and the pixel defining pattern 50 includes a plurality of pixel openings 51 and a plurality of defining parts 52 surrounding the plurality of pixel openings 51. FIG. 16 schematically shows that the side of the first electrode 121 of the light emitting element 120 away from the second electrode 123 is provided with a structural layer 011, and the structural layer 011 includes the base substrate 101, a layer where the active semiconductor pattern layer is located, a layer where the gate line is located, a layer where the data line is located and a plurality of insulating layers.

For example, the defining part 52 is a structure defining the pixel opening 51. For example, the material of the defining part 52 may include polyimide, acrylic or polyethylene terephthalate.

For example, the pixel opening 51 of the pixel defining pattern 50 is configured to define the light emitting region 124 of the light emitting element 120. For example, the light emitting elements 120 of a plurality of sub-pixels 40 may be arranged in one-to-one correspondence with a plurality of pixel openings 51. For example, the light emitting element 120 may include a part located in the pixel opening 51 and a part overlapping the defining part 52 in a direction perpendicular to the base substrate 101.

For example, the pixel opening 51 of the pixel defining pattern 50 is configured to expose the first electrode 121 of the light emitting element 120, and the exposed first electrode 121 at least partially contacts the light emitting functional layer 122 in the light emitting element 120. For example, at least part of the first electrode 121 is located between the defining part 52 and the base substrate 101. For example, in the case where the light emitting functional layer 122 is located in the pixel opening 51 of the pixel defining pattern 50, the first electrode 121 and the second electrode 123 located at both sides of the light emitting functional layer 122 can drive the light emitting functional layer 122 in the pixel opening 51 of the pixel defining pattern 50 to emit light. For example, a light emitting region 124 may refer to an effective light emitting region of the light emitting element 120, and the shape of the light emitting region 124 refers to a two-dimensional shape. For example, the shape of the light emitting region 124 may be the same as the shape of the pixel opening 51 of the pixel defining pattern 50. For example, the pixel opening 51 of the pixel defining pattern 50 may have a small size close to the base substrate 101 and a large size away from the base substrate 101. For example, the shape of the light emitting region 124 may be approximately the same as the size and shape of the pixel opening 51 of the pixel defining pattern 50 at the side close to the base substrate 101.

For example, the first electrode 121 may be an anode and the second electrode 123 may be a cathode. For example, the cathode can be made of a material with high conductivity and low work function, and for example, the cathode can be made of a metal material. For example, the anode may be formed of a conductive material having a high work function.

For example, the direction indicated by the arrow of the first direction Y is upward, and the direction indicated by the arrow of the second direction X is right. The first pixel block 4020*a* in the first pixel unit A1 is located at the lower right of the first sub-pixel 401, and the second pixel block 4020*b* in the second pixel unit A2 is located at the lower right of the third sub-pixel 403. In the first pixel unit and the second pixel unit of the display substrate provided by the embodiment of the present disclosure, the pixel space and design are optimized by changing the first sub-pixel and the third sub-pixel to borrow the second sub-pixel in different positions, so as to improve the flatness of the first electrode of the light emitting element and optimize the pixel space structure, and further reduce the bottom frame.

For example, as illustrated by FIG. 14 to FIG. 16, a first sub-pixel 401 can form a first pixel unit with a second sub-pixel 402 located at the upper right or a second sub-pixel 402 located at the lower right; similarly, a third sub-pixel 403 can form a second pixel unit with the second sub-pixel 402 located at the upper right or the second sub-pixel 402 located at the lower right. In the embodiment of the present disclosure, in the first sub-pixel 401, the fifth transistor T5 is located in the light emitting region, and the first sub-pixel 401 and the second sub-pixel 402 located at the upper right of the first sub-pixel 401 form a first pixel unit, which can facilitate the design of the pixel circuit, reduce the possibility of influencing the flatness of the pixel by changing the shape of the pad playing a planarization role in the second conductive layer, and help prevent the occurrence of color shift. In addition, the influence on the capacitance of the node corresponding to the first electrode of the light emitting element can be reduced, for example, to prevent the image quality at low gray scale from being affected. If the capacitance is larger here, the capacitance of the node corresponding to the first electrode of the light emitting element needs to be filled first at low gray scale, resulting in a decrease in the voltage charged at the node at low gray scale, so that the time for the pixel to light up will be longer (response time), which will further affect the image quality. Similarly, in the third sub-pixel 403, the fifth transistor T5 is located in the light emitting region, and the third sub-pixel 403 forms a second pixel unit with the second sub-pixel 402 located at the upper right of the third sub-pixel 403, which can facilitate the pixel circuit design.

For example, as illustrated by FIG. 5A, FIG. 5B and FIG. 15, along the second direction X, two data lines 1031 are respectively arranged on both sides of the first sub-pixel 401. For example, two data lines 1031 are arranged between adjacent the first sub-pixel 401 and the third sub-pixel 403 arranged in the second direction X.

For example, the layer structure shown in FIG. 14 can also be a first electrode layer 501 included in the display substrate, the first electrode layer 501 is located at a side of the second conductive layer 103 away from the base substrate 101, and the first electrode layer 501 includes a plurality of electrode parts 502, each of the electrode parts 502 includes a main part 5021 and a supplement part 5022 which are connected. An orthographic projection of the supplement part 5022 on the base substrate 101 at least partially overlaps with an orthographic projection of the first electrode transfer line 1032 on the base substrate 101, and each of the electrode parts 502 corresponds to one of the first sub-pixel 401, the first pixel block 4020*a*, the second pixel block 4020*b* and the third sub-pixel 403. The supplement part 5022 is arranged on the electrode part 502 to increase the overlapping area between the electrode part 502 and the second conductive layer 103, thereby increasing the self capacitance of the electrode part of the light emitting unit, and further prolonging the charging time of the light emitting unit before it emits light. In the embodiment of the present disclosure, the period when the current output of the driving transistor T3 is unstable can be completely or at least partially located in the charging time of the light emitting unit, that is, this setting can reduce the time when the light emitting unit emits light in the period when the current output of the driving transistor T3 is unstable, so that this setting can alleviate the flicker problem during the operation of the display substrate.

For example, as illustrated by FIG. 14, the plurality of electrode parts 502 include a first electrode part 502*a*, a second electrode part 502*b* and a third electrode part 502*c* with three different colors, the first electrode part 502*a* corresponds to the first sub-pixel 401, the second electrode part 502*b* corresponds to any one of the first pixel block 4020*a* and the second pixel block 4020*b*, and the third electrode part 502*c* corresponds to the third sub-pixel 403.

For example, in combination with FIG. 14 and FIG. 15B, in the first direction Y, the first electrode part 502*a* and the third electrode part 502*c* cover a block-shaped part 1033*a* included in the first power signal line 1033, and the second electrode part 502*b* covers part of the data line 1031 and part of the first electrode transfer line 1032. And an orthographic projection of the second electrode part 502*b* on the base substrate 101 is limited between orthographic projections of two adjacent first electrode transfer lines 1032 on the base substrate 101, so the orthographic projection of the second electrode part 502*b* on the base substrate 101 and the orthographic projection of the first power signal line 1033 on the base substrate 101 do not have an overlapping part. The overlapping area between the orthographic projection of the first electrode part 502*a* and the orthographic projection of the first power signal line 1033 on the base substrate 101 is larger than the overlapping area between the orthographic projection of the second electrode part 502*b* and the orthographic projection of the first power signal line 1033, and larger than the overlapping area of the orthographic projection of third electrode part 502*c* and the orthographic projection of first power signal line 1033 on the base substrate 101.

For example, in combination with FIG. 14 and FIG. 15B, the overlapping area of the orthographic projection of the third electrode part 502*c* and the orthographic projection of the first power signal line 1033 on the base substrate 101 is also larger than the overlapping area of the orthographic projection of the second electrode part 502*b* and the orthographic projection of the first power signal line 1033 on the base substrate 101.

For example, in combination with FIG. 14 and FIG. 15B, the orthographic projection of the supplement part 5022 of each of the electrode parts 502 on the base substrate 101 at least partially overlaps with the orthographic projection of the second conductive layer 103 on the base substrate 101, and the supplement part 5022 is electrically connected with the second conductive layer 103 through a corresponding via hole. For example, the supplement part 5022*a* of the first electrode part 502*a* is connected with the first electrode transfer line 1032 through the first via hole V1. The supplement part 5022*b* of the second electrode part 502*b* is connected with the first electrode transfer line 1032 through a second via hole V2. The supplement part 5022*c* of the third electrode part 502*c* is connected with the first electrode transfer line 1032 through a third via hole V3.

For example, in combination with FIGS. 14 and 15B, the first electrode part 502*a* corresponds to a blue sub-pixel emitting blue light, the second electrode part 502*b* corresponds to a green sub-pixel emitting green light, and the third electrode part 502*c* corresponds to a red sub-pixel emitting red light.

Figure 17:
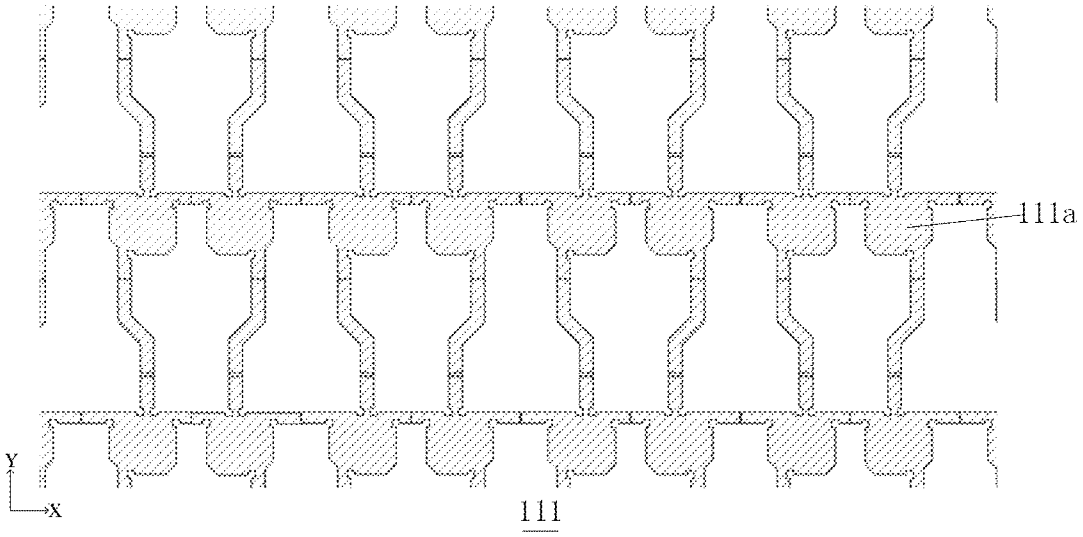
FIG. 17 is a partial structural schematic diagram of a light shielding layer in the display substrate shown in FIG. 5B and FIG. 15B.

For example, the display substrate further includes a light shielding layer. For example, FIG. 17 is a partial structural schematic diagram of a light shielding layer in the display substrate shown in FIG. 5B and FIG. 15B. As illustrated by FIG. 17, the light shielding layer 111 may include a plurality of light shielding parts 111*a* distributed in the second direction X and the first direction Y, and adjacent light shielding parts 111*a* in the second direction X are connected with each other, and connection lines connecting adjacent light shielding parts 111*a* are located on the same straight line, and the extending directions of the connection lines are parallel or approximately parallel. Two adjacent light shielding parts 111*a* in the first direction Y are also connected with each other, and the light shielding layer 111 may be a conductor structure, for example, the light shielding layer 111 may be a light shielding metal layer.

For example, as illustrated by FIG. 3, FIG. 5B, FIG. 15B and FIG. 17, the light shielding layer 111 can be connected with a stable power supply terminal, for example, the light shielding layer 111 can be connected with the first power supply terminal, the first initial signal terminal and the second initial signal terminal in FIG. 3, and the light shielding layer 111 can stabilize the voltage of the second conductive part 1064, thereby reducing the voltage fluctuation of the gate electrode of the driving transistor T3 in the light emitting stage.

Figure 18:
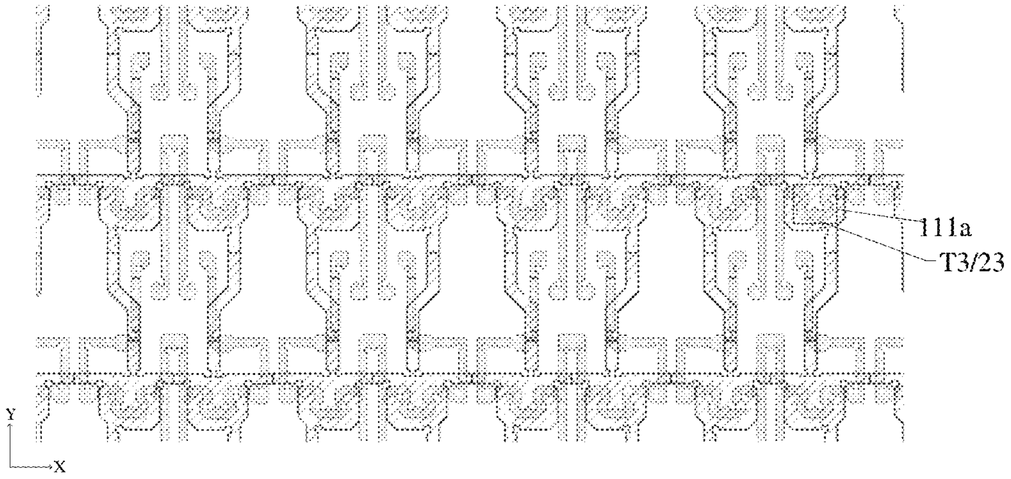
FIG. 18 is a layout diagram of a stack of a light shielding layer and a first active layer provided by an embodiment of the present disclosure.

For example, as illustrated by FIG. 18, the light shielding layer 111 can cover the orthographic projection of the third active part 23 on the base substrate 101, and the light shielding layer 111 can reduce the influence of illumination on the characteristics of the driving transistor T3.

Figure 19:
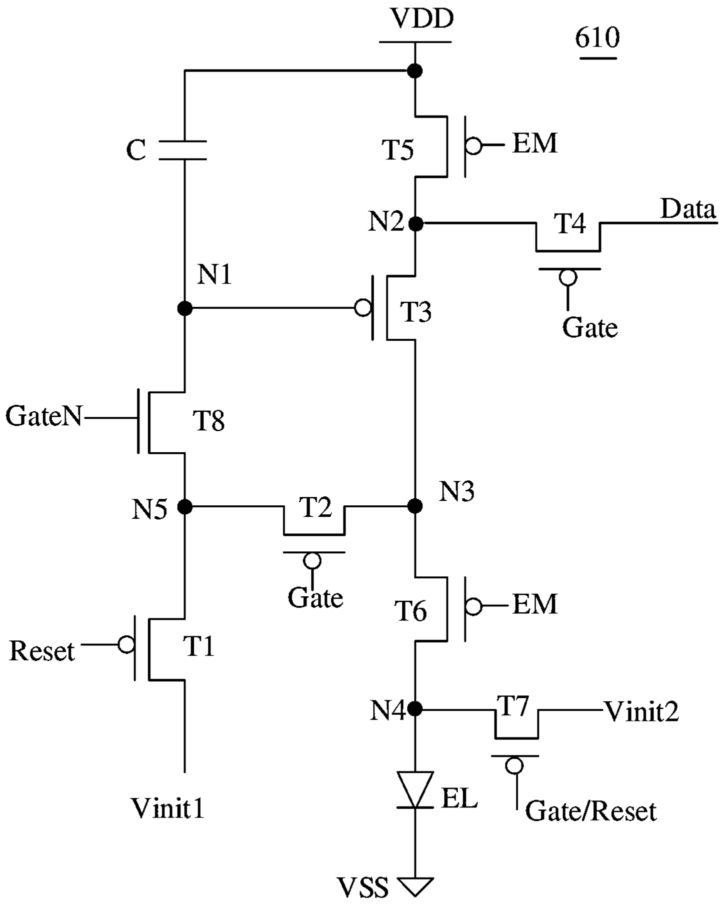
FIG. 19 is a schematic circuit structure diagram of another pixel circuit provided by an embodiment of the present disclosure.

For example, FIG. 19 is a schematic circuit structure diagram of another pixel circuit provided by an embodiment of the present disclosure. As illustrated by FIG. 19, the pixel circuit 610 includes a first transistor T1, a second transistor T2, a third transistor (driving transistor) T3, a fourth transistor T4, a fifth transistor T5, a sixth transistor T6, a seventh transistor T7, an eighth transistor T8 and a storage capacitor C. That is, the pixel circuit 610 may include eight transistors (the first transistor T1 to the eighth transistor T8), a storage capacitor C and a plurality of signal lines (data line Data, first scanning signal line Gate, second scanning signal line GateN, reset control signal line Reset, first initial signal line Vinit1, second initial signal line Vinit2, first power line VDD, second power line VSS and light emission control signal line EM).

For example, as illustrated by FIG. 19, the gate electrode of the first transistor T1 is connected with the reset control signal line Reset, the first electrode of the first transistor T1 is connected with the first initial signal line Vinit1, and the second electrode of the first transistor T1 is connected with the N5 node. The gate electrode of the second transistor T2 is connected with the first scanning signal line Gate, the first electrode of the second transistor T2 is connected with the N5 node, and the second electrode of the second transistor T2 is connected with the N3 node. The gate electrode of the driving transistor T3 is connected with the N1 node, the first electrode of the driving transistor T3 is connected with the N2 node, and the second electrode of the driving transistor T3 is connected with the N3 node. The gate electrode of the fourth transistor T4 is connected with the first scanning signal line Gate, the first electrode of the fourth transistor T4 is connected with the data line Data, and the second electrode of the fourth transistor T4 is connected with the N2 node. The gate electrode of the fifth transistor T5 is connected with the light emission control signal line EM, the first electrode of the fifth transistor T5 is connected with the first power supply line VDD, and the second electrode of the fifth transistor T5 is connected with the N2 node. The gate electrode of the sixth transistor T6 is connected with the light emission control signal line EM, the first electrode of the sixth transistor T6 is connected with the N3 node, and the second electrode of the sixth transistor T6 is connected with the N4 node (that is, the first electrode of the light emitting element). The gate electrode of the seventh transistor T7 is connected with the first scanning signal line Gate or the reset control signal line Reset, the first electrode of the seventh transistor T7 is connected with the second initial signal line Vinit2, and the second electrode of the seventh transistor T7 is connected with the N4 node. The gate electrode of the eighth transistor T8 is connected with the second scanning signal line GateN, the first electrode of the eighth transistor T8 is connected with the N5 node, and the second electrode of the eighth transistor T8 is connected with the N1 node. A first terminal of the storage capacitor C is connected with the first power supply line VDD, and a second terminal of the storage capacitor C is connected with the N1 node.

Specifically, the gate electrode of the first transistor T1 is connected with the reset control signal line, the first electrode of the first transistor T1 is connected with the first initial signal line, and the second electrode of the first transistor T1 is connected with the first electrode of the eighth transistor T8 and the first electrode of the second transistor T2. The gate electrode of the second transistor T2 is connected with the first scanning signal line, and the second electrode of the second transistor T2 is connected with the second electrode of the driving transistor T3 and the first electrode of the sixth transistor T6. The gate electrode of the driving transistor T3 is connected with the second electrode of the eighth transistor T8 and the first electrode plate Cst1 of the storage capacitor C, the first electrode of the driving transistor T3 is connected with the second electrode of the fourth transistor T4 and the second electrode of the fifth transistor T5, and the second electrode of the driving transistor T3 is connected with the second electrode of the second transistor T2 and the first electrode of the sixth transistor T6. The gate electrode of the fourth transistor T4 is connected with the first scanning signal line, the first electrode of the fourth transistor T4 is connected with the data line Data, and the second electrode of the fourth transistor T4 is connected with the first electrode of the driving transistor T3 and the second electrode of the fifth transistor T5. The gate electrode of the fifth transistor T5 is connected with the first light emission control signal line, the first electrode of the fifth transistor is connected with the first power signal line and the second electrode plate Cst2 of the storage capacitor C, and the second electrode of the fifth transistor T5 is connected with the second electrode of the fourth transistor T4 and the first electrode of the driving transistor T3. The gate electrode of the sixth transistor T6 is connected with the first light emission control signal line, the first electrode of the sixth transistor T6 is connected with the second electrode of the driving transistor T3 and the second electrode of the second transistor T2, and the second electrode of the sixth transistor T6 is connected with the first electrode of the light emitting element and the second electrode of the seventh transistor T7; the gate electrode of the seventh transistor T7 is connected with the first scanning signal line or the reset control signal line, the first electrode of the seventh transistor T7 is connected with the second initial signal line, and the second electrode of the seventh transistor T7 and the second electrode of the sixth transistor T6 are connected with the first electrode of the light emitting element; the gate electrode of the eighth transistor T8 is connected with the second scanning signal line, the first electrode of the eighth transistor T8 is connected with the second electrode of the first transistor T1 and the first electrode of the second transistor T2, and the second electrode of the eighth transistor T8 is connected with the gate electrode of the driving transistor T3 and the first electrode plate Cst1 of the storage capacitor C; the first electrode plate Cst1 of the storage capacitor C is connected with the gate electrode of the driving transistor T3 and the second electrode of the eighth transistor T8, and the second electrode plate Cst2 of the storage capacitor C is connected with the first power signal line.

For example, in some exemplary embodiments, the first transistor T1 to the seventh transistors T7 may be N-type thin film transistors, and the eighth transistor T8 may be a P-type thin film transistor; alternatively, the first transistor T1 to the seventh transistors T7 may be P-type thin film transistors, and the eighth transistor T8 may be an N-type thin film transistor.

For example, in some exemplary embodiments, the first transistor T1 to the seventh transistors T7 may be low temperature poly silicon (LTPS) thin film transistors, and the eighth transistor T8 may be an indium gallium zinc oxide (IGZO) thin film transistor.

For example, compared with the low temperature polysilicon thin film transistor, the indium gallium zinc oxide thin film transistor generates less leakage current. Therefore, setting the eighth transistor T8 as the indium gallium zinc oxide thin film transistor can significantly reduce the generation of leakage current, thus improving the problem of low-frequency and low-brightness flicker of the display substrate. The first transistor T1 and the second transistor T2 do not need to be set as indium gallium zinc oxide thin film transistors, and because the dimensions of low temperature polysilicon thin film transistors are generally smaller than those of indium gallium zinc oxide thin film transistors, the occupied space of the pixel circuit in the embodiment of the present disclosure will be relatively small, which is beneficial to improving the resolution of the subsequent display panel.

For example, the pixel circuit shown in FIG. 19 has both good switching characteristics of LTPS-TFT and low leakage characteristics of Oxide-TFT, which can realize low-frequency driving (1 Hz-60 Hz) and greatly reduce the power consumption of the display substrate.

For example, the display substrate further includes a light emitting element EL, and the second electrode of the light emitting element EL is connected with a second power supply line VSS, and the signal of the second power supply line VSS is to continuously provide a low-level signal, and the signal of the first power supply line VDD is to continuously provide a high-level signal. The signal of the first scanning signal line Gate is the scanning signal in the pixel circuits of the preset display row, and the signal of the reset control signal line Reset is the scanning signal in the pixel circuit of the previous display row, that is, for the n-th display row, the first scanning signal line Gate is Gate(n) and the reset control signal line Reset is Gate(n−1), and the signal of the reset control signal line Reset of the present display row and the signal of the first scanning signal line Gate in the pixel circuit of the previous display row can be the same, so as to reduce the signal lines on the display substrate, to implement narrow borders for display substrates.

For example, in some exemplary embodiments, the first scanning signal line Gate, the second scanning signal line GateN, the reset control signal line Reset, the light emission control signal line EM, the first initial signal line Vinit1 and the second initial signal line Vinit2 all extend in the horizontal direction, and the second power line VSS, the first power line VDD and the data line Data all extend in the vertical direction.

For example, in some exemplary embodiments, the light emitting element 620 may be an organic electroluminescent diode (OLED) including a first electrode (anode), an organic light emitting layer and a second electrode (cathode) which are stacked.

Figure 20:
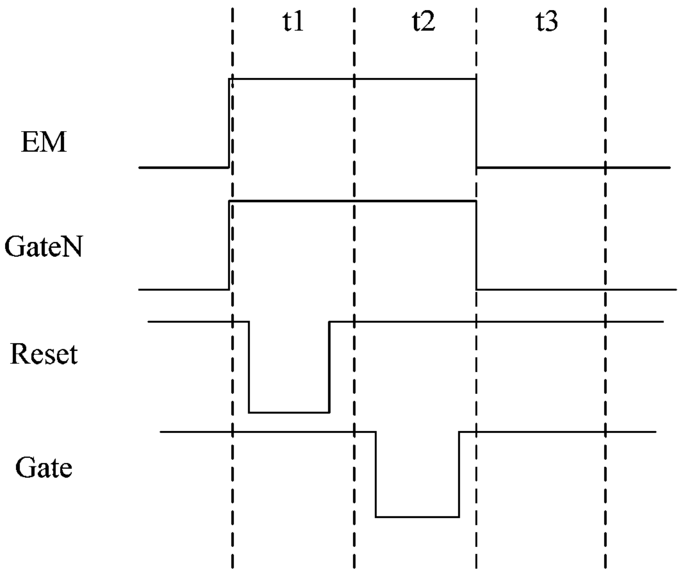
FIG. 20 is a timing chart of each node in a driving method of the pixel circuit in FIG. 19.

For example, FIG. 20 is a timing diagram of each node in a driving method of the pixel circuit in FIG. 19. Hereinafter, an exemplary embodiment of the present disclosure will be explained through the working process of the pixel circuit illustrated in FIG. 20. The pixel circuit in FIG. 19 includes eight transistors (first transistor T1 to eighth transistor T8) and a storage capacitor C, and the first transistor T1 to seventh transistor T7 are P-type transistors, the eighth transistor T8 is an N-type transistor, and the gate electrode of the seventh transistor T7 is connected with the first scanning signal line Gate as an example.

For example, in combination with FIG. 19 and FIG. 20, the working process of the pixel circuit may include:

In the first stage t1, which is called a reset stage, the signals of the first scanning signal line Gate, the reset control signal line Reset, the second scanning signal line GateN and the light emission control signal line EM are all high-level signals, and the signal of the reset control signal line Reset is a low-level signal. The high-level signal of the light emission control signal line EM turns off the fifth transistor T5 and the sixth transistor T6, the high-level signal of the second scanning signal line GateN turns on the eighth transistor T8, and the low-level signal of the reset control signal line Reset turns on the first transistor T1, so the voltage of the N1 node is reset to the first initial voltage Vinit1 provided by the first initial signal line Vinit1, and then the electric potential of the reset control signal line Reset is high, and the first transistor T1 is turned off. Because the fifth transistor T5 and the sixth transistor T6 are turned off, the light emitting element EL does not emit light at this stage.

In the second stage t2, which is called a data writing stage, the signal of the first scanning signal line Gate is a low-level signal, the fourth transistor T4, the second transistor T2 and the seventh transistor T7 are turned on, the data line Data outputs a data voltage, and the voltage of the N4 node is reset to the second initial voltage Vinit2 provided by the second initial signal line Vinit2, thus completing initialization. At this stage, because the N1 node is at a low-level, the third transistor T3 is turned on. The fourth transistor T4 and the second transistor T2 are turned on, so that the data voltage output by the data line Data is supplied to the N1 node through the turned-on fourth transistor T4, the N2 node, the turned-on third transistor T3, the N3 node, the turned-on second transistor T2, the N5 node and the eighth transistor T8, and the sum of the data voltage output by the data line Data and the threshold voltage of the third transistor T3 is charged into the storage capacitor C, and the voltage of the second terminal (N1 node) of the storage capacitor C is Vdata+Vth, Vdata is the data voltage output by the data line Data, and Vth is the threshold voltage of the driving transistor T3. The signal of the light emission control signal line EM is a high-level signal, and the fifth transistor T5 and the sixth transistor T6 are turned off to ensure that the light emitting element EL does not emit light.

In the third stage t3, which is called a light emitting stage, the signals of the first scanning signal line Gate and the reset control signal line Reset are high-level signals, and the signals of the light emitting control signal line EM and the second scanning signal line GateN are low-level signals. The high-level signal of the reset control signal line Reset turns off the seventh transistor T7, and the low-level signal of the emission control signal line EM turns on the fifth transistor T5 and the sixth transistor T6. The power supply voltage output by the first power supply line VDD provides a driving voltage to the first electrode (i.e. the N4 node) of the light emitting element EL through the turned-on fifth transistor T5, the turned-on third transistor T3 and the turned-on sixth transistor T6, and drives the light emitting element EL to emit light.

For example, in the pixel circuit shown in FIG. 19, by initializing the N4 node to the signal of the second initial signal line Vinit2 and initializing the N5 node to the signal of the first initial signal line Vinit1, the reset voltage of the light emitting element EL and the reset voltage of the N1 node can be adjusted respectively, thereby achieving better display effect and improving problems such as low-frequency flicker.

It should be noted that, in the embodiment of the present disclosure, each pixel circuit can be an 8T1C (i.e., eight transistors and one capacitor) structure as illustrated by FIG. 19, but also a structure including other transistors, such as 7T2C structure, 6T1C structure, 6T2C structure, 7T1C structure or 9T2C structure, which is not limited in the embodiment of the present disclosure.

For example, the display substrate includes a plurality of repeating units distributed along the first direction and the second direction which cross with each other, and each of the repeating units includes two pixel circuits, and the two pixel circuits include a first pixel circuit and a second pixel circuit distributed along the second direction, and the first pixel circuit and the second pixel circuit are roughly arranged in mirror symmetry, and the pixel circuit described below is described by one of the first pixel circuit and the second pixel circuit.

Figure 21A:
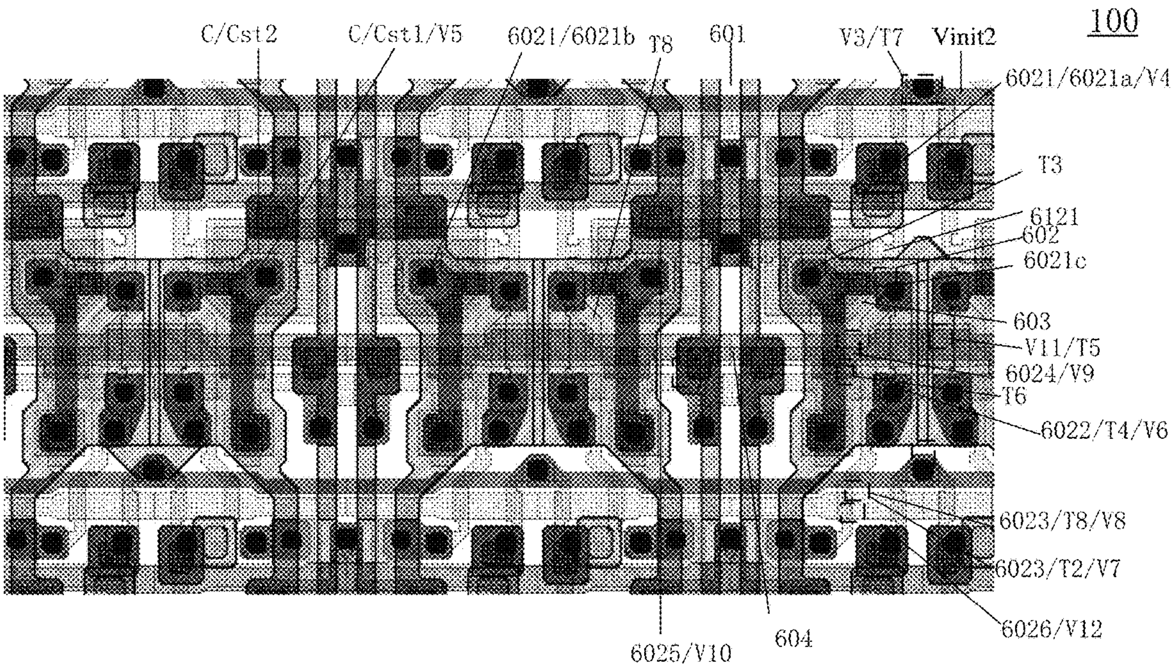
FIG. 21A is a structural layout diagram of another display substrate provided by an embodiment of the present disclosure.
Figure 21B:
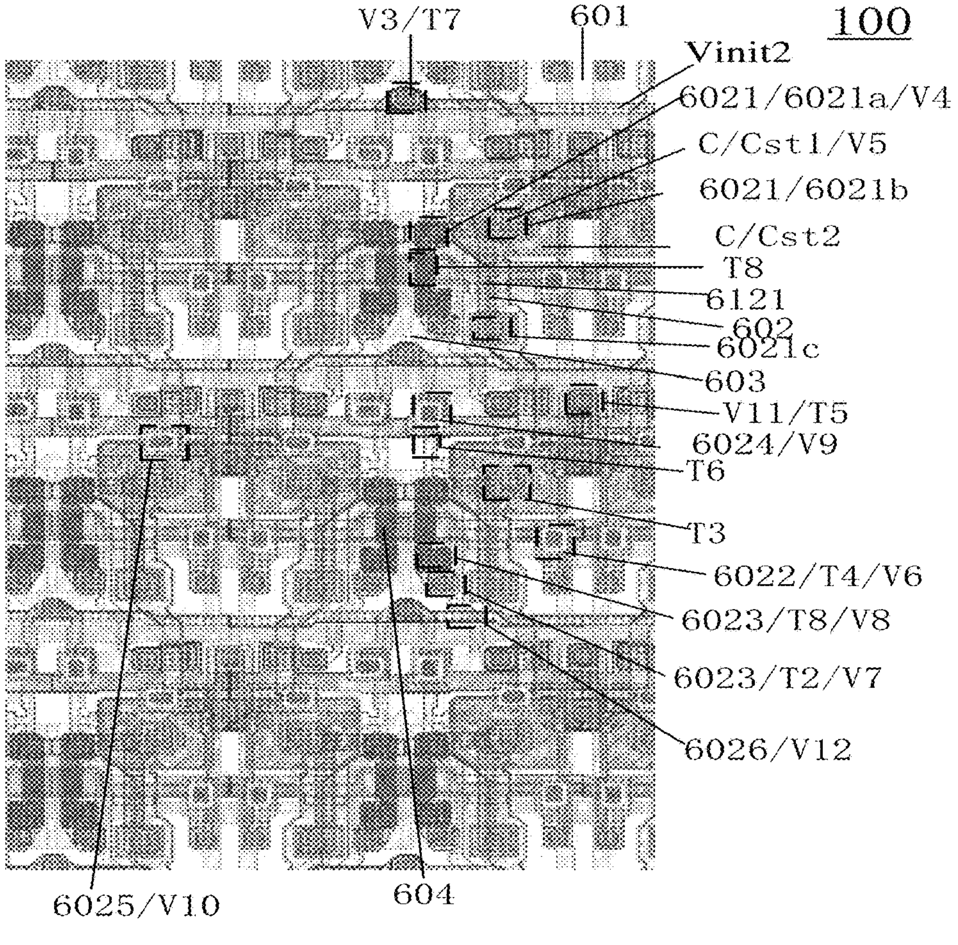
FIG. 21B is a structural layout diagram of another display substrate provided by an embodiment of the present disclosure.
Figure 22:
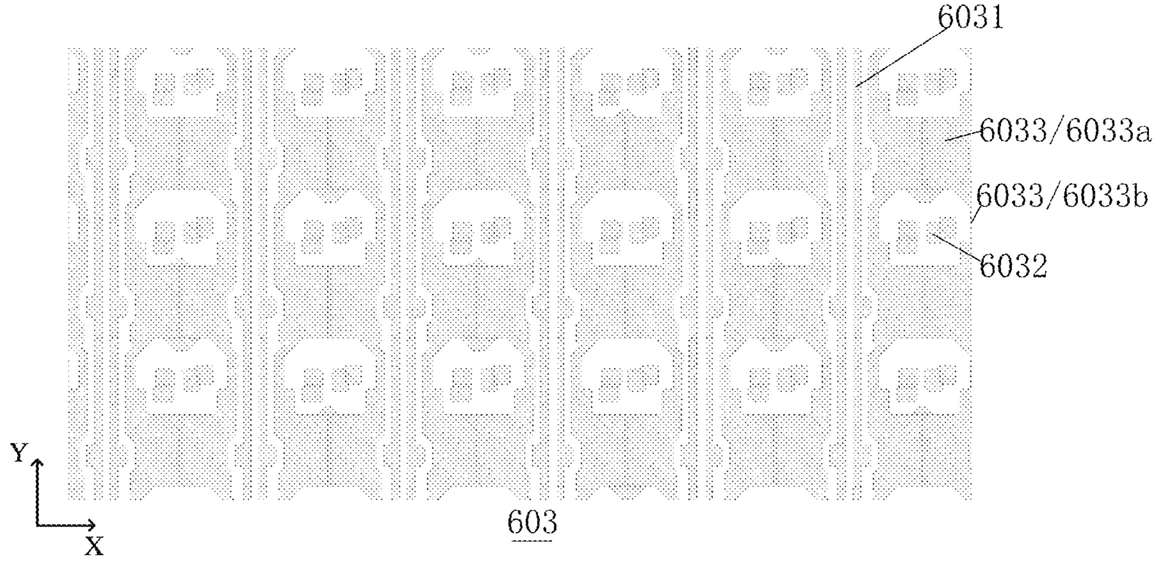
FIG. 22 is a structural layout diagram of the second conductive layer in FIG. 21B.
Figure 23:
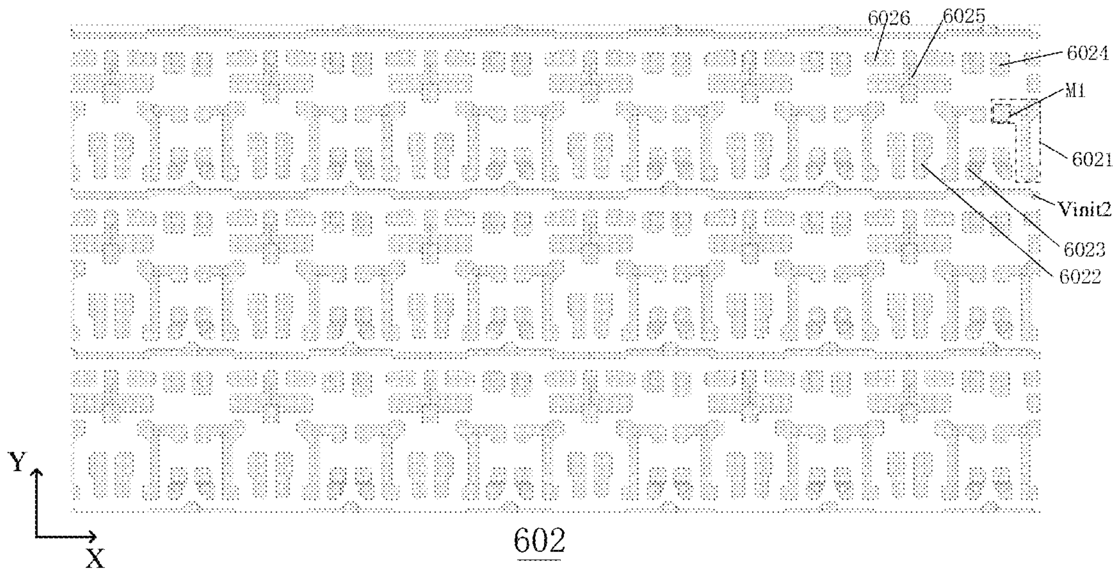
FIG. 23 is a structural layout diagram of the first conductive layer in FIG. 21B.
Figure 24:
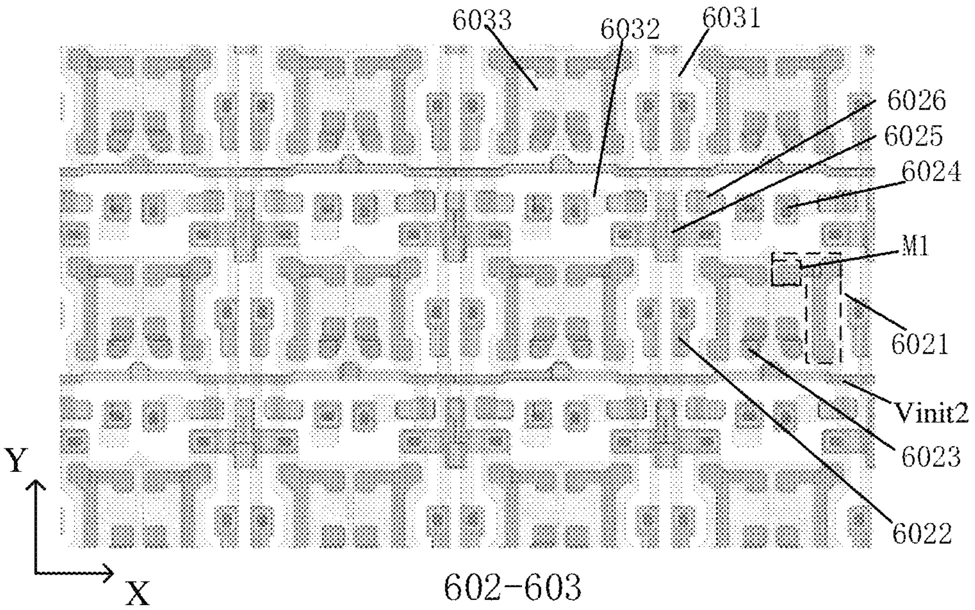
FIG. 24 is a structural layout diagram in which the first conductive layer and the second conductive layer in FIG. 21B are superimposed.

For example, an embodiment of the present disclosure provides a display substrate, and FIG. 21A is a structural layout diagram of another display substrate provided by an embodiment of the present disclosure, FIG. 21B is a structural layout diagram of another display substrate provided by an embodiment of the present disclosure, FIG. 22 is a structural layout diagram of a second conductive layer in FIG. 21B, FIG. 23 is a structural layout diagram of a first conductive layer in FIG. 21B, and FIG. 24 is a structural layout in which a first conductive layer and a second conductive layer are superimposed in FIG. 21B. FIG. 21A to FIG. 24 only schematically show the laminated structure or single-layer structure of some film layers in the display substrate, and other film layers may also include the film layer where the gate line is located and the film layer where the light shielding layer is located. Compared with FIG. 21A, FIG. 21B is further provided with a light shielding layer, and other structural settings are the same.

For example, as illustrated by FIG. 19 and FIG. 21B, the display substrate 600 include a base substrate 601, a pixel circuit 610 arranged on the base substrate 101, the pixel circuit 610 includes a driving transistor T3 and a storage capacitor C, the display substrate 600 further includes a first conductive layer 602, a second conductive layer 603 and a first semiconductor layer 604, the first conductive layer 602 includes a first connection structure 6021, the first connection structure 6021 includes a first end 6021*a* and a second end 6021*b* which are opposite to each other. The first end 6021*a* is connected with the first semiconductor layer 604, and the second end 6021*b* is electrically connected with the gate electrode of the driving transistor T3 and the first electrode plate Cst1 of the storage capacitor C; the first conductive layer 602 is at a side of the first semiconductor layer 604 away from the base substrate 601, and the second conductive layer 603 is at a side of the first conductive layer 602 away from the base substrate 601, and the orthographic projection of the first power signal line 6033 on the second conductive layer 603 on the base substrate 601 overlaps with the orthographic projection of the entirety of the first connection structure 6021 on the base substrate 601. In this display substrate 600, the orthographic projection of the second conductive layer 603 on the base substrate 601 overlaps with the orthographic projection of the entirety of the first connection structure 6021 on the base substrate 601, so that the first power signal line 6033 in the second conductive layer 603 (also called SD2) can completely cover the first connection structure 6021 (also called N1 node), because the second conductive layer 603 (SD2) is connected with a stable signal, and a capacitance is formed between the second conductive layer 603 (SD2) and the first conductive layer 602 (also called SD1), and a capacitor is formed between the N1 node and the closest data line Data, so that the influence of the data signal on the capacitor is small, so that the influence of the nearby data signal on the N1 node can be reduced, that is, the influence of the data signal on the N1 node can be shielded, and the problem that the display panel cannot display normally due to the data signal jump affecting the voltage of the N1 node can be further alleviated.

For example, as illustrated by FIG. 19 and FIG. 21, the first semiconductor layer 604 includes a semiconductor pattern of the eighth transistor T8 mentioned later, and the material of the first semiconductor layer 604 is a metal oxide semiconductor, such as indium gallium zinc oxide (IGZO). The first electrode plate Cst1 of the storage capacitor C can be used as the gate electrode of the driving transistor T3.

For example, with reference to FIG. 21B and FIG. 22, the second conductive layer 603 includes a data line 6031 and a first power signal line 6033, the second conductive layer 603 can be a second source drain metal layer (SD2). The orthographic projection of the first power signal line 6033 on the base substrate 601 covers more than 50% of the orthographic projection of the first connection structure 6021 on the base substrate 601, that is, the first power signal line 6033 can be used for completely covering the first connection structure 6021, and can be used for partially covering the first connection structure 6021. In the case that the first power signal line 6033 completely covers the first connection structure 6021, the orthographic projection of the first power signal line 6033 on the base substrate 601 covers the orthographic projection of the whole first connection structure on the base substrate 601.

For example, in combination with FIG. 21B and FIG. 22, the second conductive layer 603 further includes a first electrode transfer line 6032, for example, the plane shape of the first electrode transfer line 6032 may be rectangular. The plurality of first electrode transfer lines 6032 are arranged in one-to-one correspondence with the plurality of electrode parts (not shown in the figure), and the electrode part is connected with a corresponding first electrode transfer line 6032 through a via hole.

For example, with reference to FIG. 21B and FIG. 22, the first power signal line 6033 includes a block-shaped part 6033*a* and a strip-shaped part 6033*b* connecting two adjacent block-shaped parts 6033*a* in the first direction Y. The strip-shaped part 6033*b* connects the adjacent block-shaped parts 6033*a* at the edges of the block-shaped parts 6033*a*, so that the strip-shaped part 6033*b* and the block-shaped parts 6033*a* form an accommodating space, and the first electrode transfer line 6032 is formed in the accommodating space.

For example, in combination with FIG. 21B and FIG. 22, the orthographic projection of the entirety of the data line 6031 on the base substrate 601 extends linearly along the first direction Y. In the same repeating unit, the orthographic projections of two data lines 6031 on the base substrate 601 are located between the orthographic projections of two first power signal lines 6033 on the base substrate 601.

For example, in the first direction Y, the second conductive layer 603 of any two adjacent columns of sub-pixels has a mirror symmetric structure. In other exemplary embodiments, in the first direction Y, the second conductive layer 603 of any two adjacent columns of sub-pixels may not be mirror symmetric.

For example, as illustrated by FIG. 23, the first conductive layer 602 at least includes a second initial signal line Vinit2, a first connection electrode 6021, a second connection electrode 6022, a third connection electrode 6023, a fourth connection electrode 6024, a fifth connection electrode 6025 and a sixth connection electrode 6026 as illustrated by FIG. 23. In some exemplary embodiments, the first conductive layer 602 may be referred to as a first source drain metal (SD1) layer.

For example, in combination with FIG. 21B, FIG. 22 and FIG. 23, the extending direction of the data line 6031 is the first direction Y, and the direction perpendicular or substantially perpendicular to the extending direction of the data line 6031 is the second direction X. The first connection structure 6021 is in an inverted "L" shape, and the part of the inverted "L" shape extending along the second direction X extends to the side away from the data line 6031 which is closest, and the part of the inverted "L" shape extending along the second direction X is connected with the end portion M1 of the data line 6031 which is closest and the second electrode of the eighth transistor T8.

For example, as illustrated by FIG. 24, the orthographic projection of the block-shaped part 6033*a* of the first power signal line 6033 on the base substrate 601 completely covers the orthographic projection of the first connection structure 6021 and the orthographic projection of the third connection electrode 6023 on the base substrate 601. The orthographic projection of the first electrode transfer line 6032 on the base substrate 601 overlaps with the orthographic projection of at least part of the fourth connection electrode 6024 on the base substrate 601. The orthographic projection of the strip-shaped part 6033*b* of the first power signal line 6033 on the base substrate 601 overlaps with the orthographic projection of at least part of the fifth connection electrode 6025 and the orthographic projection of the sixth connection electrode 6026 on the base substrate 601. The orthographic projection of the data line 6031 on the base substrate 601 at least partially overlaps with the orthographic projection of the second connection electrode 6022 on the base substrate 601.

Figure 25:
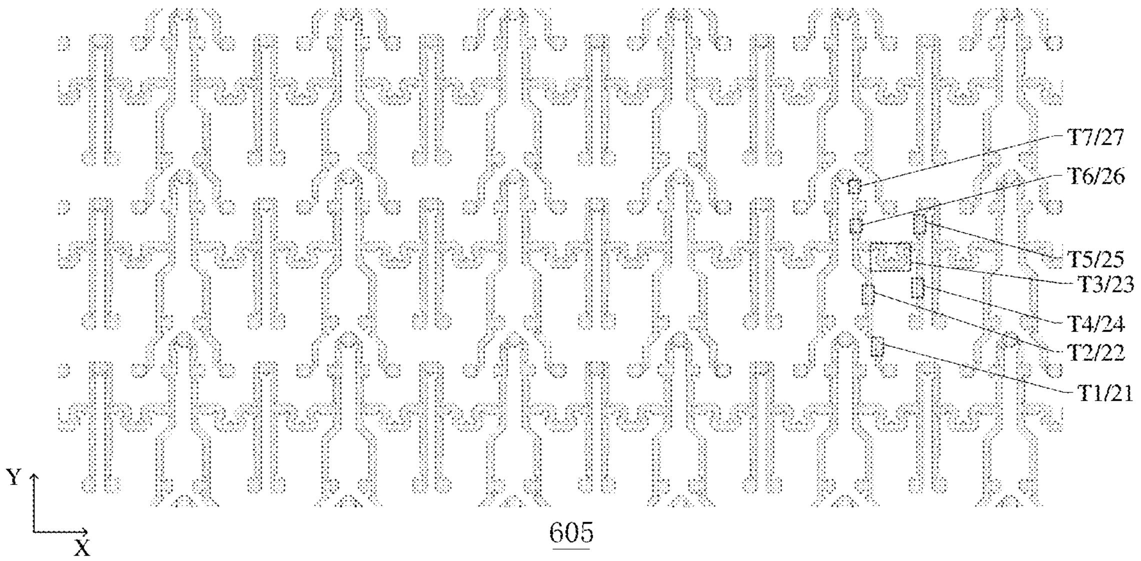
FIG. 25 is a partial structural diagram of the first active layer in the display substrate shown in FIG. 19.

For example, FIG. 25 is a partial structural diagram of a first active layer in the display substrate shown in FIG. 19. For example, as illustrated by FIG. 25, the pixel circuit 610 includes a first active layer 605, which includes a channel region and a source-drain region of each transistor. For example, the source-drain region may include a source region and a drain region.

For example, FIG. 25 schematically shows that the first active layer 605 is formed by patterning a semiconductor material. The first active layer 605 can be used to make the active layers of the first transistor T1, the second transistor T2, the driving transistor T3, the fourth transistor T4, the fifth transistor T5, the sixth transistor T6 and the seventh transistor T7, so as to form the channel regions of the above transistors. The first active layer 605 includes an active layer pattern (channel region) and a doped region pattern (source-drain region) of the above-mentioned transistor of each sub-pixel, and the active layer pattern and the doped region pattern of the above-mentioned transistor in the same pixel circuit are integrally formed.

For example, In FIG. 25, each dashed rectangular frame shows parts of the metal layer overlapping with the first active layer 605, i.e., the first active part 21, the second active part 22, the third active part 23, the fourth active part 24, the fifth active part 25, the sixth active part 26 and the seventh active part 27 to serve as the channel regions of the first transistor T1, the second transistor T2, the driving transistor T3, the fourth transistor T4, the fifth transistor T5, the sixth transistor T6 and the seventh transistor T7, the parts of the first active layer 605 on both sides of each channel region are conducted as the first electrode and the second electrode of each transistor by a process such as ion doping, that is, the abovementioned source-drain region. The first active layer 605 may have an integral structure. The source electrode and the drain electrode of each transistor can be symmetrical in structure, so there can be no difference in physical structure between the source electrode and the drain electrode. In the embodiment of the present disclosure, in order to distinguish transistors, except for the gate electrode as the control electrode, one of them is directly described as the first electrode and the other as the second electrode, so the first electrode and the second electrode of all or part of the transistors in the embodiment of the present disclosure can be interchanged as required.

For example, as illustrated by FIG. 25, the shape of the channel region 23 of the driving transistor T3 can be a "Q" shape, and the shapes of the channel region 21 of the first transistor T1, the channel region 22 of the second transistor T2, the channel region 24 of the fourth transistor T4, the channel region 25 of the fifth transistor T5, the channel region 26 of the sixth transistor T6 and the channel region 27 of the seventh transistor T7 are all "1" shapes.

For example, in some exemplary embodiments, the active structure of each transistor may include a first region, a second region, and a channel region between the first region and the second region.

For example, in some exemplary embodiments, the first active layer 605 may adopt polysilicon (p-Si), that is, the first transistor T1, the second transistor T2, the driving transistor T3, the fourth transistor T4, the fifth transistor T5, the sixth transistor T6 and the seventh transistor T7 may all be LTPS thin film transistors.

Figure 26:
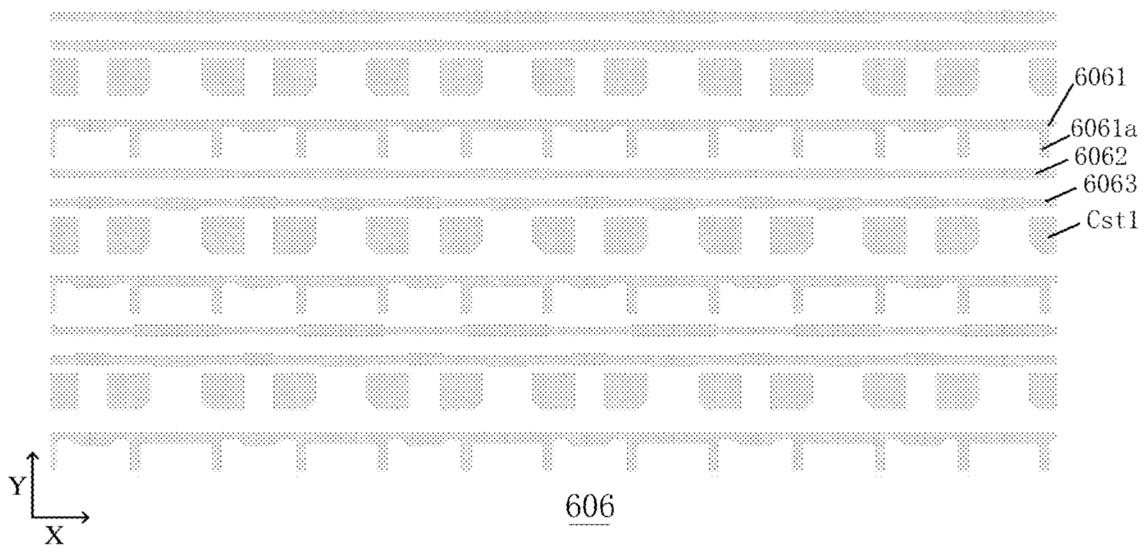
FIG. 26 is a partial structural diagram of a third conductive layer in the display substrate shown in FIG. 19.

For example, FIG. 26 is a partial structural diagram of a third conductive layer in the display substrate shown in FIG. 19. As illustrated by FIG. 26, the pixel circuit 610 includes a third conductive layer 606, and the third conductive layer 606 at least includes a first scanning signal line 6061 (Gate_P), a reset control signal line 6062 (Reset_P) and an emission control signal line 6063 (EM_P). In some exemplary embodiments, the third conductive layer 606 may be referred to as a first gate metal (Gate 1) layer. The first scanning signal line 6061 can also be used as the gate electrode of the second transistor T2 and the gate electrode of the fourth transistor T4. The reset control signal line 6062 can also be used as the gate electrode of the first transistor T1 and the gate electrode of the seventh transistor T7; the reset control signal line 6062 can also be used as the gate electrode of the fifth transistor T5 and the gate electrode of the sixth transistor T6; the first electrode plate Cst1 of the storage capacitor C can be used as the gate electrode of the driving transistor T3.

For example, as illustrated by FIG. 26, in the first direction Y, the third conductive layer 606 of any two adjacent columns of sub-pixels has a mirror symmetric structure.

For example, as illustrated by FIG. 26, the first scanning signal line 6061, the reset control signal line 6062 and the light emission control signal line 6063 all extend along the second direction X. In each sub-pixel, the reset control signal line 6062 is located at a side of the first scanning signal line 6061 away from the light emission control signal line 6063, and the first electrode plate Cst1 of the storage capacitor is arranged between the first scanning signal line 6061 and the light emission control signal line 6063.

For example, as illustrated by FIGS. 25 and 26, the planar shape of the first electrode plate Cst1 is rectangular, and at least one corner of the rectangular shape can be chamfered, and the orthographic projection of the first electrode plate Cst1 on the base substrate 601 and the orthographic projection of the channel region 23 of the third transistor T3 on the base substrate 601 have an overlapping area. A region of the first active layer 605 overlapping with the first electrode plate Cst1 serves as the channel region 23 of the third transistor T3. One end of the channel region 23 of the third transistor T3 is connected with the first region of the active region of the third transistor T3, and the other end is connected with the second region of the active region of the third transistor T3.

For example, in some exemplary embodiments, a region of the reset control signal line 6062 (Reset_P) overlapping with the first active region of the first transistor T1 is used as the gate electrode of the first transistor T1, and a region of the first scanning signal line 6061 (Gate_P) overlapping with the second active region of the second transistor T2 is used as the gate electrode of the second transistor T2. A region of the first scanning signal line 6061 (Gate_P) overlapping with the fourth active region of the fourth transistor T4 serves as the gate electrode of the fourth transistor T4, a region of the light emission control signal line 6063 (EM_P) overlapping with the fifth active region of the fifth transistor T5 serves as the gate electrode of the sixth transistor T6. A region of the reset control signal line Reset_P (having the same signal with the first scanning signal line Gate_P in the sub-pixels of the present row) in the sub-pixels of next row of the sub-pixels of each row overlapping with the seventh active region of the seventh transistor T7 in the sub-pixels of the present row serves as the gate electrode of the seventh transistor T7.

Figure 27:
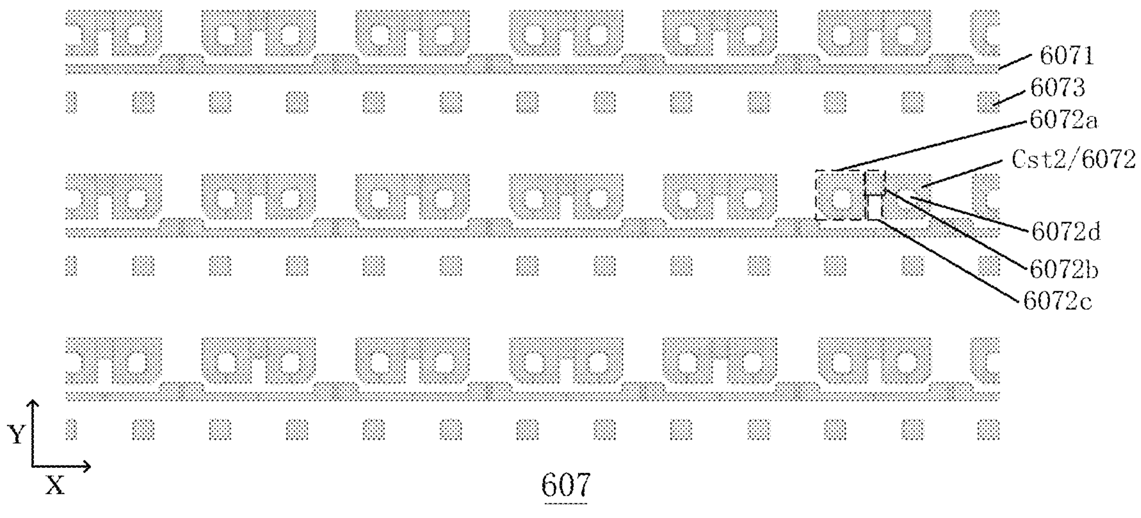
FIG. 27 is a partial structural diagram of a conductive film layer in the display substrate shown in FIG. 19.

For example, FIG. 27 is a partial structural diagram of a conductive film layer in the display substrate shown in FIG. 19. As illustrated by FIG. 27, the pixel circuit 610 includes a conductive film layer 607 between the third conductive layer 606 and the second conductive layer 603. The conductive film layer 607 includes a second scanning signal line 6071, a first conductive part 6072 and a fifth conductive part 6073. A partial structure of the second scanning signal line 6071 is used to form a bottom gate of the eighth transistor T8; the first conductive part 6072 includes two second electrode plates Cst2 of the two storage capacitors C adjacent in the first direction Y; the fifth conductive part 6073 is electrically connected with the first conductive layer 602. The conductive film layer 607 may be called a second gate metal (Gate 2) layer.

For example, as illustrated by FIG. 27, the first conductive part 6072 includes a main part 6072*a*, and the storage capacitor C also includes a second electrode plate Cst2 opposite to the first electrode plate Cst1, and the main part 6072*a* corresponds to two second electrode plates Cst2. For example, the first conductive part 6072 further includes a bridge part 6072*b* that connects two main parts 6072*a* adjacent in the second direction X, that is, two adjacent second electrode plates Cst2, and the first conductive part 6072 further includes a notch 6072*c* between the two second electrode plates Cst2.

For example, in combination with FIG. 19, FIG. 23 and FIG. 27, the orthographic projection of the first conductive layer 602 on the base substrate 601 and the orthographic projection of the notch 6072*c* on the base substrate 601 do not overlap, so that the notch 6072*c* is not overlapped by the first conductive layer 602 and the first conductive layer 6072*c*. It should also be noted that this notch 6072*c* is not blocked by any other film layer with light shielding function.

For example, in combination with FIG. 19, FIG. 23 and FIG. 27, the first conductive part 6072 is also formed with an opening 6072*d*, and the orthographic projection of the via hole connected between the gate electrode of the driving transistor T3 and the first connection structure 6021 on the base substrate 601 is within the orthographic projection of the opening 6072*d* on the base substrate 601, so that the conductive structure in the via hole and the first conductive part 6072 are insulated from each other.

Figure 28:
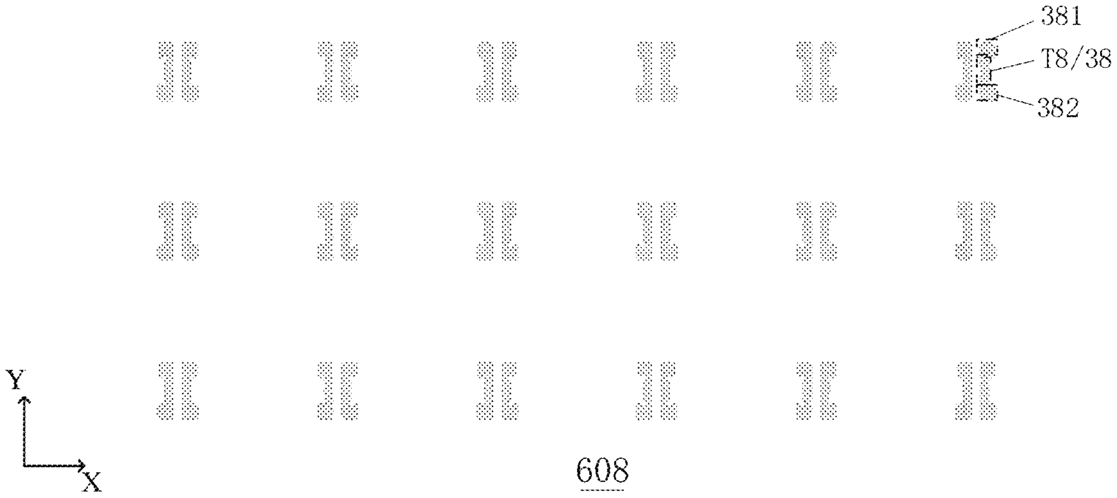
FIG. 28 is a partial structural diagram of a second active layer in the display substrate shown in FIG. 19.

For example, the display substrate also includes a second active layer. For example, FIG. 28 is a partial structural schematic diagram of a second active layer in the display substrate shown in FIG. 19. As illustrated by FIG. 19 and FIG. 28, the second active layer 608 is located between the first active layer 605 and the second conductive layer 603, the second active layer 608 may include the eighth active part 38, which forms the channel region of the eighth transistor T8. A first region 381 and a second region 382 of the eighth transistor T8 are formed at both ends of the eighth active part 38. The first region 381 of the eighth transistor T8 is adjacent to the channel region of the first transistor T1, and the second region 382 of the eighth transistor T8 is adjacent to the storage capacitor C, and the first semiconductor layer 604 includes the second active layer 608.

For example, as illustrated by FIG. 19 and FIG. 28, the second active layer 608 may be formed of indium gallium zinc oxide, and correspondingly, the eighth transistor T8 may be an N-type metal oxide thin film transistor. The entirety of the eighth active part 38 and the first region 381 and the second region 382 of the eighth transistor T8 extends along the first direction Y, and the entirety of the eighth active part 38 and the first region 381 and the second region 382 of the eighth transistor T8 may have a dumbbell shape.

For example, the first semiconductor layer forming the channel region of the eighth transistor T8 in the pixel circuit may be located at a side of a layer where the active semiconductor pattern of the driving transistor T3 is located, which is away from the base substrate 601, and may include an oxide semiconductor material. For example, in the case that the active layer of the eighth transistor T8 of the pixel circuit is made of oxide semiconductor, the transistor made of oxide semiconductor has the characteristics of good hysteresis and low leakage current, and at the same time, the mobility is low. Therefore, the transistor made of oxide semiconductor can be used instead of the transistor of the low temperature polysilicon material to form a low temperature polysilicon-oxide (LTPO) pixel circuit, so as to realize low leakage and improve the stability of the gate voltage of the transistor.

Of course, the embodiment of the present disclosure is not limited to the structure of the second active layer of the pixel circuit as illustrated by FIG. 28. In other examples, the first semiconductor layer including the channel region of the eighth transistor T8 may also be located on the same layer as the semiconductor layers of the channel regions of other transistors, that is, the first active layer may also include the channel regions of the first transistor T1, the second transistor T2, the driving transistor T3, the fourth transistor T4, the fifth transistor T5, the sixth transistor T6, the seventh transistor T7 and the eighth transistor T8.

Figure 29:
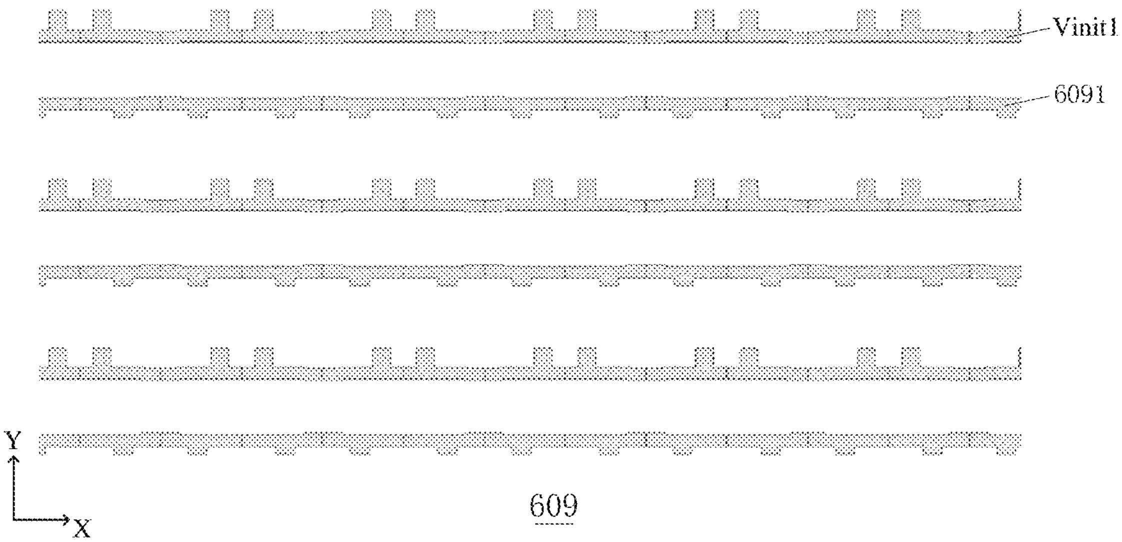
FIG. 29 is a partial structural diagram of a fourth conductive layer in the display substrate shown in FIG. 19.

For example, FIG. 29 is a partial structural schematic diagram of a fourth conductive layer in the display substrate shown in FIG. 19. For example, as illustrated by FIG. 29, the pixel circuit 610 further includes a fourth conductive layer 609 between the conductive film layer 607 and the second conductive layer 603. The fourth conductive layer 609 includes a first initial signal line Vinit1 and a fourth scanning signal line 6091, and a partial structure of the fourth scanning signal line 6091 is configured to form a top gate electrode of the eighth transistor T8.

For example, in combination with FIG. 21A to FIG. 29, the second initial signal line Vinit2 included in the first conductive layer 602 extends along the second direction X, and the second initial signal line Vinit2 is connected with the first region of the seventh transistor T7 through a third via hole V3, so that the first electrode of the seventh transistor T7 and the second initial signal line Vinit2 have the same electric potential.

For example, in combination with FIG. 21A to FIG. 29, the first scanning signal line 6061 includes a protruding part 6061*a* extending along the first direction Y and a part extending along the second direction X. The first end 6021*a* of the first connection structure 6021*a* is connected with the first region of the eighth transistor T8 through a fourth via hole V4, and the second end 6021*b* of the first connection structure 6021*a* is electrically connected with the gate electrode of the driving transistor T3 and the first electrode plate Cst1 of the storage capacitor C through a fifth via hole V5. The orthographic projection of the third end 6021*c* of the first connection structure 6021 on the base substrate 601 overlaps with the orthographic projection of the protruding part 6061*a* of the first scanning signal line 6061 on the base substrate 601, so that a coupling capacitance can be formed between the third end 6021*c* of the first connection structure 6021 and the protruding part 6061*a* of the first scanning signal line 6061. For example, the first end 6021*a* of the first connection structure 6021 can serve as the second electrode of the eighth transistor T8.

For example, a part of the inverted "L" shape of the first connection structure 6021 extending along the first direction Y is electrically connected with the fifth conductive part 6073 of the conductive film layer 607; the fifth conductive part 6073 overlaps with the protruding part 6061*a* of the first scanning signal line extending along the first direction Y.

For example, in combination with FIG. 21A to FIG. 29, the second connection electrode 6022 is connected with the first region of the fourth transistor T4 through a sixth via hole V6. In some exemplary embodiments, the second connection electrode 6022 may serve as the first electrode of the fourth transistor T4.

For example, in combination with FIG. 21A to FIG. 29, one end of the third connection electrode 6023 is connected with the first region of the second transistor T2 (which is also the second region of the first transistor T1) through a seventh via hole V7, and the other end of the third connection electrode 6023 is connected with the first region of the eighth transistor T8 through an eighth via hole V8. In some exemplary embodiments, the third connection electrode 6023 may serve as the first electrode of the eighth transistor T8, the first electrode of the second transistor T2 and the second electrode of the first transistor T1.

For example, in combination with FIG. 21A to FIG. 29, the fourth connection electrode 6024 is connected with the second region of the sixth transistor T6 (which is also the second region of the seventh transistor T7) through a ninth via hole V9. In some exemplary embodiments, the fourth connection electrode 6024 may simultaneously serve as the second electrode of the sixth transistor T6 and the second electrode of the seventh transistor T7.

For example, in combination with FIG. 21A to FIG. 29, the fifth connection electrode 6025 is connected with the second electrode plate Cst2 through a tenth via hole V10, and is connected with the first region of the fifth transistor T5 through an eleventh via hole V11. The fifth connection electrode 6025 is also configured to be connected with the first power signal line formed subsequently.

For example, in combination with FIG. 21A to FIG. 29, one end of the sixth connection electrode 6026 is connected with the first region of the first transistor T1 through a twelfth via hole V12, and the other end of the sixth connection electrode 6026 is connected with the first initial signal line, so that the first electrode of the first transistor T1 and the first initial signal line have the same electric potential.

For example, in the first direction Y, the first conductive layer 602 of any two adjacent columns of sub-pixels has a mirror symmetric structure.

Figure 30:
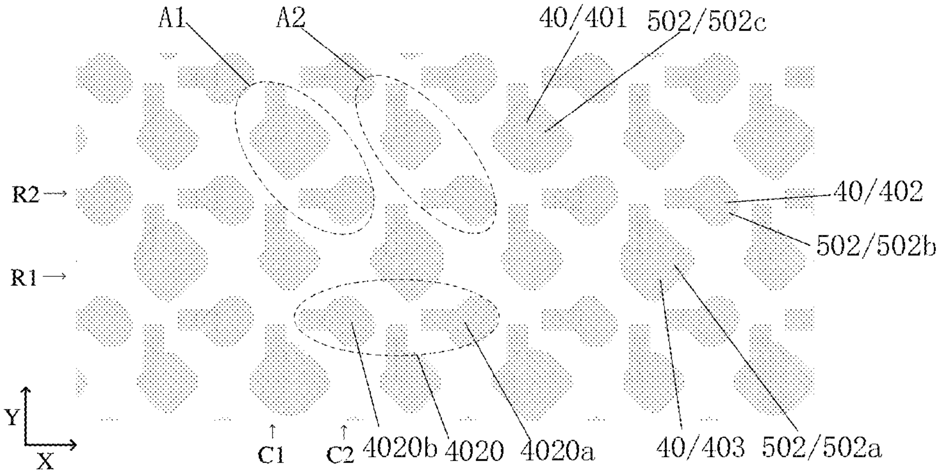
FIG. 30 is a schematic diagram of a partial pixel arrangement structure on a display substrate provided according to an embodiment of the present disclosure.
Figure 31A:
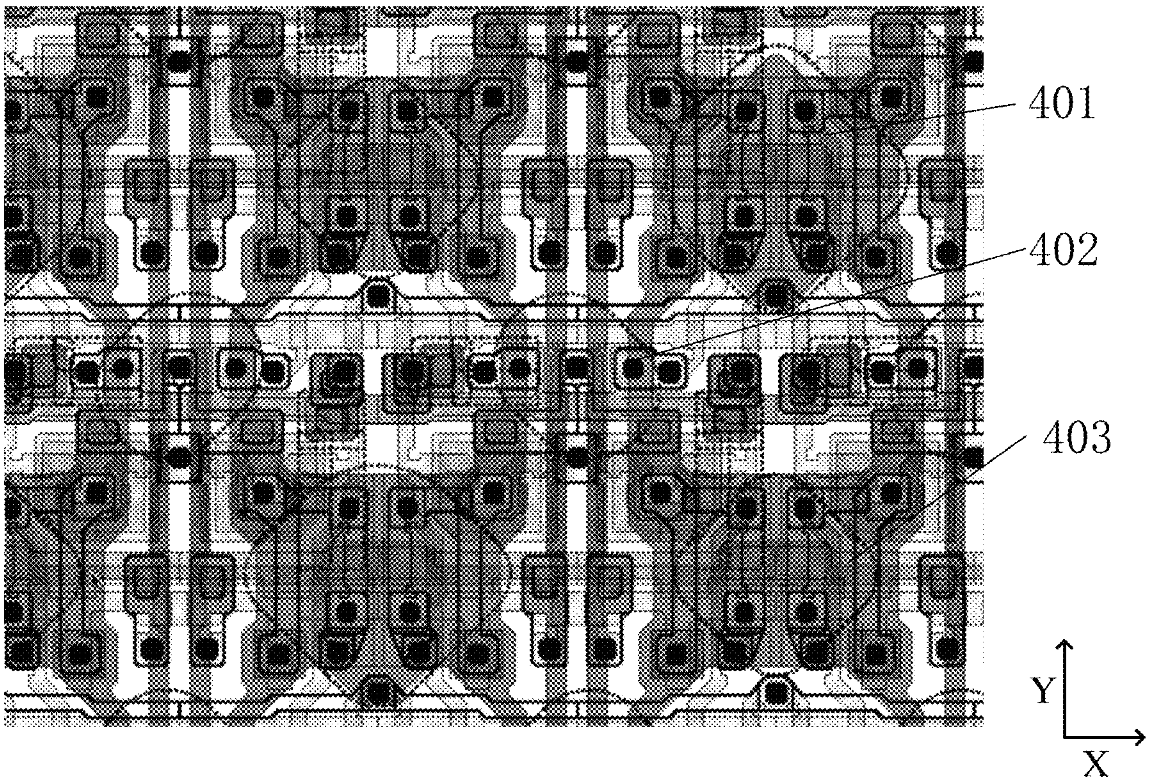
FIG. 31A is a layout diagram of a first electrode of the pixel circuit and the light emitting element in FIG. 19.
Figure 31B:
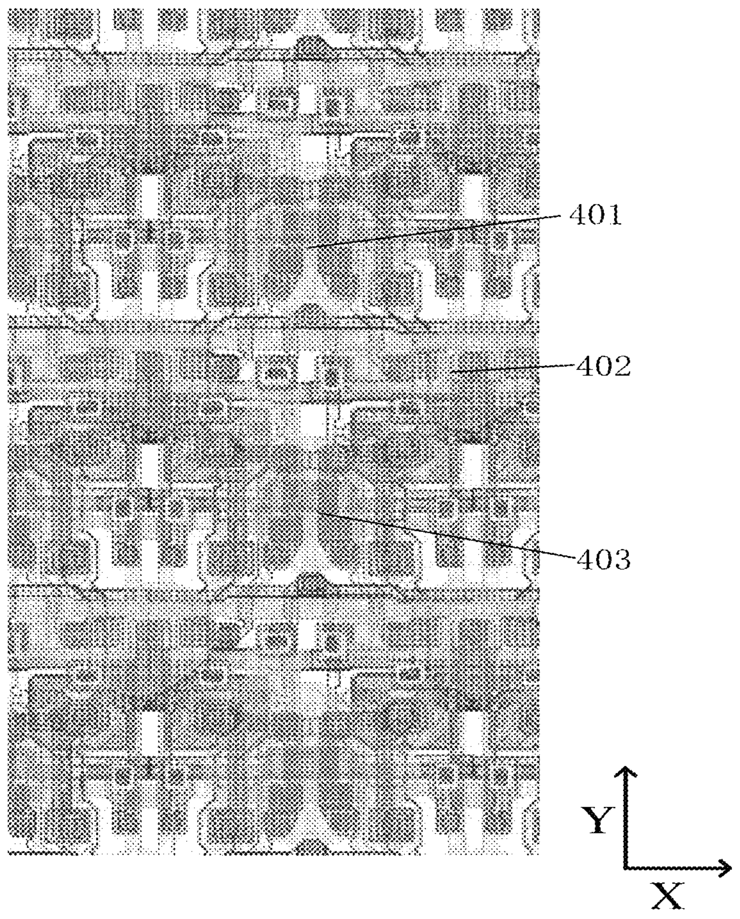
FIG. 31B is another layout diagram of a first electrode of the pixel circuit and the light emitting element in FIG. 19.

For example, the display substrate 100 further includes a plurality of sub-pixels, and each sub-pixel includes a pixel circuit 610 and a light emitting element in any of the above examples. FIG. 30 is a schematic diagram of a partial pixel arrangement structure on the display substrate provided according to an embodiment of the present disclosure, FIG. 31A is a layout diagram of a first electrode of the pixel circuit and the light emitting element in FIG. 19, and FIG. 31B is another layout diagram of a first electrode of the pixel circuit and the light emitting element in FIG. 19. Compared with FIG. 31A, FIG. 31B is further provided with a light shielding layer, and other structural settings are the same.

For example, the partial pixel arrangement structure and the design of the electrode parts 502 on the first electrode layer 501 can be referred to the above-mentioned related descriptions of FIG. 14, FIG. 15A and FIG. 15B, and the repeated portions are omitted herein.

For example, in combination with FIG. 30, FIG. 31A and FIG. 31B, each electrode part 502 on the first electrode layer 501 is connected with a first electrode transfer line 6032.

For example, the display substrate 610 may also include a light shielding layer, and the related description of the light shielding layer can be found in the related description of FIG. 17, and the repeated portions are omitted herein.

For example, in some exemplary embodiments, the display substrate may further include an encapsulation layer, which may include a first encapsulation layer, a second encapsulation layer and a third encapsulation layer which are stacked. The first encapsulation layer and the third encapsulation layer may be made of inorganic materials, and the second encapsulation layer may be made of organic materials. The second encapsulation layer is arranged between the first encapsulation layer and the third encapsulation layer, which can ensure that external water vapor cannot enter the light emitting structure layer.

Figure 32:
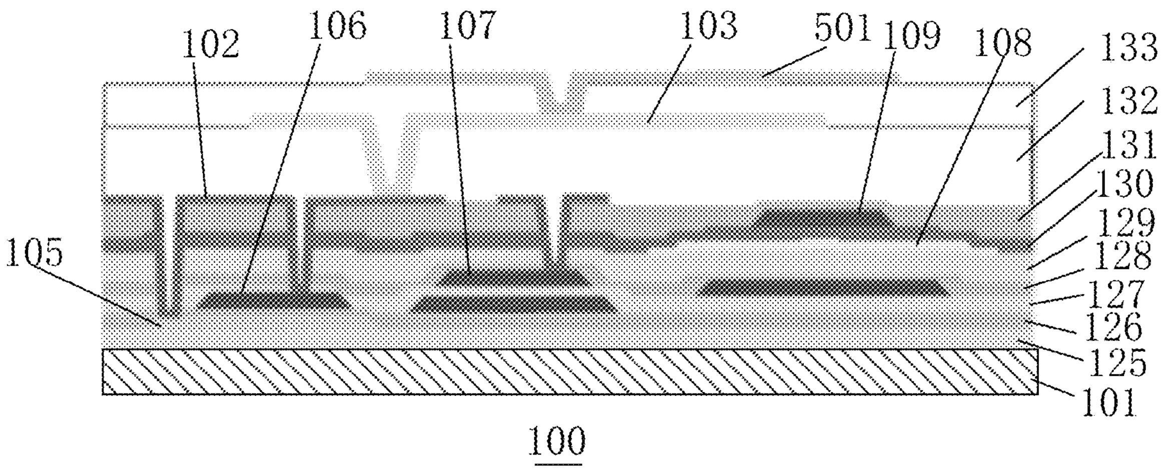
FIG. 32 is a schematic cross-sectional view of a display substrate provided by at least one embodiment of the present disclosure.

For example, FIG. 32 is a schematic diagram of a cross-sectional structure of a display substrate provided by at least one embodiment of the present disclosure, and is described based on the above-mentioned structure in which the pixel circuit is 7T1C. For example, a first buffer layer 125 is disposed on the base substrate 101, a first active layer 105 is disposed on the first buffer layer 125, a first insulating layer 126 is disposed on the first insulating layer 126, and a third conductive layer 106 is disposed on the first insulating layer 126. On the third conductive layer 106, a second insulating layer 127, a conductive film layer 107, a third insulating layer 128, a fourth insulating layer 129, a second active layer 108, a fifth insulating layer 130 and a fourth conductive layer 109 are provided. A sixth insulating layer 131 is provided on the fourth conductive layer 109, and a first conductive layer 102 is provided on the sixth insulating layer 131, and the first conductive layer 102 is electrically connected with the first active layer 105, the third conductive layer 106 and the conductive film layer 107 through the via holes. A seventh insulating layer 132 is disposed on the first insulating layer 102, and a second conductive layer 103 is disposed on the seventh insulating layer 132. The second conductive layer 103 is electrically connected with the first conductive layer 102 through a via hole penetrating the seventh insulating layer 132. A second planarization layer 133 is disposed on the second conductive layer 103, and a first electrode layer 501 is disposed on the second planarization layer 133, and the first electrode layer 501 is electrically connected with the second conductive layer 103 through a via hole penetrating the second planarization layer 133.

For example, the first buffer layer (BUF1) 125, the first insulating layer 126, the second insulating layer 127, the third insulating layer 128, the fourth insulating layer 129, the fifth insulating layer 130, and the sixth insulating layer 131 may be any one or more of silicon oxide (SiOx), silicon nitride (SiNx), and silicon oxynitride (SiON), and may be a single layer, multiple layers, or a composite layer. The first buffer (BUF1) layer can be used to improve the water and oxygen resistance of the base substrate 101. The first insulating layer 126 is called the first gate insulating layer (GI1), the second insulating layer 127 is called the second gate insulating layer (GI2), the third insulating layer 128 is called the first interlayer insulating layer (ILD1), the fourth insulating layer 129 is called the second buffer (BUF2) layer, and the fifth insulating layer 133 is called the third gate insulating layer (GI3).

For example, the first planarization layer 132 and the second planarization layer 133 may be made of organic materials, and the transparent conductive film may be made of indium tin oxide ITO or indium zinc oxide IZO. The first active layer may be polysilicon (p-Si), and the second active layer may be metal oxide.

For example, in some exemplary embodiments, the base substrate 101/601 may be a flexible substrate or may be a rigid substrate. The rigid substrate can be one or more of glass and quartz, and the flexible substrate can be one or more of polyethylene terephthalate, polyethylene terephthalate, polyether ether ketone, polystyrene, polycarbonate, polyaryl ester, polyarylate, polyimide, polyvinyl chloride, polyethylene and textile fiber. In some exemplary embodiments, the flexible substrate may include a first flexible material layer, a first inorganic material layer, a semiconductor layer, a second flexible material layer and a second inorganic material layer which are stacked. The materials of the first flexible material layer and the second flexible material layer may be polyimide (PI), polyethylene terephthalate (PET) or a surface-treated polymer soft film, and the materials of the first inorganic material layer and the second inorganic material layer may be silicon nitride (SiNx) or silicon oxide (SiOx) to improve the water-oxygen resistance of the base substrate, and the material of the semiconductor layer can be amorphous silicon (a-si).

For example, in some exemplary embodiments, the first conductive layer, the second conductive layer, the third conductive layer, the fourth conductive layer, the conductive film layer and the light shielding layer may adopt metal materials, such as any one or more of silver (Ag), copper (Cu), aluminum (Al) and molybdenum (Mo), or alloy materials of the above metals, such as aluminum neodymium alloy (AlNd) or molybdenum-niobium alloy (MoNb), and can be a single layer structure or a multiple layer composite structure, such as Mo/Cu/Mo.

The structure of the display substrate shown in FIG. 32 is only an exemplary explanation. In some exemplary embodiments, the corresponding structure can be changed according to actual needs, which is not limited by the embodiment of the present disclosure. The structure of the above display substrate is described by taking the pixel circuit of 7T1C shown in FIG. 3 as an example. In other exemplary embodiments, the pixel circuit may also have a structure of 3T1C, 4T1C, 5T1C, 5T2C, 6T1C or 8T1C, and the embodiment of the present disclosure is not limited thereto.

Figure 33:
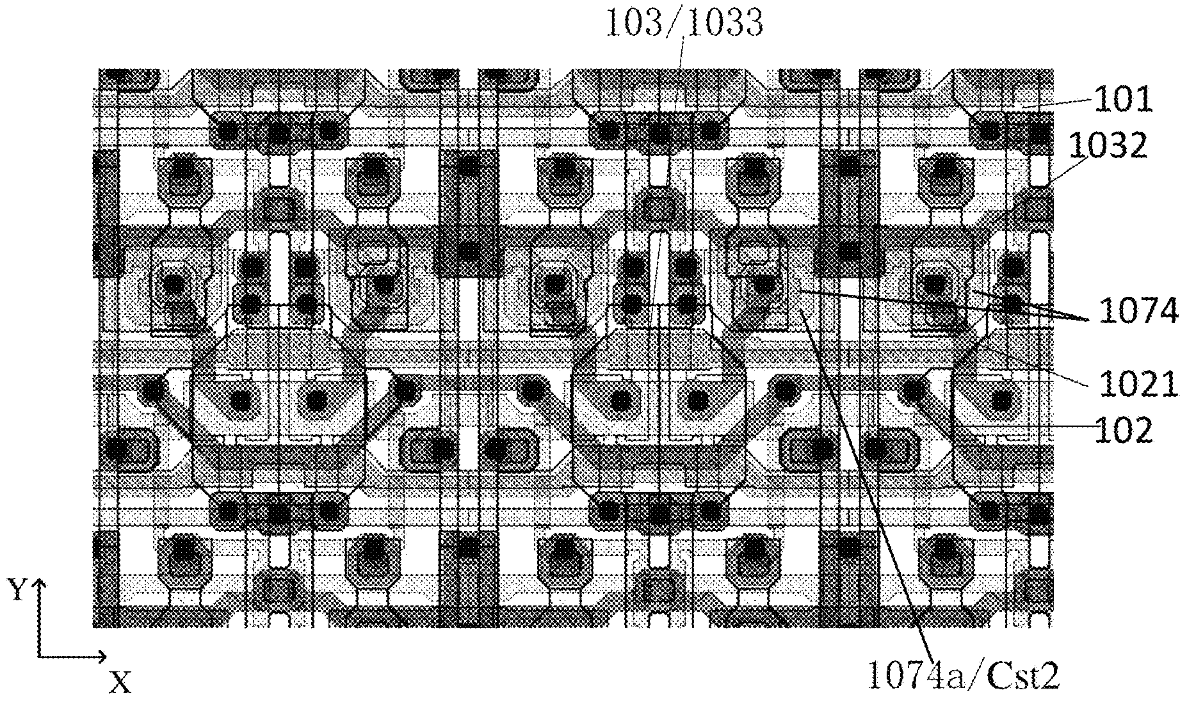
FIG. 33 is a structural layout diagram of another display substrate provided by at least one embodiment of the present disclosure.

For example, FIG. 33 is a structural layout diagram of another display substrate provided by at least one embodiment of the present disclosure, which is illustrated by taking a pixel circuit as a 7T1C pixel circuit. As illustrated by FIG. 33, the structure of the first conductive layer 102 can be referred to the above-mentioned related description of FIG. 6, and the structure of the second conductive layer 103 can be referred to the above-mentioned related description of FIG. 7, and the repeated portions are omitted herein. As illustrated by FIG. 3 and FIG. 33, the first conductive layer 102 includes a first connection structure 1021, and the orthographic projection of the first electrode transfer line 1032 on the second conductive layer 103 on the base substrate 101 overlaps with the orthographic projection of at least part of the first connection structure 1021 on the base substrate 101, so that the second conductive layer 103 (also called SD2) can block at least part of the first connection structure 1021 (also called N1 node). So that the second conductive layer 103 and the first connection structure 1021 located in the first conductive layer 102 directly form a capacitance, that is, a capacitance is formed between the second conductive layer 103 (SD2) and the first conductive layer 102 (also called SD1), and a capacitance is formed between the N1 node and the closest data line Data. Because both the light emission control signal line EM and the second initial signal line Vinit2 transmit stable DC signals, the second conductive layer 103 (SD2) is connected with a stable signal, and the signal changes only once in a frame. This design can make the second conductive layer 103 (SD2) directly form a capacitance with the first conductive layer 102 (also called SD1) at the N1 node when the N1 node is working normally, and the second conductive layer 103 (SD2, the upper electrode plate) is connected with a stable signal. Because of the characteristics of capacitor itself, the voltages on the two ends of the capacitor cannot change suddenly, upon the upper electrode plate is connected with a stable signal, the signal on the lower electrode plate, namely the first conductive layer 102 (SD1) at the N1 node can also keep stable, which can reduce the influence of data signal which frequently jump in one frame time on the N1 node. The data signal has little influence on the capacitance, so that the influence of nearby data signals on the N1 node can be reduced, that is, the influence of data signals on the N1 node can be shielded, and the problem that the display panel cannot display normally due to the voltage of the N1 node affected by the data signal jump can be solved.

For example, in the structure shown in FIG. 33, by way of example, each first conductive part 1074 only includes two main parts 1074*a*, and the storage capacitor C includes the second electrode plate Cst2, and the main parts 1074*a* correspond to the two second electrode plates Cst2. For example, the first conductive part 1074 does not include other structures.

For example, for the arrangement of other structures in FIG. 33, please refer to the description of the corresponding parts in the above, and the repeated portions are omitted herein.

Figure 34:
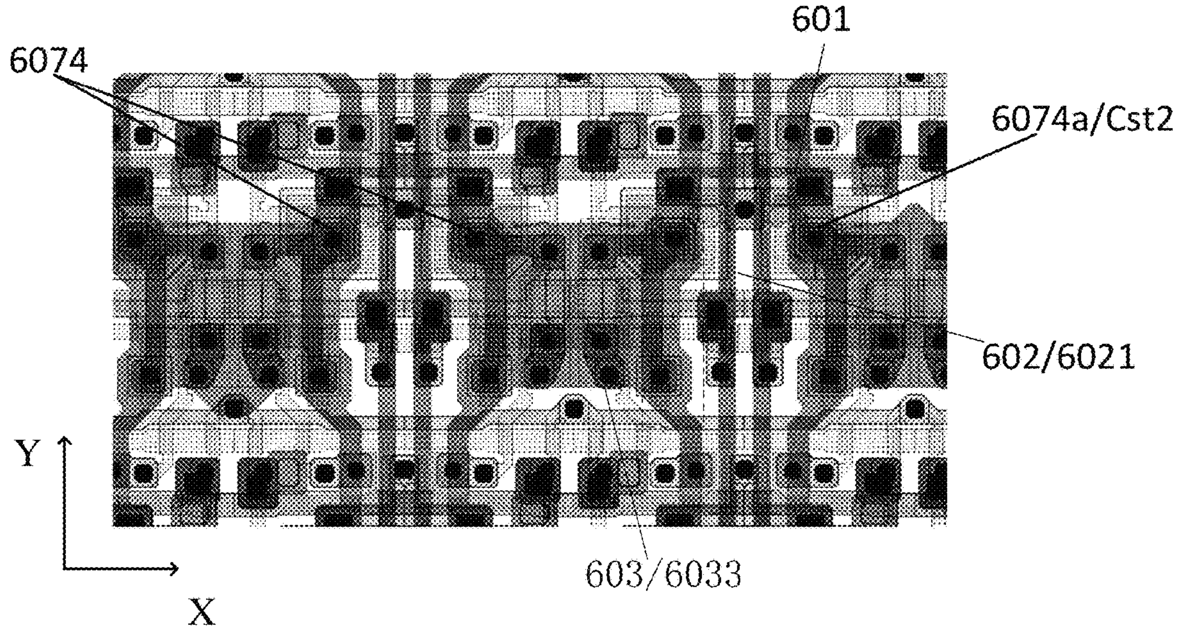
FIG. 34 is a structural layout diagram of another display substrate provided by at least one embodiment of the present disclosure.

For example, FIG. 34 is a structural layout diagram of another display substrate provided by at least one embodiment of the present disclosure, which is illustrated by taking an 8T1C pixel circuit as an example. As illustrated by FIG. 34, the structure of the first conductive layer 602 can be referred to the above-mentioned related description of FIG. 23, and the structure of the second conductive layer 603 can be referred to the above-mentioned related description of FIG. 22, which is not repeated here. As illustrated by FIG. 19 and FIG. 34, the first conductive layer 602 includes a first connection structure 6021, and the orthographic projection of the first power signal line 6033 on the second conductive layer 603 on the base substrate 601 overlaps with the orthographic projection of the entirety of the first connection structure 6021 on the base substrate 601, so that the second conductive layer 603 (also called SD2) can completely cover the first connection structure 6021 (also called N1 node). Therefore, the second conductive layer 603 and the first power signal line 6033 located in the first conductive layer 602 directly form a capacitance, that is, a capacitance is formed between the second conductive layer 603 (SD2) and the first conductive layer 602 (also called SD1), and a capacitance is formed between the N1 node and the closest data line Data. Because both the light emission control signal line EM and the second initial signal line Vinit2 transmit stable DC signals, the second conductive layer 603(SD2) is connected with a stable signal, and the signal changes only once in a frame time. This design can make the second conductive layer 603 (SD2) directly form a capacitance with the first conductive layer 602 (also called SD1) at the N1 node when the N1 node is working normally, and the second conductive layer 603 (SD2, the upper electrode plate) is connected with a stable signal. Because of the characteristics of capacitor itself, the voltages on the two ends of the capacitor cannot change suddenly, upon the upper electrode plate is connected with a stable signal, the signal on the lower electrode plate, namely the first conductive layer 602 (SD1) at the N1 node can also keep stable, which can reduce the influence of data signal which frequently jump in one frame time on the N1 node. The data signal has little influence on the capacitance, so that the influence of nearby data signals on the N1 node can be reduced, that is, the influence of data signals on the N1 node can be shielded, and the problem that the display panel cannot display normally due to the voltage of the N1 node affected by the data signal jump can be solved.

For example, in the structure shown in FIG. 34, by way of example, each first conductive part 6074 includes only two main parts 6074*a*, and the storage capacitor C includes the second electrode plate Cst2, and the main parts 6074*a* correspond to the two second electrode plates Cst2. For example, the first conductive part 6074 does not include other structures.

For example, for the arrangement of other structures in FIG. 34, please refer to the description of the corresponding parts in the above, and the repeated portions are omitted herein.

Figure 35:
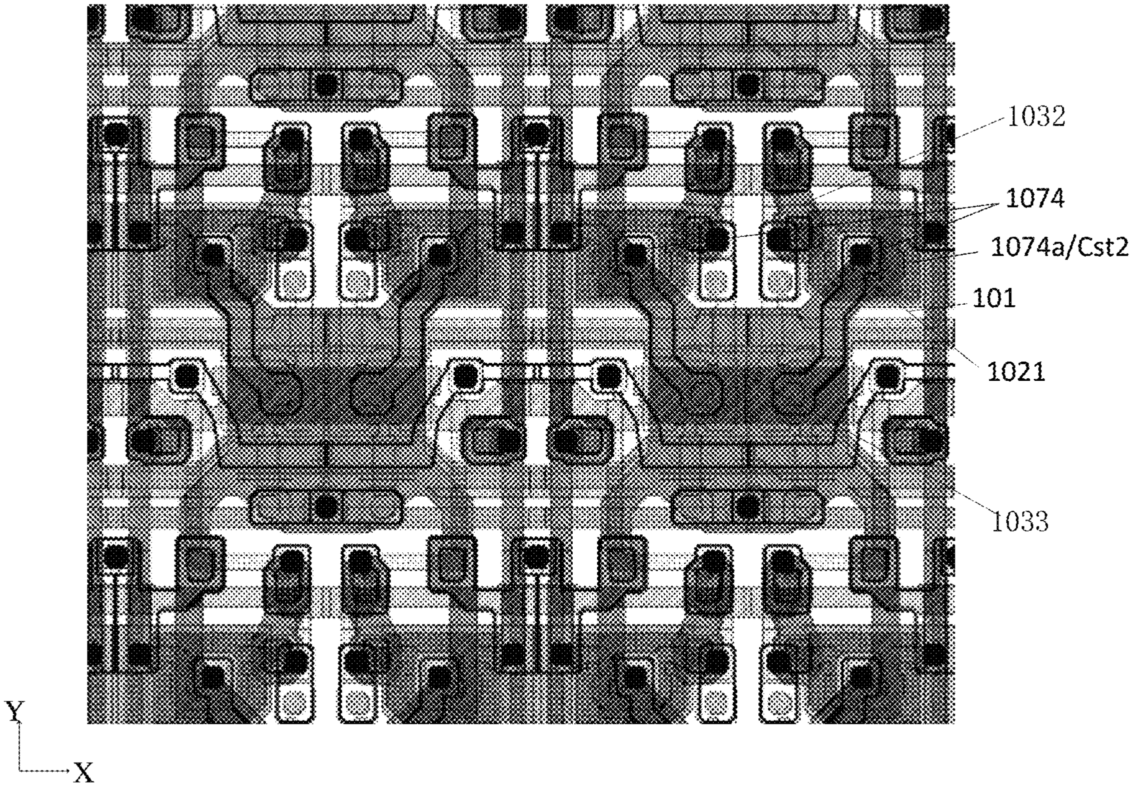
FIG. 35 is a structural layout diagram of another display substrate provided by at least one embodiment of the present disclosure.

For example, FIG. 35 is a structural layout diagram of another display substrate provided by at least one embodiment of the present disclosure, which is illustrated by taking a pixel circuit as a 7T1C pixel circuit. As illustrated by FIG. 35, the structure of the first conductive layer 102 can be referred to the above-mentioned related description of FIG. 6, and the structure of the second conductive layer 103 can be referred to the above-mentioned related description of FIG. 22, and the repeated portions will be omitted herein. As illustrated by FIG. 3 and FIG. 35, the first conductive layer 102 includes a first connection structure 1021, and the orthographic projection of the first power signal line 1033 on the second conductive layer 103 on the base substrate 101 overlaps with the orthographic projection of more than 50% of the area of the first connection structure 1021 on the base substrate 101, so that the second conductive layer 103 (also called SD2) can completely cover the first connection structure 1021 (also called N1). Therefore, the second conductive layer 103 and the first power signal line 1033 located in the first conductive layer 102 directly form a capacitance, that is, a capacitance is formed between the second conductive layer 103 (SD2) and the first conductive layer 102 (also called SD1), and a capacitance is formed between the N1 node and the closest data line Data. Because both the light emission control signal line EM and the second initial signal line Vinit2 transmit stable DC signals, the second conductive layer 103 (SD2) is connected with a stable signal, and the signal changes only once in a frame time. This design can make the second conductive layer 103 (SD2) directly form a capacitance with the first conductive layer 102 (also called SD1) at the N1 node when the N1 node is working normally, and the second conductive layer 103 (SD2, the upper electrode plate) is connected with a stable signal. Because of the characteristics of capacitor itself, the voltages on the two ends of the capacitor cannot change suddenly, upon the upper electrode plate is connected with a stable signal, the signal on the lower electrode plate, namely the first conductive layer 102 (SD1) at the N1 node can also keep stable, which can reduce the influence of data signal which frequently jump in one frame time on the N1 node. The data signal has little influence on the capacitance, so that the influence of nearby data signals on the N1 node can be reduced, that is, the influence of data signals on the N1 node can be shielded, and the problem that the display panel cannot display normally due to the voltage of the N1 node affected by the data signal jump can be solved.

For example, in the structure shown in FIG. 35, by way of example, each first conductive part 6074 only includes two main parts 6074*a*, and the storage capacitor C includes the second electrode plate Cst2, and the main parts 6074*a* correspond to the two second electrode plates Cst2. For example, the first conductive part 6074 does not include other structures.

For example, as illustrated by FIG. 35, the first electrode transfer line 1032 and the first connection structure 1021 do not have overlapping parts.

For example, for the arrangement of other structures in FIG. 35, please refer to the description of the corresponding parts in the above, and the repeated portions are omitted herein.

Figure 36:
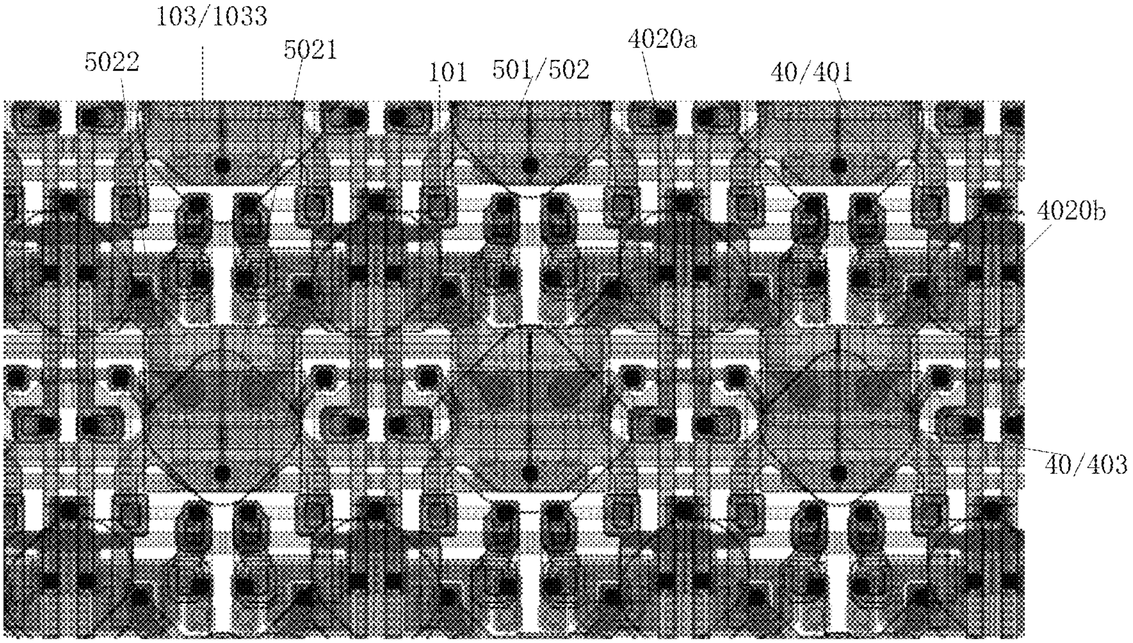
FIG. 36 is a structural layout diagram of another display substrate provided by at least one embodiment of the present disclosure.

For example, FIG. 36 is a structural layout diagram of another display substrate provided by at least one embodiment of the present disclosure. The layer structure shown in FIG. 36 may also be that the display substrate includes a first electrode layer 501, which is at the side of the second conductive layer 103 away from the base substrate 101. This arrangement can flatten the lower part of the first electrode (anode) in the pixel unit and maintain the capacitance balance. As illustrated by FIG. 36, the first electrode layer 501 includes a plurality of electrode parts 502, each electrode part 502 includes a body part 5021 and a supplement part 5022 which are connected, and each electrode part 502 corresponds to one of the first sub-pixel 401, the first pixel block 4020*a*, the second pixel block 4020*b* and the third sub-pixel 403. For example, the first electrodes (anodes) corresponding to the first sub-pixel 401, the first pixel block 4020*a*, the second pixel block 4020*b* and the third sub-pixel 403 are all arranged above the first power signal line 1033 of the second conductive layer 103 as far as possible.

For example, providing the supplement part 5022 on the electrode part 502 can increase the overlapping area between the electrode part 502 and the second conductive layer 103. For example, the supplement part 5022 of the electrode part 502 corresponding to the first pixel block 4020*a* and the second pixel block 4020*b* can cover the position of elongated shape at the edge of the first power signal line 1033, and the supplement part 5022 of the electrode part 502 corresponding to the first sub-pixel 401 and the third sub-pixel 403 can cover the block-shaped part of the first power signal line 1033, so that the overlapping area of the electrode part 502 and the second conductive layer 103 is further increased.

At least one embodiment of the present disclosure also provides a display device, which includes any one of the display substrates. The display device can be a mobile phone, a tablet computer, a television, a display, a notebook computer, a digital photo frame, a navigator and other products or components with display functions, and the embodiment of the present invention is not limited to this.

The following points need to be explained:

(1) In the drawings of the embodiment of the present disclosure, only the structure related to the embodiment of the present disclosure is involved, and other structures can refer to the general design.

(2) In case of no conflict, features in the same embodiment and different embodiments of the present disclosure can be combined with each other.

What has been described above is only an exemplary embodiment of the present disclosure, and is not used to limit the protection scope of the present disclosure, which is determined by the appended claims.

The invention claimed is:

1. A display substrate comprising:

a base substrate; and a pixel circuit, arranged on the base substrate and comprising a driving transistor and a storage capacitor;

wherein the display substrate further comprises a first conductive layer, a second conductive layer and a first semiconductor layer, the first conductive layer comprises a first connection structure, the first connection structure comprises a first end and a second end which are opposite to each other, the first end is connected with the first semiconductor layer, and the second end is electrically connected with a gate electrode of the driving transistor and a first electrode plate of the storage capacitor;

the first conductive layer is at a side of the first semiconductor layer away from the base substrate, and the second conductive layer is at a side of the first conductive layer away from the base substrate, and an orthographic projection of the second conductive layer on the base substrate overlaps with an orthographic projection of at least part of the first connection structure on the base substrate;

the second conductive layer comprises a data line, a first electrode transfer line and a first power signal line which are spaced apart from each other, the first electrode transfer line is connected with the first electrode of the light emitting element:

an exlending direction of the data line is a first direction, and a direction perpendicular or substantially perpendicular to the extending direction of the data line is a second direction;

the first conductive layer further comprises a power signal connection line, the power signal connection line comprises a main part and a branch part, an extending direction of an entirety of the main part of the power signal connection line is parallel to the second direction, and an extending direction of the branch part is parallel to the first direction:

the first power signal line comprises a block-shaped part and a strip-shaped part extending along the first direction as a whole, the strip-shaped part connects adjacent block-shaped parts, and the main part of the power signal connection line is connected with the first power signal line.

2. The display substrate according to claim 1, further comprising a plurality of sub-pixels, wherein each of the plurality of sub-pixels comprises the pixel circuit and a light emitting element.

3. The display substrate according to claim 2, wherein an orthographic projection of the first electrode transfer line on the base substrate overlaps with an orthographic projection of a part of the first connection structure on the base substrate.

4. The display substrate according to claim 3, wherein the first connection structure comprises an overlapping part overlapping with the first electrode transfer line and a non-overlapping part not overlapping with the first electrode transfer line, and the non-overlapping part is further away from the data line which is closer to the first connection structure than the overlapping part.

5. The display substrate according to claim 2, wherein the second conductive layer comprises a data line and a first power signal line, and an orthographic projection of the first power signal line on the base substrate covers more than 50% of an orthographic projection of the first connection structure on the base substrate.

6. The display substrate according to claim 1, wherein the strip-shaped part comprises a first strip-shaped part and a second strip-shaped part which are oppositely arranged, and a third strip-shaped part connecting the first strip-shaped part and the second strip-shaped part, an extending direction of the first strip-shaped part and an extending direction of the second strip-shaped part are parallel to the first direction, and the third strip-shaped part connects middle regions of the first strip-shaped part and the second strip-shaped part.

7. The display substrate according to claim 6, wherein the strip-shaped part comprises a hollow structure.

8. The display substrate according to claim 1, wherein a width of the block-shaped part in the second direction is greater than a width of an entirety of the strip-shaped part in the second direction.

9. The display substrate according to claim 1, wherein the first electrode transfer line extends along the first direction, and the first electrode transfer line shields a part of the first connection structure at a position of an end position of the first electrode transfer line close to the first connection structure.

10. The display substrate according to claim 1, wherein, the pixel circuit further comprises a first transistor, a second transistor, a sixth transistor and a seventh transistor;

a first electrode of the first transistor is connected with a gate electrode of the driving transistor, a second electrode of the first transistor is connected with a first initial signal line, a first electrode of the second transistor is connected with a gate electrode of the driving transistor, a second electrode of the second transistor is connected with a second electrode of the driving transistor, a first electrode of the sixth transistor is connected with the second electrode of the driving transistor, and a first electrode of the seventh transistor is connected with a second electrode of the sixth transistor;

the display substrate further comprises:

a first active layer, between the base substrate and the second conductive layer, wherein the first active layer comprises a third active part, a sixth active part, a seventh active part, a tenth active part and an eleventh active part, the third active part forms a channel region of the driving transistor, the sixth active part forms a channel region of the sixth transistor, the seventh active part forms a channel region of the seventh transistor, and the tenth active part is connected between the seventh active part and the sixth active part, and the eleventh active part is connected between the sixth active part and the third active part; and a second active layer, between the first active layer and the second conductive layer, wherein the second active layer comprises a first active part, a second active part and a twelfth active part, the first active part forms a channel region of the first transistor, the second active part is connected with the first active part to form a channel region of the second transistor, and the twelfth active part is connected with an end of the second active part away from the first active part.

11. The display substrate according to claim 10, wherein the display substrate comprises a plurality of repeating units distributed along the first direction and the second direction, each of the repeating units comprises two pixel circuits, and the two pixel circuits comprise a first pixel circuit and a second pixel circuit distributed along the second direction, and the first pixel circuit and the second pixel circuit are arranged in mirror symmetry;

each of the two pixel circuits further comprises a fourth transistor and a fifth transistor, wherein a first electrode of the fourth transistor is connected with the data line, a second electrode of the fourth transistor is connected with a first electrode of the driving transistor, a first electrode of the fifth transistor is connected with the first power signal line, and a second electrode of the fifth transistor is connected with the first electrode of the driving transistor;

the first active layer further comprises:

a fourth active part, connected with a side of the third active part and forming a channel region of the fourth transistor;

a fifth active part, forming a channel region of the fifth transistor;

an eighth active part, connected with a side of the fifth active part away from the third active part; and a ninth active part, connected between two eighth active parts in the same repeating unit.

12. The display substrate according to claim 11, wherein the first conductive layer comprises a plurality of third connection structures, wherein the third connection structures are arranged in one-to-one correspondence with the repeating units, and each of the third connection structures is connected with the ninth active part through a first via hole connection part.

13. The display substrate according to claim 12, further comprising a third conductive layer, wherein the third conductive layer comprises:

a second gate line, wherein an orthographic projection of the second gate line on the base substrate extends along the second direction and overlaps with an orthographic projection of the fourth active part on the base substrate, and a partial structure of the second gate line is used to form a gate electrode of the fourth transistor;

a light emission control signal line, wherein an orthographic projection of the light emission control signal line on the base substrate extends along the second direction and overlaps with an orthographic projection of the sixth active part on the base substrate, and a partial structure of the light emission control signal line is used to form a gate electrode of the sixth transistor;

a second reset signal line, wherein an orthographic projection of the second reset signal line on the base substrate extends along the second direction and overlaps with an orthographic projection of the seventh active part on the base substrate, a partial structure of the second reset signal line is used to form a gate electrode of the seventh transistor, and the second gate line in the pixel circuit of a preset row is reused as the second reset signal line in the pixel circuit of an adjacent row; and a second conductive part, wherein an orthographic projection of the second conductive part on the base substrate overlaps with an orthographic projection of the third active part on the base substrate, and the second conductive part forms a gate electrode of the driving transistor and the first electrode plate of the storage capacitor;

wherein, in the same pixel circuit, the orthographic projection of the second conductive part on the base substrate is located between the orthographic projection of the second gate line on the base substrate and the orthographic projection of the light emission control signal line on the base substrate;

the orthographic projection of the second reset signal line on the base substrate is located at a side of the orthographic projection of the light emission control line away from the orthographic projection of the second conductive part on the base substrate.

14. The display substrate according to claim 13, further comprising a fourth conductive layer, wherein the fourth conductive layer is located between the second active layer and the second conductive layer, and the fourth conductive layer comprises:

a first reset signal line, wherein an orthographic projection of the first reset signal line on the base substrate overlaps with an orthographic projection of the first active part on the base substrate, and a partial structure of the first reset signal line forms a top gate electrode of the first transistor;

a first gate line, wherein an orthographic projection of the first gate line on the base substrate overlaps with an orthographic projection of the second active part on the base substrate, and a partial structure of the first gate line forms a top gate electrode of the second transistor;

wherein, in the same pixel circuit, the orthographic projection of the first gate line on the base substrate is located between the orthographic projection of the second conductive part on the base substrate and the orthographic projection of the second gate line on the base substrate, and the orthographic projection of the first reset signal line on the base substrate is at a side of the orthographic projection of the second gate line away from the orthographic projection of the second conductive part on the base substrate.

15. The display substrate according to claim 14, further comprising a conductive film layer between the third conductive layer and the fourth conductive layer, wherein the conductive film layer comprises:

the first initial signal line, wherein an orthographic projection of the first initial signal line on the base substrate is at a side of the orthographic projection of the first reset signal line on the base substrate away from the orthographic projection of the second conductive part on the base substrate;

a third reset signal line, connected with the first reset signal line through a via hole, wherein an orthographic projection of the third reset signal line on the base substrate overlaps with the orthographic projection of the first active part on the base substrate, and a partial structure of the third reset signal line is used to form a bottom gate electrode of the first transistor;

a third gate line, wherein an orthographic projection of the third gate line on the base substrate overlaps with the orthographic projection of the second active part on the base substrate, and a partial structure of the third gate line is used to form a bottom gate electrode of the second transistor; and the first conductive part, comprising a main part, wherein the storage capacitor comprises a second electrode plate opposite to the first electrode plate, and the main part corresponds to two second electrode plates.

16. The display substrate according to claim 15, wherein the first conductive part further comprises a bridge part connecting the two second electrode plates, and the first conductive part comprises a gap between the two second electrode plates.

17. The display substrate according to claim 1, wherein, the pixel circuit further comprises a first transistor, a second transistor, a fourth transistor, a fifth transistor, a sixth transistor, a seventh transistor and an eighth transistor;

a gate electrode of the first transistor is connected with a reset control signal line, a first electrode of the first transistor is connected with a first initial signal line, and a second electrode of the first transistor is connected with a first electrode of the eighth transistor and a first electrode of the second transistor;

a gate electrode of the second transistor is connected with a first scanning signal line, and a second electrode of the second transistor is connected with a second electrode of the driving transistor and a first electrode of the sixth transistor;

a gate electrode of the driving transistor is connected with a second electrode of the eighth transistor and a first electrode plate of the storage capacitor, a first electrode of the driving transistor is connected with a second electrode of the fourth transistor and a second electrode of the fifth transistor, and the second electrode of the driving transistor is connected with the second electrode of the second transistor and the first electrode of the sixth transistor;

a gate electrode of the fourth transistor is connected with the first scanning signal line, a first electrode of the fourth transistor is connected with the data line, and a second electrode of the fourth transistor is connected with the first electrode of the driving transistor and the second electrode of the fifth transistor;

a gate electrode of the fifth transistor is connected with a first light emission control signal line, a first electrode of the fifth transistor is connected with a first power signal line and a second electrode plate of the storage capacitor, and a second electrode of the fifth transistor is connected with the second electrode of the fourth transistor and the first electrode of the driving transistor;

a gate electrode of the sixth transistor is connected with the first light emission control signal line, a first electrode of the sixth transistor is connected with the second electrode of the driving transistor and the second electrode of the second transistor, and a second electrode of the sixth transistor is connected with the first electrode of the light emitting element and a second electrode of the seventh transistor;

a gate electrode of the seventh transistor is connected with the first scanning signal line or the reset control signal line, a first electrode of the seventh transistor is connected with a second initial signal line;

a gate electrode of the eighth transistor is connected with a second scanning signal line, a first electrode of the eighth transistor is connected with the second electrode of the first transistor and the first electrode of the second transistor;

the first electrode plate of the storage capacitor is connected with the gate electrode of the driving transistor and the second electrode of the eighth transistor, and the second electrode plate of the storage capacitor is connected with the first power signal line.

18. The display substrate according to claim 17, further comprising:

a first active layer, between the base substrate and the second conductive layer, wherein the first active layer comprises a first active part, a second active part, a third active part, a fourth active part, a fifth active part, a sixth active part and a seventh active part, the first active part forms a channel region of the first transistor, the second active part forms a channel region of the second transistor and the third active part forms a channel region of the driving transistor, the fourth active part forms a channel region of the fourth transistor, the fifth active part forms a channel region of the fifth transistor, the sixth active part forms a channel region of the sixth transistor, and the seventh active part forms a channel region of the seventh transistor;

a second active layer, between the first active layer and the second conductive layer, wherein the second active layer comprises an eighth active part, the eighth active part forms a channel region of the eighth transistor.

19. A display device, comprising the display substrate according to claim 1.

* * * * *